United States Patent
Chida

(10) Patent No.: US 11,189,817 B2
(45) Date of Patent: Nov. 30, 2021

(54) LIGHT-EMITTING DEVICE, MODULE, ELECTRONIC DEVICE, AND METHOD FOR MANUFACTURING LIGHT-EMITTING DEVICE

(71) Applicant: Semiconductor Energy Laboratory Co., Ltd., Kanagawa-ken (JP)

(72) Inventor: Akihiro Chida, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 15 days.

(21) Appl. No.: 16/848,243

(22) Filed: Apr. 14, 2020

(65) Prior Publication Data

US 2020/0259116 A1 Aug. 13, 2020

Related U.S. Application Data

(63) Continuation of application No. 16/192,066, filed on Nov. 15, 2018, now Pat. No. 10,629,843, which is a (Continued)

(30) Foreign Application Priority Data

Oct. 17, 2014 (JP) .............................. JP2014-212438
Dec. 19, 2014 (JP) .............................. JP2014-257197

(51) Int. Cl.
*H01L 51/52* (2006.01)
*H01L 51/00* (2006.01)
(Continued)

(52) U.S. Cl.
CPC ........ *H01L 51/5246* (2013.01); *H01L 27/322* (2013.01); *H01L 27/3262* (2013.01);
(Continued)

(58) Field of Classification Search
None
See application file for complete search history.

(56) References Cited

U.S. PATENT DOCUMENTS 5,189,405 A 2/1993 Yamashita et al.
6,822,391 B2 11/2004 Yamazaki et al.
(Continued)

FOREIGN PATENT DOCUMENTS

CN 001397984 A 2/2003
CN 001430192 A 7/2003
(Continued)

OTHER PUBLICATIONS

International Search Report re Application No. PCT/IB2015/057465, dated Jan. 12, 2016.
(Continued)

*Primary Examiner* — J. E. Schoenholtz
(74) *Attorney, Agent, or Firm* — Husch Blackwell LLP

(57) ABSTRACT

A light-emitting element, a bonding layer, and a frame-like partition are formed over a substrate. The partition is provided to surround the bonding layer and the light-emitting element, with a gap left between the partition and the bonding layer. A pair of substrates overlap with each other under a reduced-pressure atmosphere and then exposed to an air atmosphere or a pressurized atmosphere, whereby the reduced-pressure state of a space surrounded by the pair of substrates and the partition is maintained and atmospheric pressure is applied to the pair of substrates. Alternatively, a light-emitting element and a bonding layer are formed over a substrate. A pair of substrates overlap with each other, and then, pressure is applied to the bonding layer with the use of a member having a projection before or at the same time as curing of the bonding layer.

4 Claims, 47 Drawing Sheets

Related U.S. Application Data continuation of application No. 15/839,059, filed on Dec. 12, 2017, now Pat. No. 10,270,057, which is a continuation of application No. 14/882,918, filed on Oct. 14, 2015, now Pat. No. 9,847,505.

(51) Int. Cl.
*H01L 27/32* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/5338* (2013.01); *H01L 2251/558* (2013.01); *Y02E 10/549* (2013.01); *Y02P 70/50* (2015.11)

(56) References Cited

U.S. PATENT DOCUMENTS

| | | |
|---|---|---|
| 6,849,877 B2 | 2/2005 | Yamazaki et al. |
| 6,956,325 B2 | 10/2005 | Yamazaki et al. |
| 7,005,671 B2 | 2/2006 | Yamazaki et al. |
| 7,211,828 B2 | 5/2007 | Yamazaki et al. |
| 7,271,076 B2 | 9/2007 | Yamazaki et al. |
| 7,335,573 B2 | 2/2008 | Takayama et al. |
| 7,420,208 B2 | 9/2008 | Yamazaki et al. |
| 7,443,097 B2 | 10/2008 | Yamazaki et al. |
| 7,531,847 B2 | 5/2009 | Shitagaki et al. |
| 7,566,633 B2 | 7/2009 | Koyama et al. |
| 7,667,549 B2 | 2/2010 | Endo |
| 7,714,535 B2 | 5/2010 | Yamazaki et al. |
| 7,728,326 B2 | 6/2010 | Yamazaki et al. |
| 7,736,964 B2 | 6/2010 | Yamamoto et al. |
| 7,800,099 B2 | 9/2010 | Yamazaki et al. |
| 7,952,101 B2 | 5/2011 | Yamazaki et al. |
| 8,134,149 B2 | 3/2012 | Yamazaki et al. |
| 8,138,614 B2 | 3/2012 | Yamazaki et al. |
| 8,207,908 B2 | 6/2012 | Yamazaki et al. |
| 8,222,666 B2 | 7/2012 | Hatano et al. |
| 8,232,621 B2 | 7/2012 | Yamazaki et al. |
| 8,237,248 B2 | 8/2012 | Yamazaki et al. |
| 8,264,144 B2 | 9/2012 | Oikawa et al. |
| 8,284,369 B2 | 10/2012 | Chida et al. |
| 8,330,898 B2 | 12/2012 | Paek et al. |
| 8,343,802 B2 | 1/2013 | Reynolds et al. |
| 8,367,440 B2 | 2/2013 | Takayama et al. |
| 8,415,208 B2 | 4/2013 | Takayama et al. |
| 8,415,660 B2 | 4/2013 | Yamazaki et al. |
| 8,432,254 B2 | 4/2013 | Koyama et al. |
| 8,531,103 B2 | 9/2013 | Iwasaki et al. |
| 8,629,842 B2 | 1/2014 | Jang |
| 8,760,046 B2 | 6/2014 | Seo et al. |
| 8,766,269 B2 | 7/2014 | Yamazaki et al. |
| 8,785,964 B2 | 7/2014 | Shitagaki et al. |
| 8,822,982 B2 | 9/2014 | Yamazaki et al. |
| 8,853,941 B2 | 10/2014 | Jung |
| 8,928,597 B2 | 1/2015 | Jang |
| 8,957,833 B2 | 2/2015 | Yamazaki et al. |
| 9,000,443 B2 | 4/2015 | Hatano |
| 9,082,678 B2 | 7/2015 | Yamazaki et al. |
| 9,166,180 B2 | 10/2015 | Yamazaki et al. |
| 9,178,168 B2 | 11/2015 | Yamazaki et al. |
| 9,182,784 B2 | 11/2015 | Yang et al. |
| 9,276,224 B2 | 3/2016 | Yamazaki et al. |
| 9,342,176 B2 | 5/2016 | Kim et al. |
| 9,406,725 B2 | 8/2016 | Yamazaki et al. |
| 9,437,832 B2 | 9/2016 | Sakuishi et al. |
| 9,493,119 B2 | 11/2016 | Takayama et al. |
| 9,502,690 B2 | 11/2016 | Yamazaki et al. |
| 9,601,713 B2* | 3/2017 | Fukagawa ............ H01L 51/524 |
| 9,772,709 B2 | 9/2017 | Kim et al. |
| 9,773,461 B2 | 9/2017 | Yamazaki et al. |
| 9,847,505 B2 | 12/2017 | Chida |
| 9,871,221 B2 | 1/2018 | Senoo et al. |
| 9,882,165 B2 | 1/2018 | Yamazaki et al. |
| 9,893,126 B2 | 2/2018 | Jang |
| 10,032,833 B2 | 7/2018 | Yamazaki et al. |
| 2003/0032210 A1 | 2/2003 | Takayama et al. |
| 2003/0062519 A1 | 4/2003 | Yamazaki et al. |
| 2003/0162312 A1 | 8/2003 | Takayama et al. |
| 2004/0004434 A1 | 1/2004 | Nishi et al. |
| 2004/0099926 A1 | 5/2004 | Yamazaki et al. |
| 2007/0152956 A1 | 7/2007 | Danner et al. |
| 2007/0279571 A1 | 12/2007 | Koo et al. |
| 2008/0018229 A1 | 1/2008 | Yamazaki |
| 2008/0049437 A1 | 2/2008 | Takayama et al. |
| 2008/0079360 A1 | 4/2008 | Kubota |
| 2009/0128019 A1 | 5/2009 | Schaepkens et al. |
| 2009/0239320 A1 | 9/2009 | Takayama et al. |
| 2010/0001307 A1 | 1/2010 | Reynolds et al. |
| 2010/0008068 A1 | 1/2010 | Kim et al. |
| 2010/0039802 A1 | 2/2010 | Tuan |
| 2010/0264817 A1* | 10/2010 | Bouten ............. G02F 1/133305 |
| | | 313/512 |
| 2011/0018788 A1 | 1/2011 | Tanaka et al. |
| 2011/0037382 A1 | 2/2011 | Choi et al. |
| 2011/0050657 A1 | 3/2011 | Yamada |
| 2012/0248950 A1 | 10/2012 | Niibori |
| 2014/0065430 A1* | 3/2014 | Yamazaki ........... H01L 27/1214 |
| | | 428/426 |
| 2014/0183478 A1 | 7/2014 | Lee et al. |
| 2014/0326974 A1 | 11/2014 | Yamazaki et al. |
| 2014/0339523 A1 | 11/2014 | Fukagawa |
| 2015/0035001 A1 | 2/2015 | Yamazaki et al. |
| 2015/0076461 A1 | 3/2015 | Shitagaki et al. |
| 2015/0236280 A1 | 8/2015 | Sakuishi et al. |
| 2016/0111684 A1 | 4/2016 | Savas et al. |
| 2017/0033323 A1 | 2/2017 | Chida |
| 2017/0125454 A1 | 5/2017 | Takayama et al. |
| 2018/0114942 A1 | 4/2018 | Chida |
| 2018/0166508 A1 | 6/2018 | Jang |
| 2018/0342561 A1 | 11/2018 | Yamazaki et al. |

FOREIGN PATENT DOCUMENTS

| | | |
|---|---|---|
| CN | 001669363 A | 9/2005 |
| CN | 001732714 A | 2/2006 |
| CN | 001851925 A | 10/2006 |
| CN | 101160001 A | 4/2008 |
| CN | 100592502 C | 2/2010 |
| CN | 103985825 A | 8/2014 |
| EP | 1 752 818 A2 | 2/2007 |
| EP | 2 144 146 A1 | 1/2010 |
| EP | 2 148 264 A2 | 1/2010 |
| EP | 2 575 018 A1 | 4/2013 |
| JP | 03-266392 A | 11/1991 |
| JP | 2002-122871 A | 4/2002 |
| JP | 2003-086356 A | 3/2003 |
| JP | 2003-115388 A | 4/2003 |
| JP | 2003-174153 A | 6/2003 |
| JP | 2004-047309 A | 2/2004 |
| JP | 2005-293946 A | 10/2005 |
| JP | 2006-004650 A | 1/2006 |
| JP | 2007-220402 A | 8/2007 |
| JP | 2008-091237 A | 4/2008 |
| JP | 2009-199979 A | 9/2009 |
| JP | 2011-018097 A | 1/2011 |
| JP | 2011-118082 A | 6/2011 |
| JP | 2011-123321 A | 6/2011 |
| JP | 2011-171288 A | 9/2011 |
| JP | 2012-156140 A | 8/2012 |
| JP | 2012-209133 A | 10/2012 |
| JP | 201-216466 A | 11/2012 |
| JP | 2013-137888 A | 7/2013 |
| JP | 2013-251191 A | 12/2013 |
| JP | 5360687 B2 | 12/2013 |
| JP | 2014-022158 A | 2/2014 |
| JP | 2014-032960 A | 2/2014 |
| JP | 2014-135286 A | 7/2014 |
| JP | 2014-135306 A | 7/2014 |
| JP | 2016-119291 A | 6/2016 |
| KR | 2008-0031115 A | 4/2008 |
| KR | 2011-0017715 A | 2/2011 |

(56) References Cited

FOREIGN PATENT DOCUMENTS

| | | | |
|---|---|---|---|
| KR | 2013-0007208 A | 1/2013 |
| TW | 521447 B | 2/2003 |
| TW | 564471 B | 12/2003 |
| TW | 200725019 | 7/2007 |
| TW | 200824489 | 6/2008 |
| TW | 201002129 | 1/2010 |
| TW | 201022803 | 6/2010 |
| TW | 201240180 | 10/2012 |
| TW | 201306250 | 2/2013 |
| TW | 201333583 | 8/2013 |
| TW | 201421667 | 6/2014 |
| TW | 201421673 | 6/2014 |
| WO | WO 2008/009929 A2 | 1/2008 |
| WO | WO 2009/104563 A1 | 8/2009 |
| WO | WO 2016/002746 A1 | 1/2016 |
| WO | WO 2016/059497 A1 | 4/2016 |

OTHER PUBLICATIONS

Written Opinion re Application No. PCT/IB2015/057465, dated Jan. 12, 2016.
International Search Report re Application No. PCT/IB2016/054254, dated Nov. 8, 2016.
Chinese Office Action re Application No. CN 201580055728.7, dated Jun. 21, 2018.
Taiwanese Office Action re Application No. TW 108117097, dated Nov. 18, 2019.
Taiwanese Office Action (Application No. 109125444) dated Jul. 15, 2021.

\* cited by examiner

FIG. 23A1 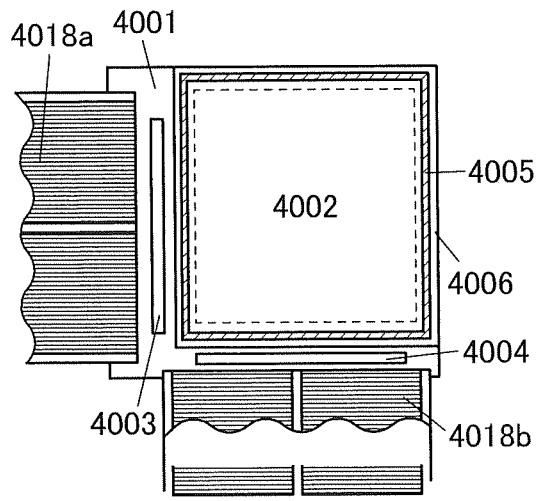
FIG. 23A2 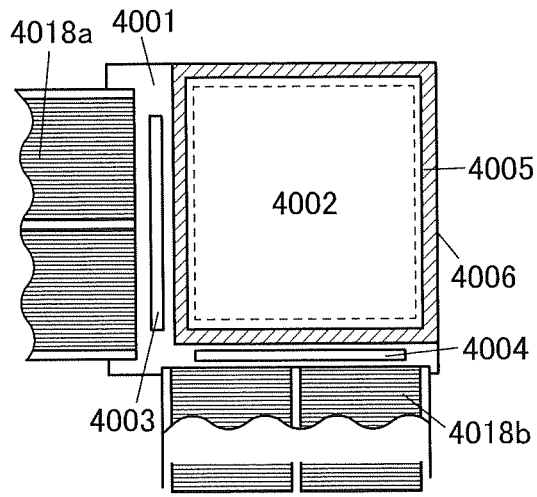
FIG. 23B1 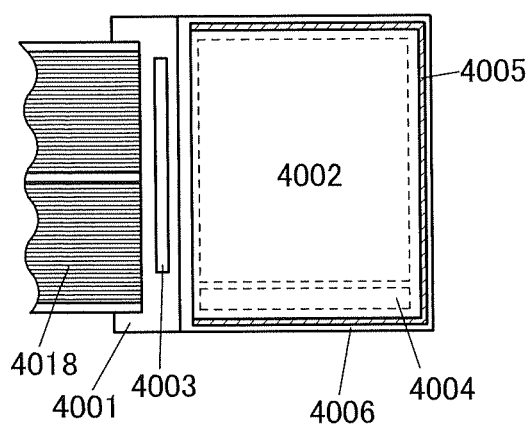
FIG. 23B2 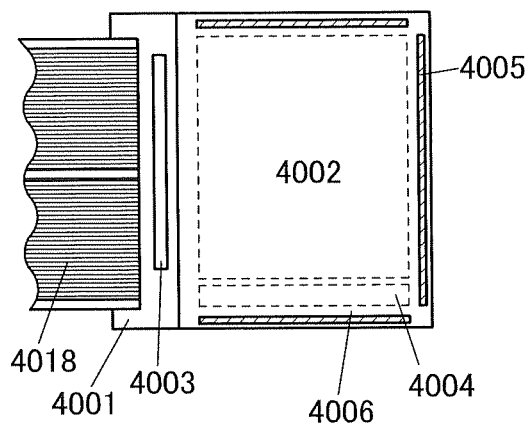

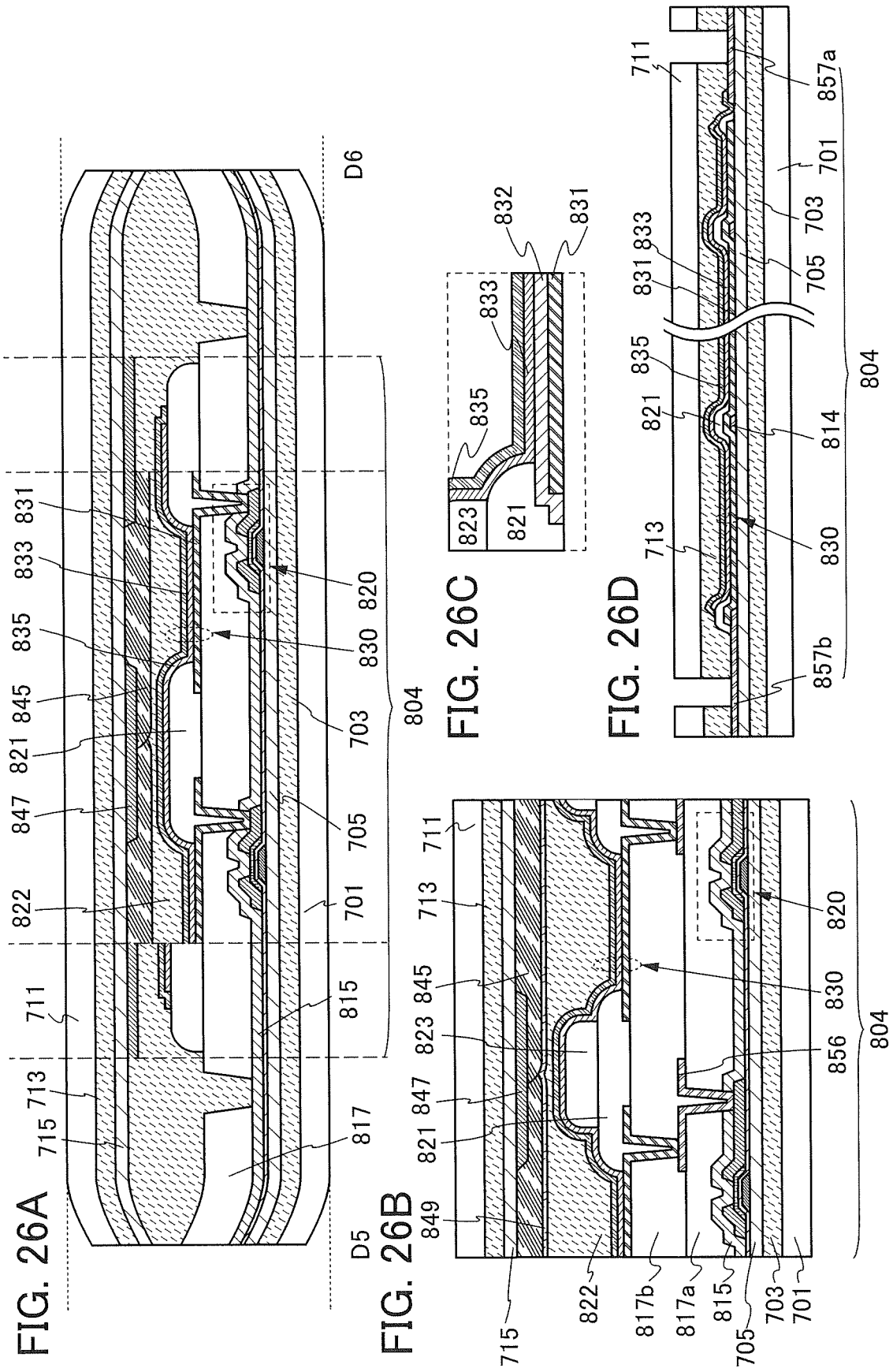

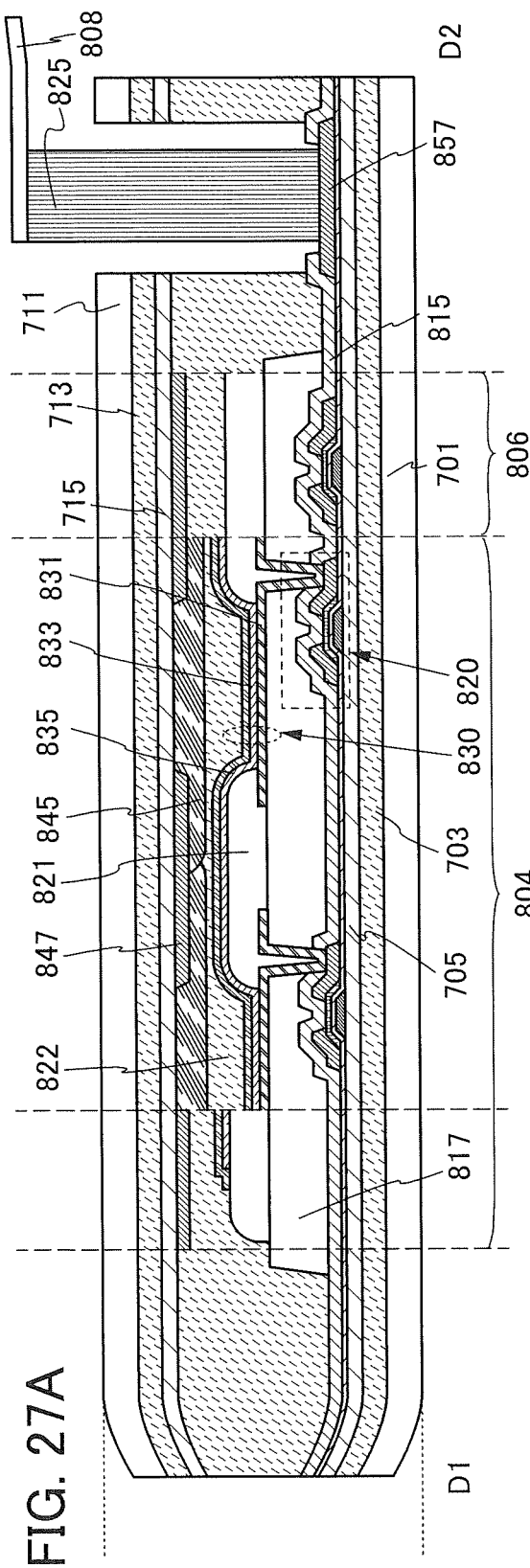
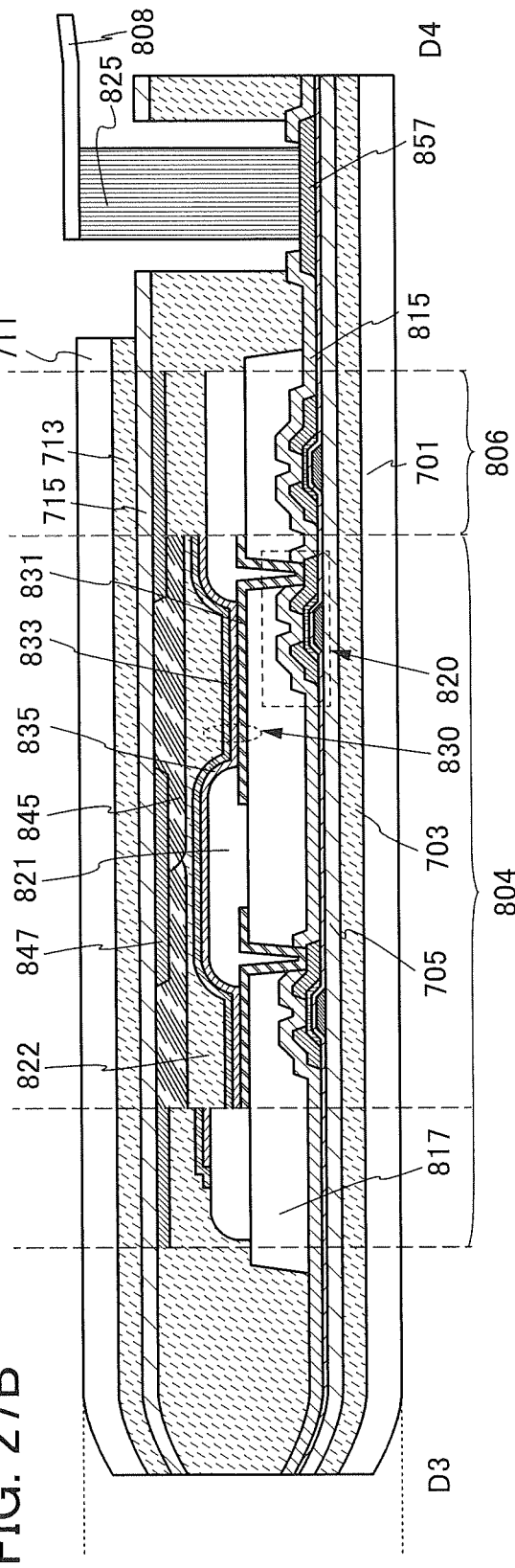
FIG. 27A
FIG. 27B

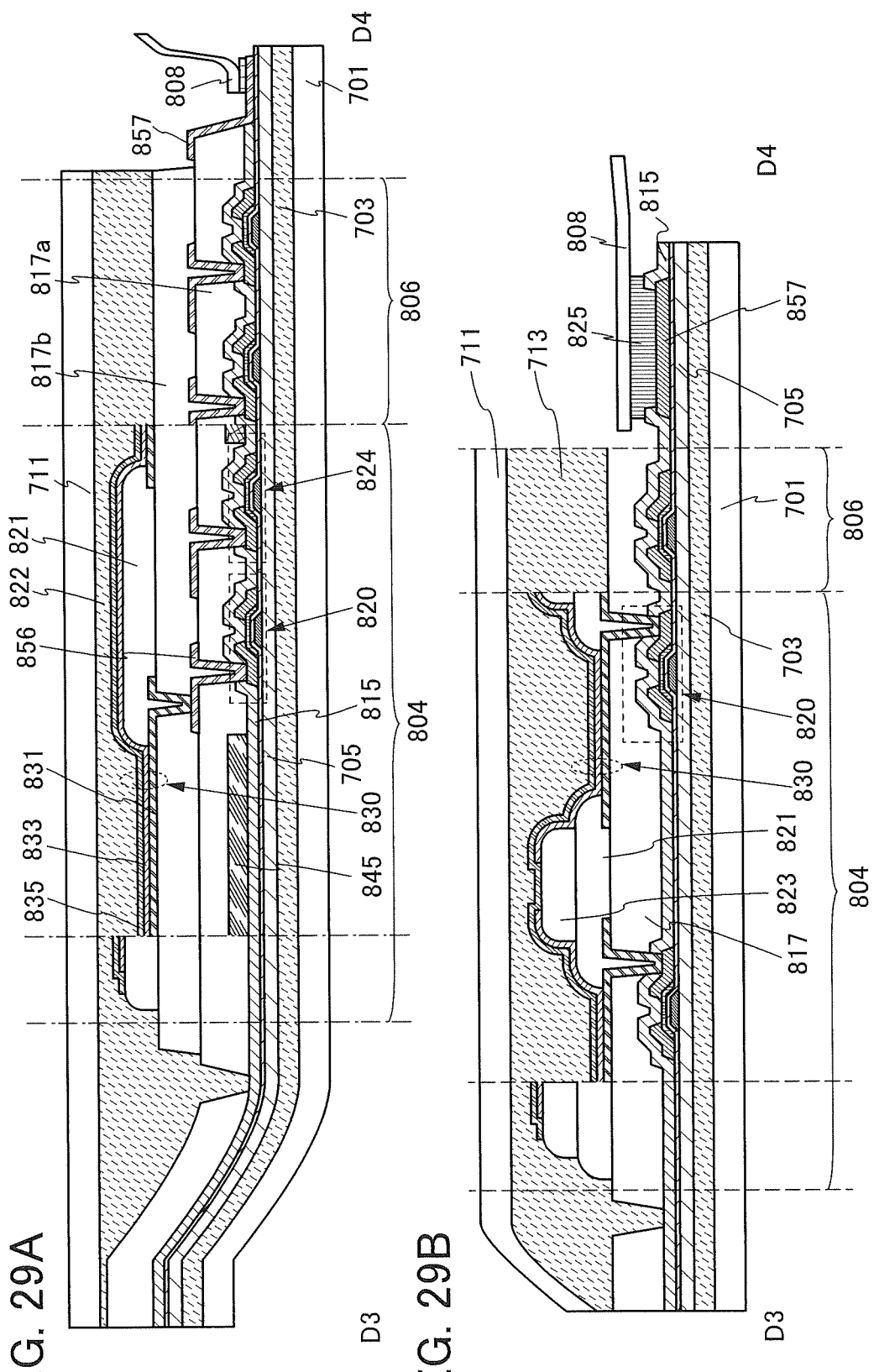

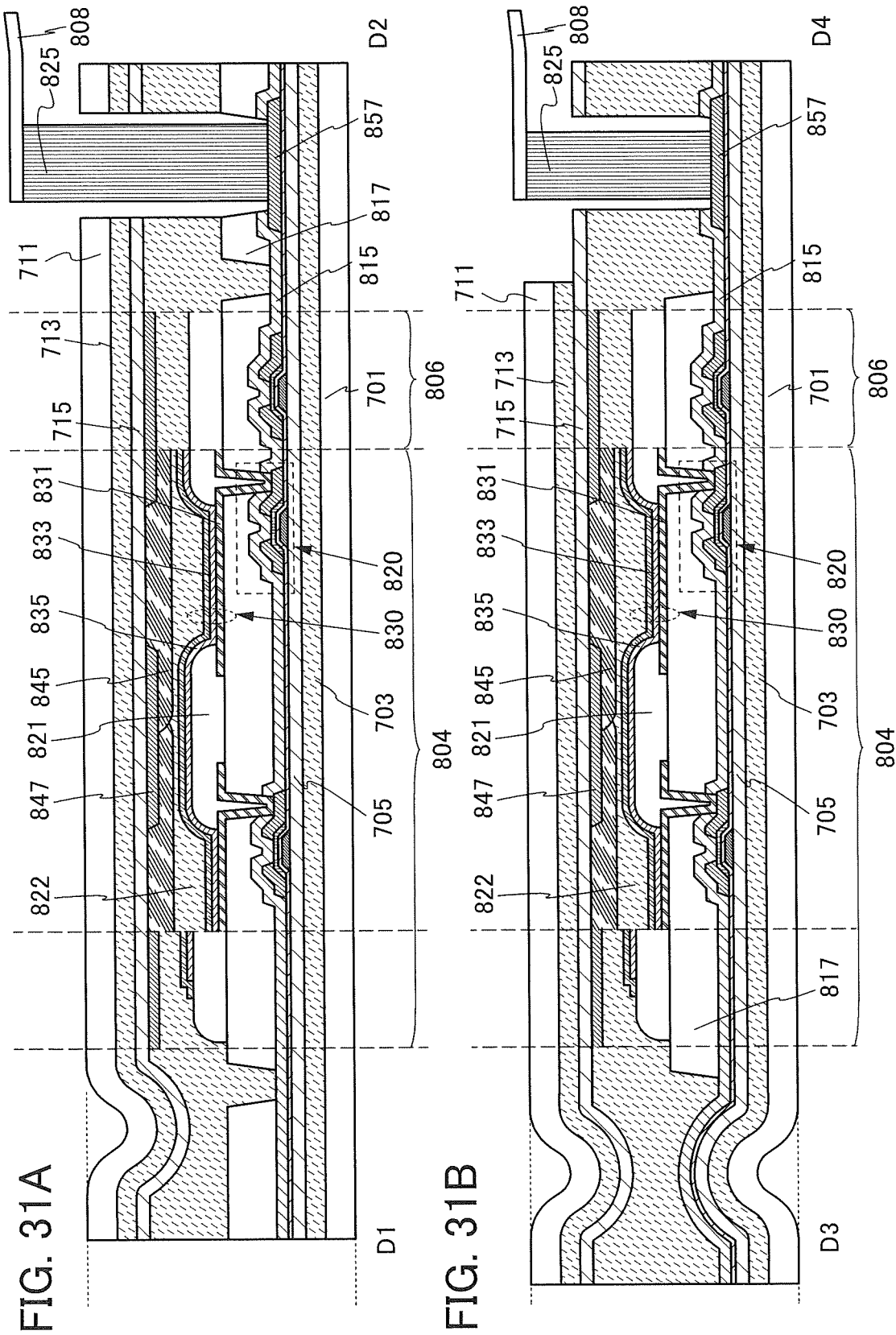

FIG. 38A
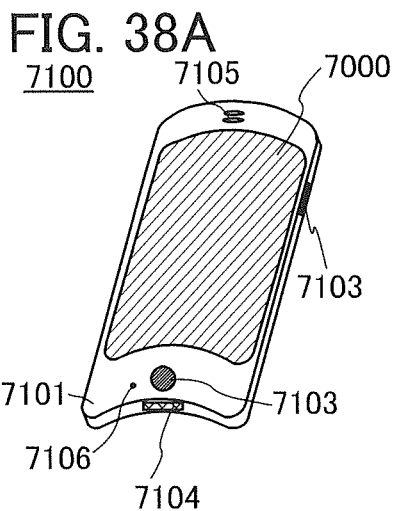
FIG. 38B
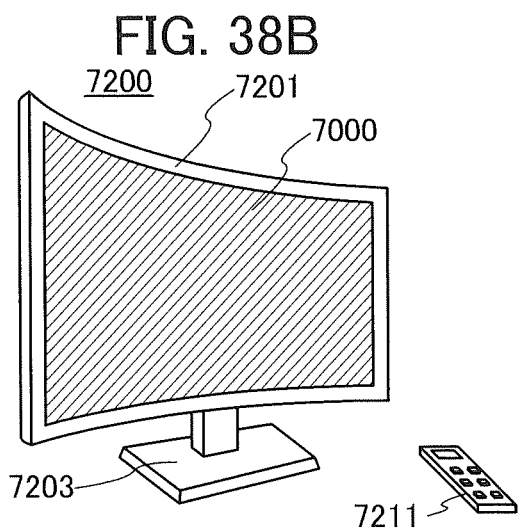
FIG. 38C1
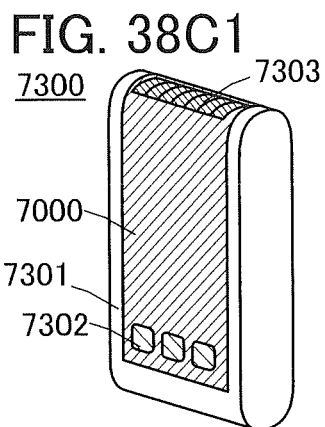
FIG. 38D
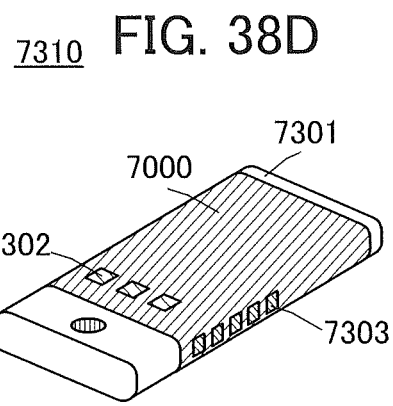
FIG. 38E
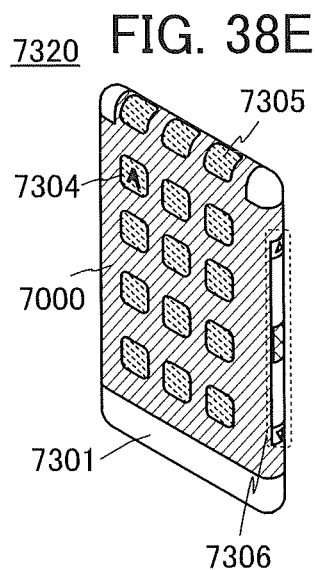
FIG. 38C2
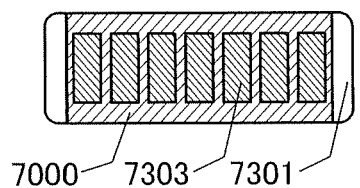
FIG. 38F
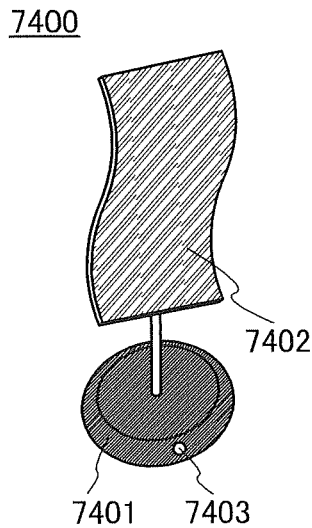
FIG. 38G
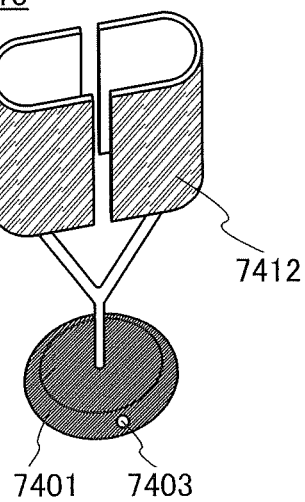
FIG. 38H
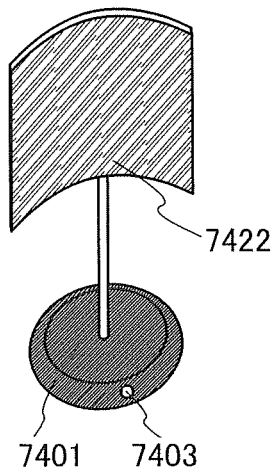

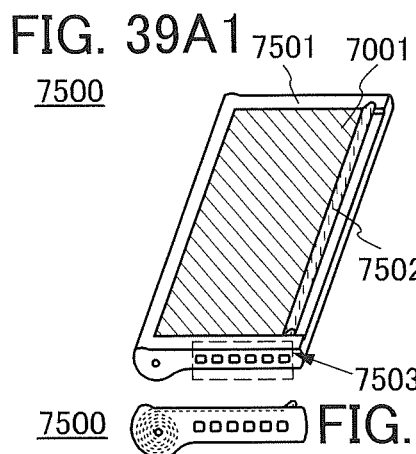
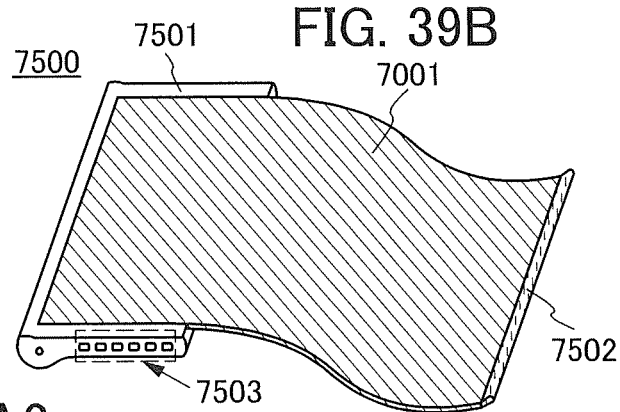
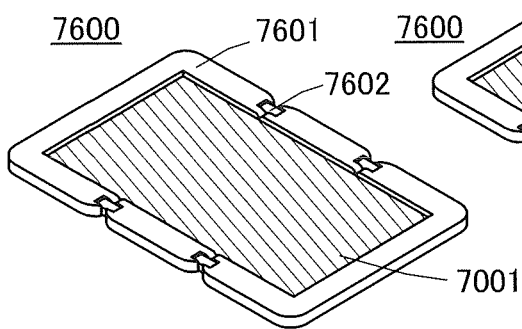
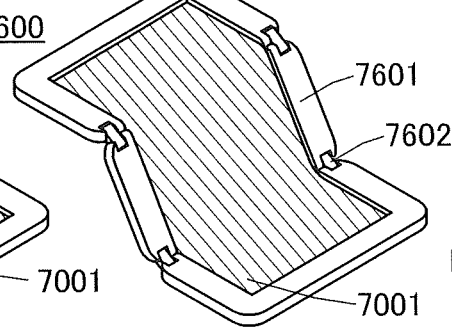
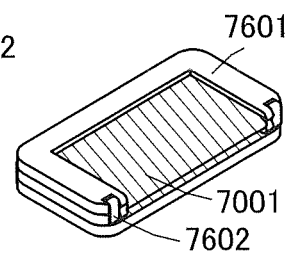
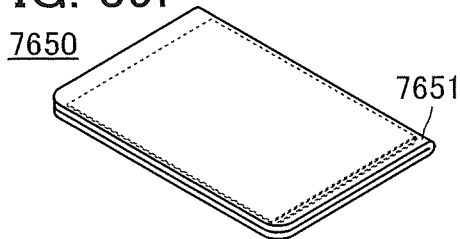
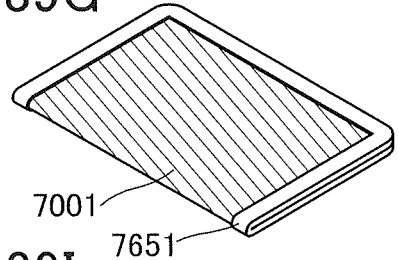
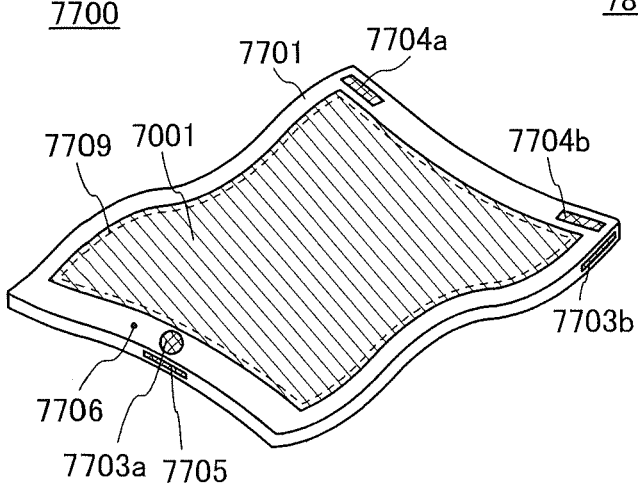
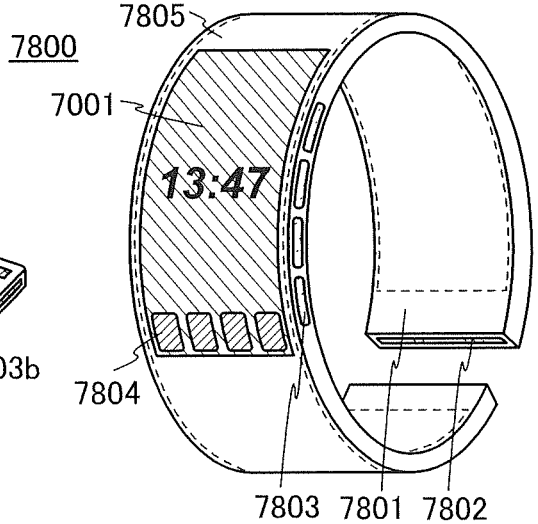

207 804 209 201

207 804 209 201

804 806 209 207 201

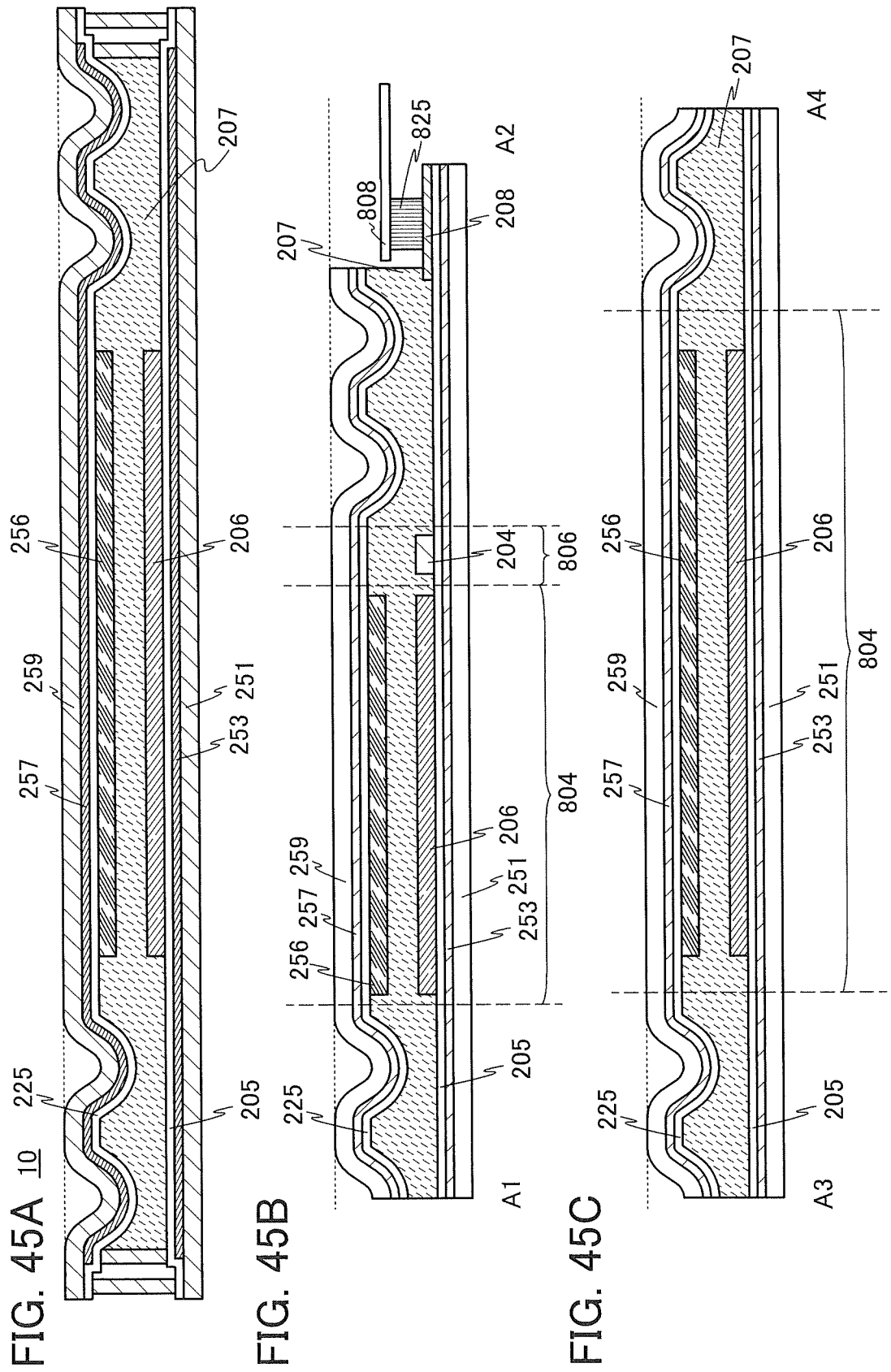

LIGHT-EMITTING DEVICE, MODULE, ELECTRONIC DEVICE, AND METHOD FOR MANUFACTURING LIGHT-EMITTING DEVICE

This application is a continuation of copending U.S. application Ser. No. 16/192,066, filed on Nov. 15, 2018 which is a continuation of U.S. application Ser. No. 15/839,059, filed on Dec. 12, 2017 (now U.S. Pat. No. 10,270,057 issued Apr. 23, 2019) which is a continuation of U.S. application Ser. No. 14/882,918, filed on Oct. 14, 2015 (now U.S. Pat. No. 9,847,505 issued Dec. 19, 2017) which are all incorporated herein by reference.

TECHNICAL FIELD

One embodiment of the present invention relates to a light-emitting device, a module, an electronic device, and a manufacturing method thereof. In particular, one embodiment of the present invention relates to a light-emitting device utilizing organic electroluminescence (EL), and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

BACKGROUND ART

Recent light-emitting devices and display devices are expected to be applied to a variety of uses and become diversified.

For example, light-emitting devices and display devices for mobile devices and the like are required to be thin, lightweight, and less likely to be broken.

Light-emitting elements utilizing EL (also referred to as EL elements) have features such as ease of thinning and lightening, high-speed response to an input signal, and driving with a direct-current low voltage source; therefore, application of the light-emitting elements to light-emitting devices and display devices has been proposed.

For example, Patent Document 1 discloses a flexible active matrix light-emitting device in which an organic EL element or a transistor serving as a switching element is provided over a film substrate.

An organic EL element has a problem in that entry of impurities such as moisture or oxygen from the outside erodes the reliability.

When impurities such as moisture or oxygen enter an organic compound or a metal material contained in an organic EL element from the outside of the organic EL element, the lifetime of the organic EL element is significantly shortened in some cases. This is because an organic compound or a metal material contained in the organic EL element reacts with the impurities such as moisture or oxygen and thus deteriorates.

Thus, a technique to seal an organic EL element for preventing entry of impurities has been researched and developed.

REFERENCE

Patent Document

[Patent Document 1] Japanese Published Patent Application No. 2003-174153

DISCLOSURE OF INVENTION

An object of one embodiment of the present invention is to provide a highly reliable light-emitting device, display device, electronic device, or lighting device. Alternatively, an object of one embodiment of the present invention is to provide a highly reliable flexible light-emitting device, display device, electronic device, or lighting device.

An object of one embodiment of the present invention is to provide a novel light-emitting device, display device, electronic device, or lighting device. Alternatively, an object of one embodiment of the present invention is to provide a lightweight light-emitting device, display device, electronic device, or lighting device. Alternatively, an object of one embodiment of the present invention is to provide a light-emitting device, display device, electronic device, or lighting device that is less likely to be broken. Alternatively, an object of one embodiment of the present invention is to provide a thin light-emitting device, display device, electronic device, or lighting device.

Note that the description of these objects does not disturb the existence of other objects. In one embodiment of the present invention, there is no need to achieve all the objects. Other objects can be derived from the description of the specification, the drawings, and the claims.

One embodiment of the present invention is a light-emitting device including a light-emitting portion and a non-light-emitting portion. The non-light-emitting portion is provided outside the light-emitting portion to have a frame-like shape. The non-light-emitting portion includes a portion whose thickness is smaller than that of the light-emitting portion. The non-light-emitting portion may include a first portion and a second portion. The first portion is closer to the light-emitting portion than the second portion is, and has a thickness smaller than that of the second portion.

One embodiment of the present invention is a light-emitting device including a light-emitting portion and a non-light-emitting portion. The non-light-emitting portion is provided outside the light-emitting portion to have a frame-like shape. The non-light-emitting portion includes a portion whose thickness decreases continuously from the light-emitting portion side to an end portion of the light-emitting device. The non-light-emitting portion may include a first portion and a second portion. The first portion is closer to the light-emitting portion than the second portion is. The thickness of the first portion decreases from the light-emitting portion side to the end portion side of the light-emitting device. The thickness of the second portion increases from the light-emitting portion side to the end portion of the light-emitting device.

The light-emitting device preferably has flexibility.

The light-emitting portion may include a light-emitting element and a transistor. The transistor is electrically connected to the light-emitting element. The light-emitting element is preferably an organic EL element.

The non-light-emitting portion may include at least one of a signal line driver circuit and a scan line driver circuit.

One embodiment of the present invention is a light-emitting device including a light-emitting portion and a non-light-emitting portion. The light-emitting portion includes a first flexible substrate, a second flexible substrate, a first bonding layer, a second bonding layer, a first insulating layer, and a first functional layer. The non-light-emitting portion includes the first flexible substrate, the second flexible substrate, the first bonding layer, the second bonding layer, and the first insulating layer. The first bonding layer is positioned between the first flexible substrate and the first insulating layer. The second bonding layer is positioned between the second flexible substrate and the first insulating layer. The first functional layer is positioned between the second bonding layer and the first insulating layer. The first bonding layer and the second bonding layer partly overlap with each other with the first insulating layer provided therebetween. The first functional layer includes a light-emitting element. A gap between the first flexible substrate and the second flexible substrate is smaller in at least part of the non-light-emitting portion than in the light-emitting portion. The non-light-emitting portion may include a first portion and a second portion. The first portion is closer to the light-emitting portion than the second portion is. The gap between the first flexible substrate and the second flexible substrate is smaller in the first portion than in the second portion.

The gap between the first flexible substrate and the second flexible substrate may be smaller or larger in the second portion than in the light-emitting portion, or may be the same in the second portion and the light-emitting portion.

The first portion may be provided outside the light-emitting portion to have a frame-like shape. The second portion may be provided outside the first portion to have a frame-like shape.

In each of the above structures, the light-emitting portion may include a third bonding layer, a second insulating layer, and a second functional layer. The non-light-emitting portion may include the third bonding layer and the second insulating layer. The third bonding layer may be positioned between the second bonding layer and the first insulating layer. The second insulating layer may be positioned between the second bonding layer and the third bonding layer. The first functional layer and the second functional layer may partly overlap with each other with the third bonding layer provided therebetween. The second functional layer may include a coloring layer.

The thickness of the third bonding layer is preferably smaller in the non-light-emitting portion than in the light-emitting portion. The light-emitting portion includes a third portion and the non-light-emitting portion includes a fourth portion. The thickness of the third bonding layer in the fourth portion is smaller than the thickness of the third bonding layer in the third portion. The thickness of the third bonding layer in the fourth portion is preferably half the thickness of the third bonding layer in the third portion, further preferably one third the thickness of the third bonding layer in the third portion. Specifically, the thickness of the third bonding layer in the fourth portion is greater than or equal to 0.1 μm and less than or equal to 10 μm, preferably greater than or equal to 0.1 μm and less than or equal to 5 μm, further preferably greater than or equal to 0.1 μm and less than or equal to 3 μm.

It is preferable that the thickness of the first flexible substrate be the same in the light-emitting portion and the non-light-emitting portion, and the thickness of the second flexible substrate be the same in the light-emitting portion and the non-light-emitting portion. In one embodiment of the present invention, the flexible substrates are attached to each other after a portion thinner than the light-emitting portion is formed in the non-light-emitting portion. Thus, it is possible to prevent expansion and contraction of the flexible substrates due to force applied thereto.

One embodiment of the present invention also includes a display device, a semiconductor device, and an input-output device to which any of the above structures is applied. These devices differ in the functional element included in the functional layer. For example, the display device of one embodiment of the present invention includes a display element as the functional element. The semiconductor device of one embodiment of the present invention includes a semiconductor element as the functional element. The input-output device of one embodiment of the present invention includes a light-emitting element or a display element, and a touch sensor as the functional elements.

One embodiment of the present invention is a module including a light-emitting device, a display device, a semiconductor device, or an input-output device to which any of the above structures is applied. The module is provided with a connector such as a flexible printed circuit (FPC) or a tape carrier package (TCP) or is mounted with an integrated circuit (IC) by a chip on glass (COG) method or the like.

One embodiment of the present invention is an electronic device or a lighting device including the above module. For example, one embodiment of the present invention is an electronic device including the module and any of an antenna, a battery, a housing, a speaker, a microphone, an operation switch, and an operation button.

One embodiment of the present invention is a manufacturing method of a light-emitting device that includes first to fourth steps (hereinafter referred to as a manufacturing method A). The first step includes a step of forming a light-emitting element over a first substrate. The second step includes a step of forming a bonding layer and a partition over the first substrate or a second substrate. The third step includes a step of making the first substrate and the second substrate overlap with each other under a first atmosphere to position the light-emitting element in a space surrounded by the partition, the first substrate, and the second substrate. The fourth step includes a step of curing the bonding layer and the partition under a second atmosphere. The first atmosphere has a lower pressure than the second atmosphere. In the second step, the partition is formed to surround the bonding layer with a gap left between the partition and the bonding layer.

One embodiment of the present invention is a manufacturing method of a light-emitting device that includes first to sixth steps (hereinafter referred to as a manufacturing method B). The first step includes a step of forming a separation layer over a first substrate. The second step includes a step of forming a layer to be separated over the separation layer. In the second step, an insulating layer over the separation layer and a light-emitting element over the insulating layer are formed as the layer to be separated. The third step includes a step of forming a bonding layer and a partition over the first substrate or a second substrate. In the third step, the bonding layer is formed to overlap with the separation layer and the layer to be separated. In the third step, the partition is formed to surround the bonding layer with a gap left between the partition and the bonding layer. The fourth step includes a step of making the first substrate and the second substrate overlap with each other under a first atmosphere to position the light-emitting element in a space surrounded by the partition, the first substrate, and the second substrate. The fifth step includes a step of curing the bonding layer under a second atmosphere. The sixth step includes a step of separating the first substrate and the layer to be separated. The first atmosphere has a lower pressure than the second atmosphere.

In the fifth step of the manufacturing method B, the partition is preferably cured before the bonding layer is cured or in the step of curing the bonding layer.

In the manufacturing methods A and B, the first atmosphere may be a reduced-pressure atmosphere and the second atmosphere may be an air atmosphere or a pressurized atmosphere.

One embodiment of the present invention is a manufacturing method of a light-emitting device that includes first to fifth steps (hereinafter referred to as a manufacturing method C). The first step includes a step of forming a light-emitting element over a first substrate. The second step includes a step of forming a bonding layer over the first substrate or a second substrate. The third step includes a step of making the first substrate and the second substrate overlap with each other to surround the light-emitting element with the bonding layer, the first substrate, and the second substrate. The fourth step includes a step of applying pressure to the bonding layer with a member having a projection. The fifth step includes a step of curing the bonding layer.

In the manufacturing method C, the fourth step and the fifth step are preferably performed at the same time.

In the manufacturing method C, the second step may include a step of forming a partition over the first substrate or the second substrate. The partition is formed to surround the bonding layer. A step of curing the partition is preferably performed between the third step and the fourth step.

One embodiment of the present invention is a manufacturing method of a light-emitting device that includes first to seventh steps (hereinafter referred to as a manufacturing method D). The first step includes a step of forming a separation layer over a first substrate. The second step includes a step of forming a layer to be separated over the separation layer. In the second step, an insulating layer over the separation layer and a light-emitting element over the insulating layer are formed as the layer to be separated. The third step includes a step of forming a bonding layer over the first substrate or a second substrate. In the third step, the bonding layer is formed to overlap with the separation layer and the layer to be separated. The fourth step includes a step of making the first substrate and the second substrate overlap with each other to surround the light-emitting element with the bonding layer, the first substrate, and the second substrate. The fifth step includes a step of applying pressure to the bonding layer with a member having a projection. The sixth step includes a step of curing the bonding layer. The seventh step includes a step of separating the first substrate and the layer to be separated.

In the manufacturing method D, the fifth step and the sixth step are preferably performed at the same time.

In the manufacturing method D, the third step may include a step of forming a partition over the first substrate or the second substrate. The partition is formed to surround the bonding layer. A step of curing the partition is preferably performed between the fourth step and the fifth step.

One embodiment of the present invention can provide a highly reliable flexible light-emitting device, display device, electronic device, or lighting device.

One embodiment of the present invention can provide a novel light-emitting device, display device, electronic device, or lighting device. One embodiment of the present invention can provide a lightweight light-emitting device, display device, electronic device, or lighting device. One embodiment of the present invention can provide a light-emitting device, display device, electronic device, or lighting device that is less likely to be broken. One embodiment of the present invention can provide a thin light-emitting device, display device, electronic device, or lighting device.

Note that the description of these effects does not disturb the existence of other effects. One embodiment of the present invention does not necessarily achieve all the effects listed above. Other effects can be derived from the description of the specification, the drawings, and the claims.

BRIEF DESCRIPTION OF DRAWINGS

FIGS. 23A1, 23A2, 23B1, 23B2, and 23C illustrate examples of a light-emitting device.

FIGS. 26A to 26D illustrate examples of a light-emitting device.

FIGS. 27A and 27B illustrate examples of a light-emitting device.

FIGS. 29A and 29B illustrate examples of a light-emitting device.

FIGS. 31A and 31B illustrate examples of a light-emitting device.

FIGS. 38A, 38B, 38C1, 38C2, 38D, 38E, 38F, 38G, and 38H illustrate examples of an electronic device and a lighting device.

FIGS. 39A1, 39A2, and 39B to 39I illustrate examples of an electronic device.

FIGS. 45A to 45C illustrate a light-emitting device of Example 3 and a manufacturing method thereof.

BEST MODE FOR CARRYING OUT THE INVENTION

Figure 1A:
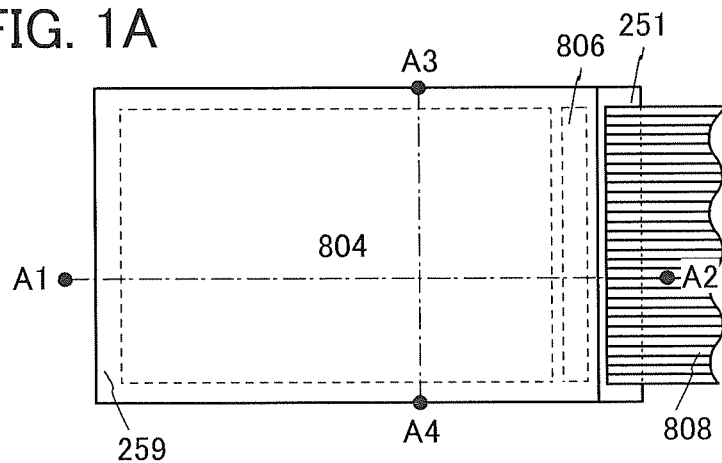
FIGS. 1A to 1D illustrate examples of a light-emitting device.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

The terms "film" and "layer" can be interchanged with each other according to circumstances. For example, the term "conductive layer" can be changed into the term "conductive film." Furthermore, the term "insulating film" can be changed into the term "insulating layer."

Embodiment 1

In this embodiment, a light-emitting device of one embodiment of the present invention and a manufacturing method thereof will be described with reference to FIGS. 1A to 1D, FIGS. 2A to 2D, FIGS. 3A to 3F, FIGS. 4A to 4D, FIGS. 5A to 5E, FIGS. 6A and 6B, FIGS. 7A and 7B, FIGS. 8A to 8D, FIGS. 9A to 9D, FIGS. 10A and 10B, FIGS. 11A to 11C, FIGS. 12A to 12D, FIGS. 13A to 13D, FIGS. 14A and 14B, FIGS. 15A to 15D, FIGS. 16A to 16D, FIGS. 17A to 17C, FIGS. 18A to 18D, FIGS. 19A to 19D, FIGS. 20A to 20D, FIGS. 21A to 21D, FIGS. 22A to 22D, and FIGS. 23A1, 23A2, 23B1, 23B2, and 23C.

Although light-emitting devices including organic EL elements are mainly described as examples in this embodiment, one embodiment of the present invention is not limited to these examples. A light-emitting device or a display device including another light-emitting element or display element which will be described in Embodiment 2 as an example is also one embodiment of the present invention. Moreover, one embodiment of the present invention is not limited to the light-emitting device or the display device and can be applied to a variety of devices such as a semiconductor device and an input-output device.

In some cases, a functional element (e.g., a light-emitting element or a transistor) included in a light-emitting device deteriorates because of entry of impurities such as moisture from the outside, which might reduce the reliability. Entry of impurities in the thickness direction of the light-emitting device (i.e., entry through a light-emitting surface and a surface facing the light-emitting surface) can be minimized by providing the functional element between a pair of layers (substrates, insulating films, or the like) with a high gas barrier property. At a side surface of the light-emitting device, a bonding layer for sealing the light-emitting element or the transistor is exposed to the air. When a resin is used for the bonding layer, for example, it is possible to achieve higher impact resistance, higher heat resistance, and greater robustness against deformation due to external force or the like than when a glass frit or the like is used. On the other hand, a resin has an insufficient gas barrier property, water-resistant property, or moisture-resistant property in some cases.

In view of the above, in the light-emitting device of one embodiment of the present invention, a non-light-emitting portion has a portion whose thickness is smaller than that of a light-emitting portion. The light-emitting device has the light-emitting portion and the non-light-emitting portion, and the non-light-emitting portion is provided outside the light-emitting portion to have a frame-like shape.

When the light-emitting device (bonding layer) has a region having a smaller thickness than other portions, impurities such as moisture entering through a side surface of the light-emitting device do not easily pass through the region. As a result, the impurities are less likely to reach the functional element than when the light-emitting device (bonding layer) has a uniform thickness, and a reduction in reliability of the light-emitting device can be inhibited.

The reliability of the light-emitting device can be improved by changing its shape (or the thickness of the bonding layer), which allows the material used for the bonding layer to be selected from a wider range of options.

The use of a resin for the bonding layer can increase the flexibility and the resistance to bending of the light-emitting device.

Note that the thinner region may be locally provided in the non-light-emitting portion. Alternatively, the thickness may decrease in a continuous (smooth) manner from the light-emitting portion side of the non-light-emitting portion to an end portion of the light-emitting device.

Two methods for manufacturing the light-emitting device of one embodiment of the present invention are described briefly.

Manufacturing Method a

First, a first substrate and a second substrate are prepared. Then, a light-emitting element is formed over the first substrate. After that, a bonding layer and a partition are formed over the first substrate or the second substrate. The partition is provided to surround the bonding layer and the light-emitting element, with a gap left between the partition and the bonding layer.

Then, the first substrate and the second substrate overlap with each other under a first atmosphere, so that the light-emitting element and the bonding layer are positioned in a space surrounded by the partition, the first substrate, and the second substrate. When the first atmosphere is a reduced-pressure atmosphere, for example, the space surrounded by the partition, the first substrate, and the second substrate is in a reduced-pressure state. Note that since a gap is left between the bonding layer and the partition, a hollow portion is formed in the space.

Next, the first substrate and the second substrate are exposed to a second atmosphere. When the second atmosphere is an air atmosphere, for example, the pair of substrates are subjected to atmospheric pressure. The bonding layer spreads toward an end portion of the substrate and fills the hollow portion between the partition and the bonding layer. As a result, the end portion of the light-emitting device partly has a smaller thickness than the middle portion. Note that the pressure of the second atmosphere is higher than that of the first atmosphere.

Then, the bonding layer and the partition are cured. In one embodiment of the present invention, at least one of the bonding layer and the partition is cured under an atmosphere with a pressure higher than that of the first atmosphere. It is preferable that both the bonding layer and the partition be cured under an atmosphere having a higher pressure than the first atmosphere, because a sufficiently thin portion can be provided in the light-emitting device reliably. In the above manner, the light-emitting device in which part of the non-light-emitting portion has a smaller thickness than the light-emitting portion can be manufactured.

Manufacturing Method b

First, a first substrate and a second substrate are prepared. Then, a light-emitting element is formed over the first substrate. After that, a bonding layer is formed over the first substrate or the second substrate.

Then, the first substrate and the second substrate overlap with each other, so that the light-emitting element is surrounded by the bonding layer, the first substrate, and the second substrate.

Before the bonding layer is completely cured, at least part of the non-light-emitting portion is subjected to pressure, whereby the non-light-emitting portion partly has a smaller thickness than the light-emitting portion.

For example, pressure can be applied to at least part of the non-light-emitting portion with the use of a third substrate having a projection. Specifically, the third substrate overlaps with the non-light-emitting portion so that the projection overlaps with the non-light-emitting portion. Then, pressure is applied to the stacked-layer structure including the first substrate, the second substrate, and the third substrate. The non-light-emitting portion in a portion that overlaps with the projection and the vicinity thereof are pressed, where the bonding layer has a smaller thickness than in other portions; thus, the non-light-emitting portion of the light-emitting device can have a first portion whose thickness is smaller than that of the light-emitting portion. Note that the non-light-emitting portion may include, outside the thin first portion, a second portion whose thickness is larger than that of the first portion. The relation between the thickness of the light-emitting device in the second portion and that in the light-emitting portion is not particularly limited; the second portion may have a larger or smaller thickness than or may have the same thickness as the light-emitting portion.

The bonding layer is cured while or after pressure is applied. By curing the bonding layer, the light-emitting element can be sealed with the bonding layer, the first substrate, and the second substrate. In the above manner, the light-emitting device in which part of the non-light-emitting portion has a smaller thickness than the light-emitting portion can be manufactured.

Examples of the structure and manufacturing method of the light-emitting device of one embodiment of the present invention are described below. First, structure examples a-1, a-2, and a-3 that can be formed by the above manufacturing method a are described. Then, detailed description of manufacturing methods of the structure examples a-2 and a-3 is made. After that, structure examples b-1, b-2, and b-3 that can be formed by the above manufacturing method b are described. Lastly, detailed description of manufacturing methods of the structure examples b-1, b-2, and b-3 is made. Note that part of a structure example or a manufacturing method similar to that of a preceding structure example or a preceding manufacturing method will not be described again.

Structure Example a-1

Figure 1B:
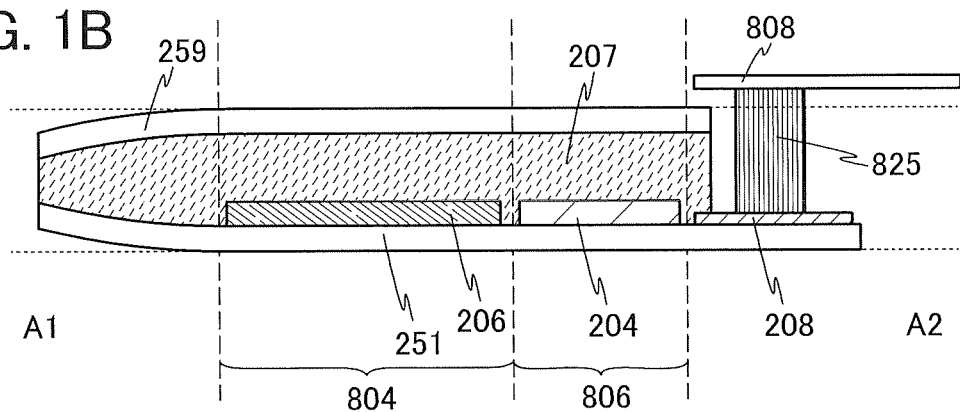
Figure 1C:
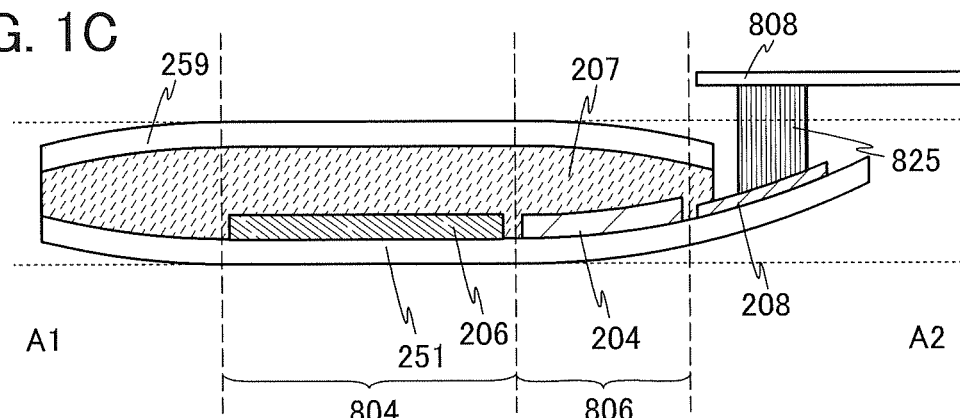
Figure 1D:
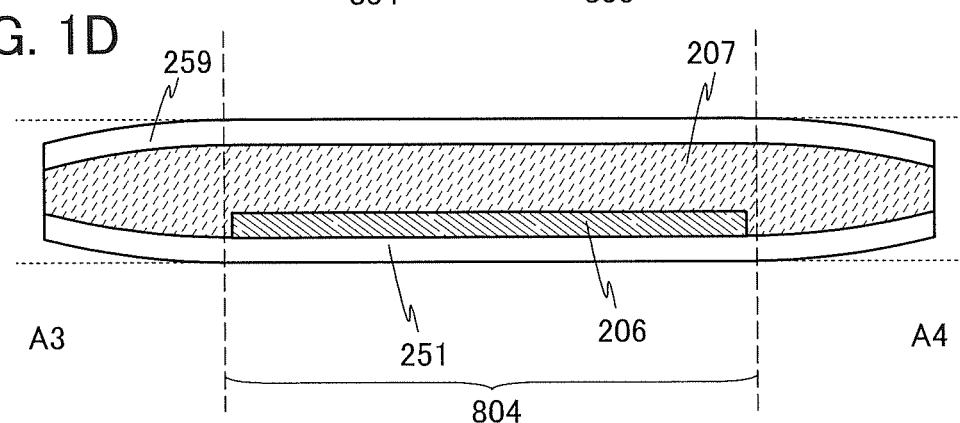

FIG. 1A is a top view of a light-emitting device. FIG. 1B is a cross-sectional view taken along a dashed-dotted line A1-A2 in FIG. 1A. FIG. 1C illustrates a modification example of FIG. 1B. FIG. 1D is a cross-sectional view taken along a dashed-dotted line A3-A4 in FIG. 1A.

The light-emitting device illustrated in FIG. 1A includes a light-emitting portion 804 and a driver circuit portion 806. Portions other than the light-emitting portion 804 in the light-emitting device can be regarded as non-light-emitting portions. In other words, the non-light-emitting portion is provided outside the light-emitting portion 804 to have a frame-like shape. For example, the driver circuit portion 806 is a non-light-emitting portion.

The light-emitting device in FIGS. 1A to 1D includes a substrate 251, a functional layer 204, a functional layer 206, a bonding layer 207, a conductive layer 208, and a substrate 259.

In the light-emitting portion 804, the functional layer 206 is provided over the substrate 251.

The functional layer 206 includes a light-emitting element and may also include a transistor, a capacitor, or the like.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. The light-emitting element may have any of a top emission structure, a bottom emission structure, and a dual emission structure.

In the driver circuit portion 806, the functional layer 204 is provided over the substrate 251.

The functional layer 204 includes a transistor and may also include a capacitor, a resistor, a switch element, or the like. The light-emitting device of one embodiment of the present invention may include at least one of a signal line driver circuit and a scan line driver circuit as a driver circuit portion. The light-emitting device of one embodiment of the present invention does not necessarily include a driver circuit portion.

The conductive layer 208 is electrically connected to an external input terminal through which a signal (e.g., a video signal, a clock signal, a start signal, or a reset signal) or a potential from the outside is transmitted to the driver circuit portion 806. In FIGS. 1B and 1C, the conductive layer 208 is electrically connected to an FPC 808 through a connector 825.

The substrate 251 and the substrate 259 are attached to each other with the bonding layer 207.

For each of the substrates, a material such as glass, quartz, an organic resin, a metal, or an alloy can be used. The substrate on the side from which light from the light-emitting element is extracted is formed using a material which transmits the light.

A flexible substrate may be used. For example, an organic resin; or glass, a metal, or an alloy that is thin enough to have flexibility can be used.

An organic resin, which has a specific gravity smaller than that of glass, is preferably used for the flexible substrate, in which case the light-emitting device can be lightweight as compared with the case where glass is used.

The substrate is preferably formed using a material with high toughness. In that case, a robust light-emitting device with high impact resistance can be provided. For example, when an organic resin substrate or a thin metal or alloy substrate is used, the light-emitting device can be lightweight and robust as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel.

When a material with high thermal emissivity is used for the substrate, the surface temperature of the light-emitting device can be prevented from rising, leading to inhibition of breakage or a decrease in reliability of the light-emitting device. For example, the substrate may have a stacked-layer structure of a metal substrate and a layer with high thermal emissivity (the layer can be formed using a metal oxide or a ceramic material, for example).

Examples of a material having flexibility and a light-transmitting property include polyester resins such as poly(ethylene terephthalate) (PET) and poly(ethylene naphthalate) (PEN), a polyacrylonitrile resin, a polyimide resin, a poly(methyl methacrylate) resin, a polycarbonate (PC) resin, a polyethersulfone (PES) resin, a polyamide resin (e.g., nylon or aramid), a polycycloolefin resin, a polystyrene resin, a poly(amide imide) resin, a poly(vinyl chloride) resin, and a polytetrafluoroethylene (PTFE) resin. In particular, a material having a low coefficient of linear expansion is preferable, and for example, a poly(amide imide) resin, a polyimide resin, a polyamide resin, or PET can be suitably used. A substrate in which a fibrous body is impregnated with a resin (also referred to as prepreg) or a substrate whose coefficient of linear expansion is reduced by mixing an inorganic filler with an organic resin can also be used.

Furthermore, for the substrate, a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack including a resin film and a nonwoven fabric containing a cellulose fiber whose fiber width is 4 nm or more and 100 nm or less, or a stack including a resin film and a sheet including an artificial spider's thread fiber may be used.

As shown in FIGS. 1B to 1D, the thickness of the light-emitting device (or the bonding layer 207) is uniform (or substantially uniform) in the light-emitting portion 804. Meanwhile, the non-light-emitting portion has a region with a small thickness. In other words, a gap between the substrate 251 and the substrate 259 in part of the non-light-emitting portion is smaller than that in the light-emitting portion 804. When the thickness of an end portion of the light-emitting device is smaller than that of the light-emitting portion 804 or the like as described above, entry of impurities such as moisture and oxygen into the light-emitting device can be inhibited.

Note that FIG. 1B illustrates an example in which the non-light-emitting portion in a portion where the driver circuit portion 806 and the conductive layer 208 are provided does not have a region whose thickness is smaller than that of the light-emitting portion. The shortest distance from the side of the light-emitting portion 804 that is adjacent to the driver circuit portion 806 to an end portion of the light-emitting device is longer than the shortest distance from the other sides of the light-emitting portion 804 to other end portions of the light-emitting device; therefore, on the side of the light-emitting device on which the driver circuit portion 806 is provided, impurities are unlikely to reach the light-emitting element or the like. In that case, the non-light-emitting portion does not necessarily have a portion whose thickness is smaller than that of the light-emitting portion. In the above manner, the element included in the driver circuit portion 806 can be prevented from deteriorating because of bending. Moreover, the conductive layer 208 and the FPC 808 can be electrically connected to each other reliably. In one embodiment of the present invention, a portion that is thinner than the light-emitting portion and has a frame-like shape may be provided in the non-light-emitting portion. FIG. 1C illustrates an example in which the non-light-emitting portion in a portion where the driver circuit portion 806 and the conductive layer 208 are provided also has a region whose thickness is smaller than that of the light-emitting portion.

Figure 2A:
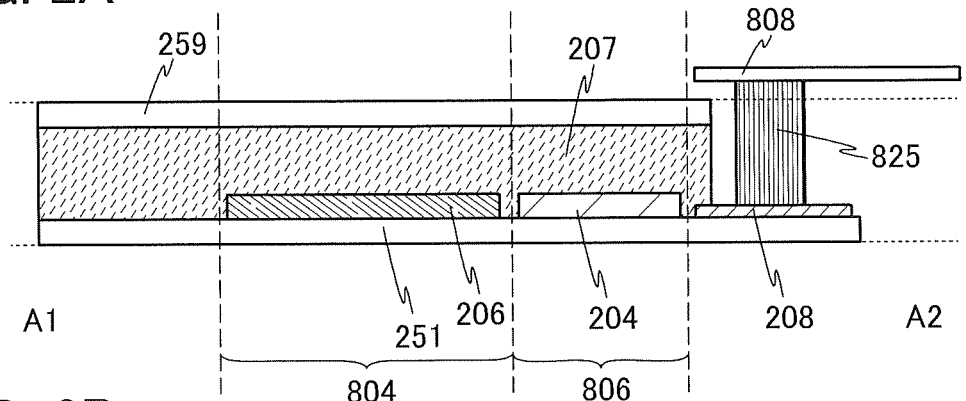
FIGS. 2A to 2D illustrate examples of a light-emitting device.
Figure 2B:
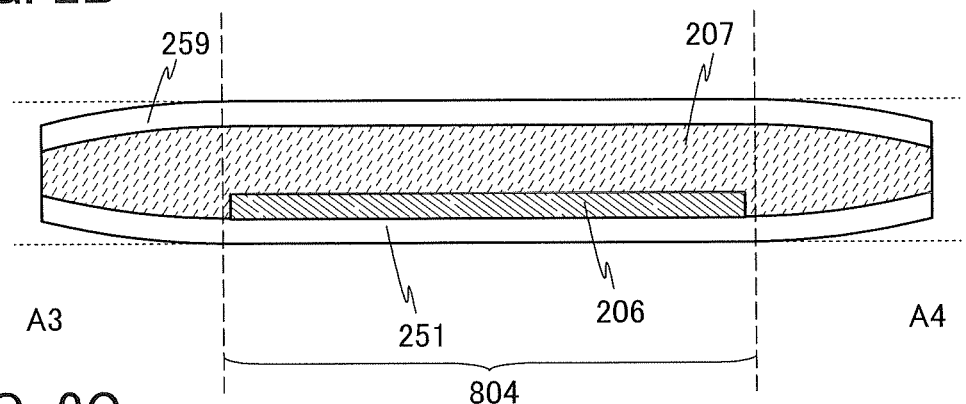

Note that as in FIGS. 2A and 2B, which are the cross-sectional view taken along the dashed-dotted line A1-A2 in FIG. 1A and that taken along the dashed-dotted line A3-A4, the non-light-emitting portion may have a region whose thickness is smaller than that of the light-emitting portion, on two of the four sides of the light-emitting device.

Figure 2C:
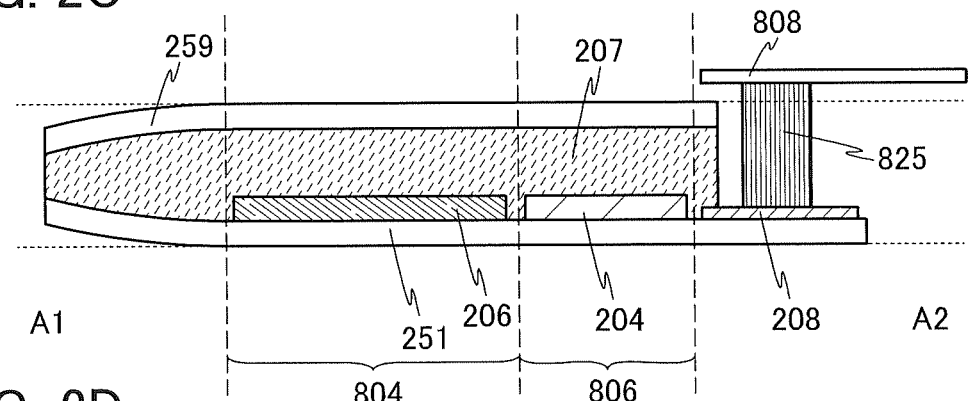
Figure 2D:
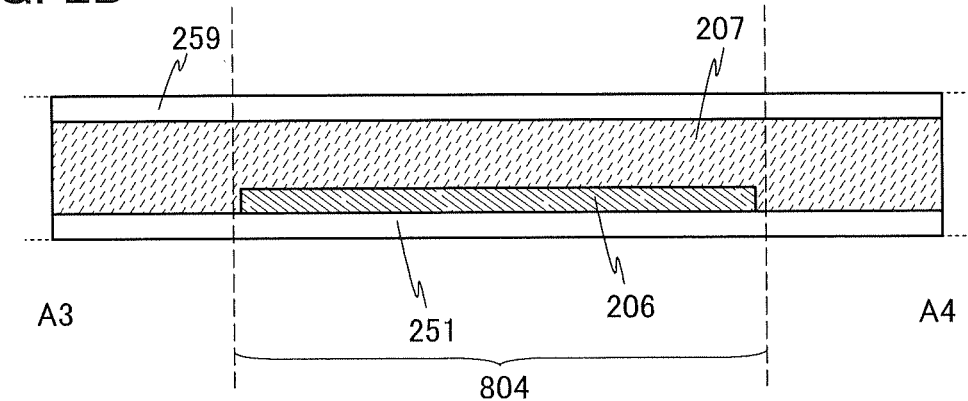

Furthermore, as in FIGS. 2C and 2D, which are the cross-sectional view taken along the dashed-dotted line A1-A2 in FIG. 1A and that taken along the dashed-dotted line A3-A4, the non-light-emitting portion may have a region whose thickness is smaller than that of the light-emitting portion, on one of the four sides of the light-emitting device.

Although the functional layer 206 is formed directly over the substrate 251 in the structure example a-1, one embodiment of the present invention is not limited to this structure. As described in the following structure examples a-2 and a-3, the functional layer 206 that has been formed over a formation substrate may be transferred to the substrate 251. With this method, for example, a layer to be separated which is formed over a formation substrate having high heat resistance can be transferred to a substrate having low heat resistance, and the manufacturing temperature of the layer to be separated is not limited by the substrate having low heat resistance. The layer to be separated can be transferred to a substrate or the like that is more lightweight or flexible or thinner than the formation substrate, whereby a reduction in thickness and weight and improvement in flexibility of the light-emitting device can be achieved.

Structure Example a-2

Figure 3A:
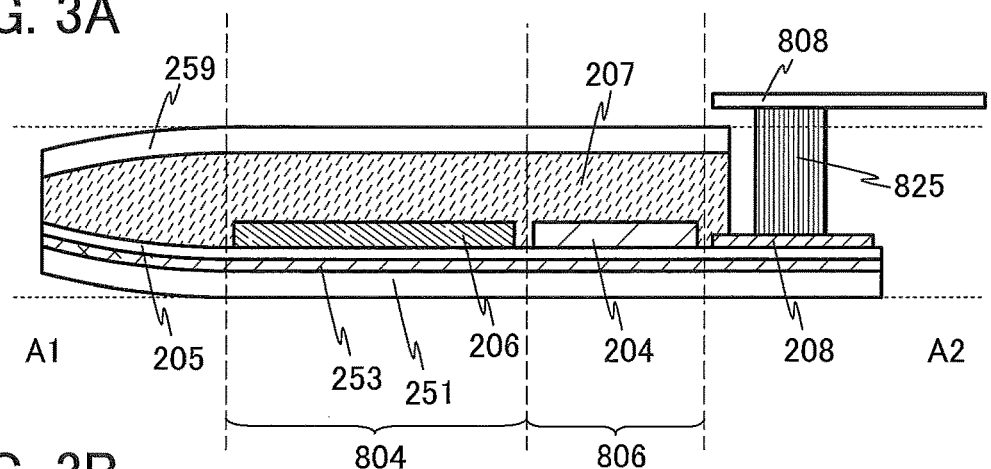
FIGS. 3A to 3F illustrate examples of a light-emitting device.
Figure 3B:
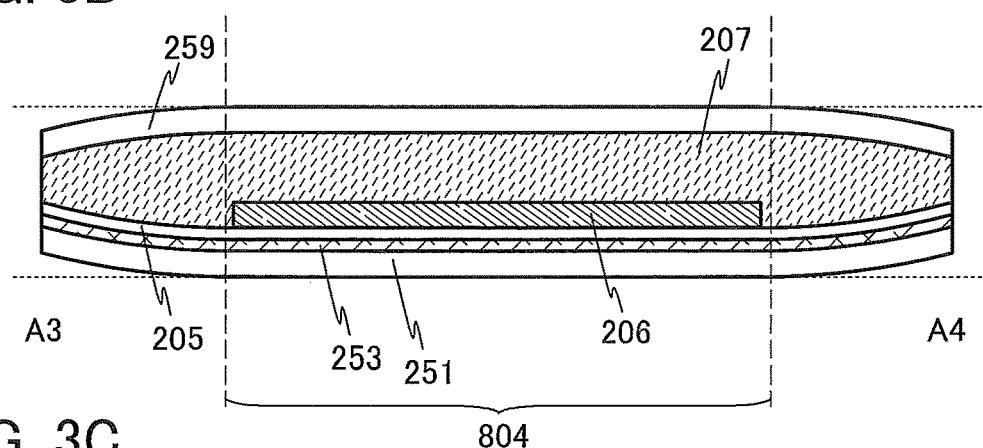

FIG. 3A is a cross-sectional view taken along the dashed-dotted line A1-A2 in FIG. 1A. FIG. 3B is a cross-sectional view taken along the dashed-dotted line A3-A4 in FIG. 1A.

The light-emitting device in FIGS. 3A and 3B includes the substrate 251, a bonding layer 253, the functional layer 204, an insulating layer 205, the functional layer 206, the bonding layer 207, the conductive layer 208, and the substrate 259.

In the light-emitting portion 804, the functional layer 206 is provided over the insulating layer 205. The substrate 251 and the insulating layer 205 are attached to each other with the bonding layer 253.

As the insulating layer 205, an insulating layer having an excellent gas barrier property, an excellent water-resistant property, an excellent moisture-resistant property, or the like is preferably used.

As an insulating layer having an excellent moisture-resistant property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating layer having an excellent moisture-resistant property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the driver circuit portion 806, the functional layer 204 is provided over the insulating layer 205.

The conductive layer 208 is electrically connected to the FPC 808 through the connector 825.

Figure 3C:
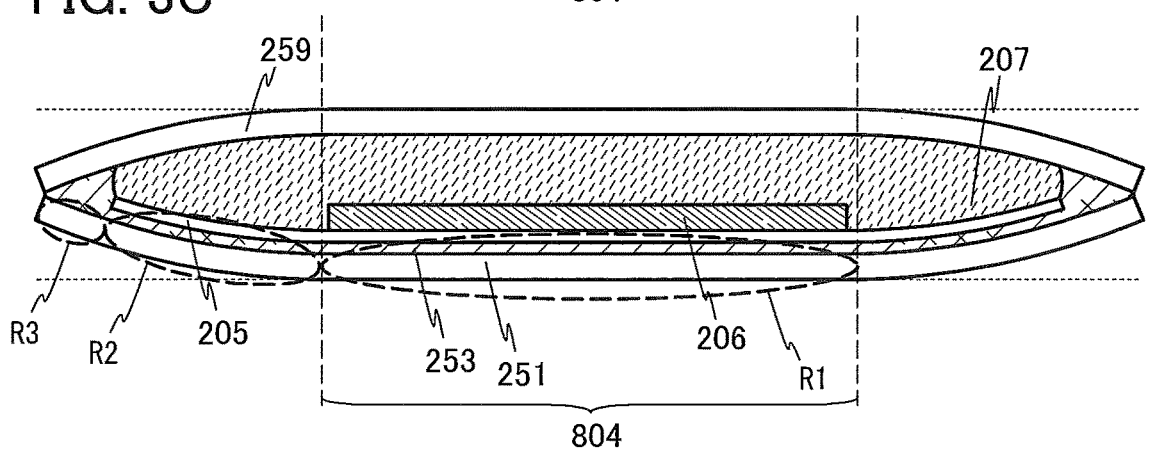

The substrate 251 and the substrate 259 are attached to each other with the bonding layer 207. Note that as shown in FIG. 3C, the substrate 251 and the substrate 259 may be attached to each other with not only the bonding layer 207 but also the bonding layer 253. For example, an end portion of the substrate 259 may be in contact with the bonding layer 253. FIG. 3C includes a first region (R1), a second region (R2), and a third region (R3).

Figure 3D:
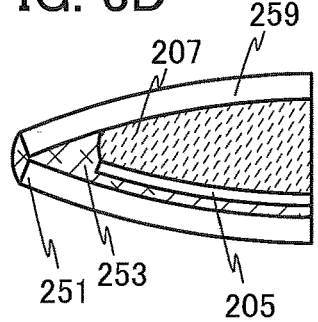

The bonding layer 253 may extend beyond an end portion of at least one of the substrate 251 and the substrate 259. In that case, the bonding layer 253 can cover a side surface of at least one of the substrate 251 and the substrate 259. FIG. 3D illustrates an example in which the bonding layer 253 is in contact with end portions of the substrate 251 and the substrate 259.

Figure 3E:
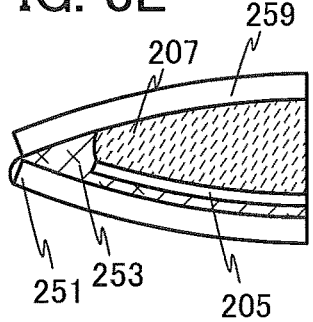
Figure 3F:
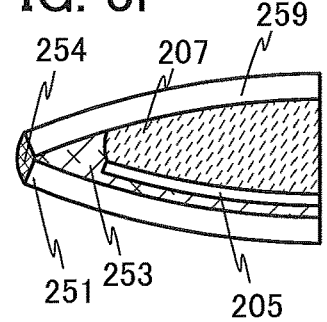

The end portion of the bonding layer 253 extends beyond the end portions of the substrate 251 and the substrate 259. FIG. 3E illustrates an example in which the bonding layer 253 is in contact with an end portion of the substrate 251.

A bonding layer 254 may be used in addition to the bonding layer 207 and the bonding layer 253 to cover a side surface of at least one of the substrate 251 and the substrate 259.

Structure Example a-3

Figure 4A:
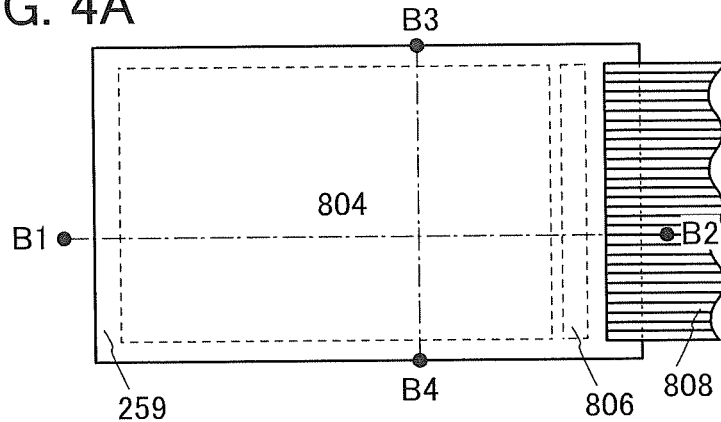
FIGS. 4A to 4D illustrate examples of a light-emitting device.
Figure 4B:
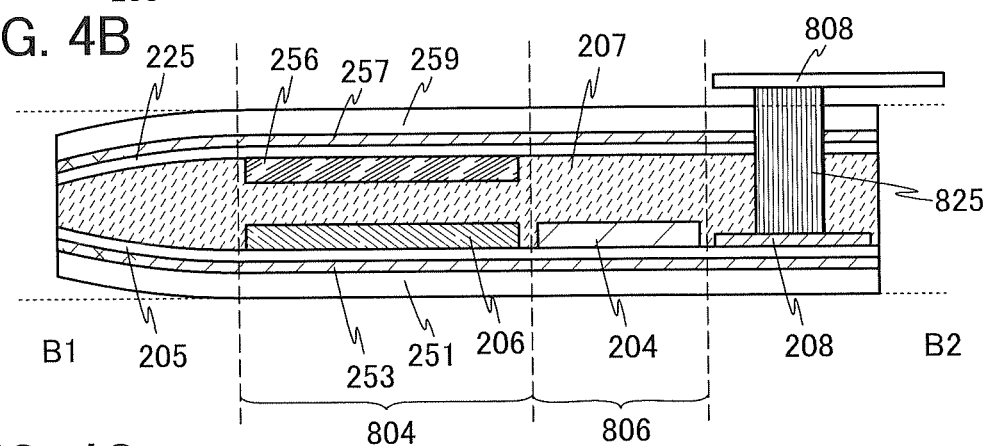
Figure 4C:
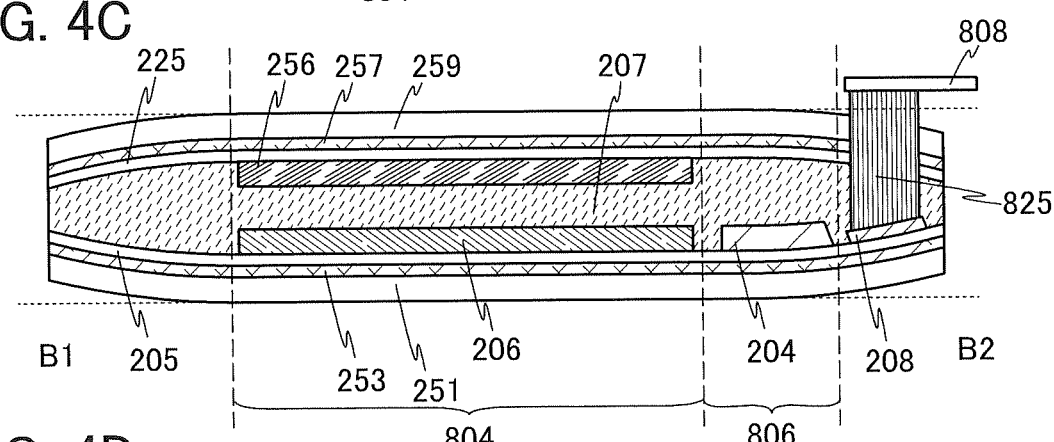
Figure 4D:
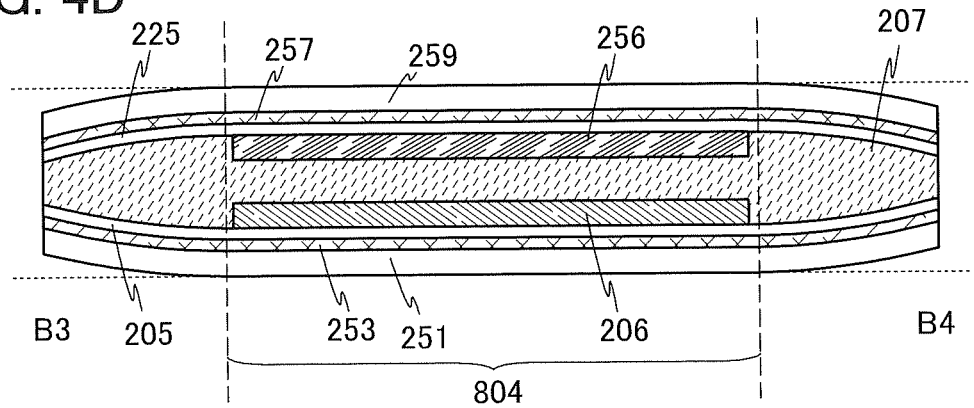

FIG. 4A is a top view of a light-emitting device. FIG. 4B is a cross-sectional view taken along a dashed-dotted line B1-B2 in FIG. 4A. FIG. 4C illustrates a modification example of FIG. 4B. FIG. 4D is a cross-sectional view taken along a dashed-dotted line B3-B4 in FIG. 4A.

The light-emitting device illustrated in FIG. 4A includes the light-emitting portion 804 and the driver circuit portion 806. Portions other than the light-emitting portion 804 in the light-emitting device can be regarded as non-light-emitting portions. In other words, the non-light-emitting portion is provided outside the light-emitting portion 804 to have a frame-like shape. For example, the driver circuit portion 806 is a non-light-emitting portion.

The light-emitting device in FIGS. 4A to 4D includes the substrate 251, the bonding layer 253, the functional layer 204, the insulating layer 205, the functional layer 206, the bonding layer 207, the conductive layer 208, an insulating layer 225, a functional layer 256, a bonding layer 257, and the substrate 259.

The light-emitting portion 804 includes the functional layer 206 and the functional layer 256. The functional layer 206 is closer to the substrate 251 than the bonding layer 207 is, and the functional layer 256 is closer to the substrate 259 than the bonding layer 207 is.

Examples of the functional layer 256 include a coloring layer (e.g., a color filter) and a light-blocking layer (e.g., a black matrix). The functional layer 256 may be a sensor such as a touch sensor.

The substrate 251 and the insulating layer 205 are attached to each other with the bonding layer 253. The substrate 259 and the insulating layer 225 are attached to each other with the bonding layer 257. As the insulating layer 205 and the insulating layer 225, an insulating layer having an excellent gas barrier property, an excellent water-resistant property, an excellent moisture-resistant property, or the like is preferably used.

The conductive layer 208 is electrically connected to the FPC 808 through the connector 825. Unlike in the structure examples a-1 and a-2, the substrate 251 and the substrate 259 have the same size in the structure example a-3. The conductive layer 208 and the connector 825 can be connected to each other through an opening provided in the substrate 259, the bonding layer 257, the insulating layer 225, and the bonding layer 207.

The substrate 251 and the substrate 259 are attached to each other with the bonding layer 207.

FIG. 4B illustrates an example in which on the side of the light-emitting device on which the driver circuit portion 806 is provided, the non-light-emitting portion does not have a region whose thickness is smaller than that of the light-emitting portion; however, as shown in FIG. 4C, the nonlight-emitting portion may have a region whose thickness is smaller than that of the light-emitting portion, on the side of the light-emitting device on which the driver circuit portion 806 is provided. In that case, entry of impurities such as moisture and oxygen into the light-emitting device can be further inhibited.

Example of Manufacturing Method of Structure Example a-2

An example of a manufacturing method of the above structure example a-2 is described with reference to FIGS. 5A to 5E, FIGS. 6A and 6B, and FIGS. 7A and 7B. FIGS. 5A to 5E, FIGS. 6A and 6B, and FIGS. 7A and 7B each illustrate a cross-sectional structure in a step, which is taken along the dashed-dotted line A3-A4 (see FIG. 1A).

Figure 5A:
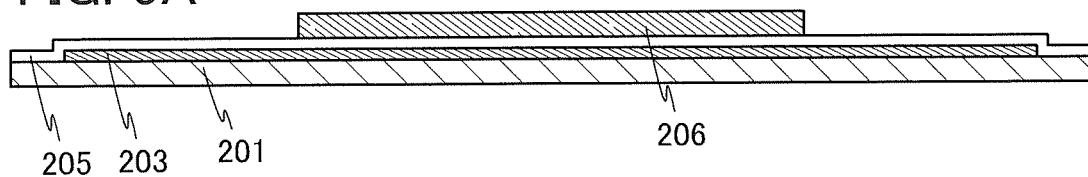
FIGS. 5A to 5E illustrate an example of a method for manufacturing a light-emitting device.

First, a separation layer 203 is formed over the formation substrate 201, the insulating layer 205 is formed over the separation layer 203, and the functional layer 206 is formed over the insulating layer 205 (FIG. 5A). Note that the insulating layer 205 and the functional layer 206 can be collectively referred to as a layer to be separated.

Although an example in which the separation layer is formed to have an island shape is described here, one embodiment of the present invention is not limited to such an example. Furthermore, the insulating layer 205 may be formed to have an island shape. In this step, materials are selected that would cause separation at the interface between the formation substrate 201 and the separation layer 203, the interface between the separation layer 203 and the insulating layer 205, or in the separation layer 203 when the formation substrate 201 and the insulating layer 205 are separated. In this embodiment, an example in which separation occurs at the interface between the insulating layer 205 and the separation layer 203 is described; however, one embodiment of the present invention is not limited to such an example and depends on a material used for the separation layer 203 or the insulating layer 205.

As the formation substrate 201, a substrate having at least heat resistance high enough to withstand process temperature in a manufacturing process is used. As the formation substrate 201, for example, a glass substrate, a quartz substrate, a sapphire substrate, a semiconductor substrate, a ceramic substrate, a metal substrate, a resin substrate, or a plastic substrate can be used.

Note that it is preferable to use a large-sized glass substrate as the formation substrate 201 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation can be used.

In the case where a glass substrate is used as the formation substrate 201, as a base film, an insulating film such as a silicon oxide film, a silicon oxynitride film, a silicon nitride film, or a silicon nitride oxide film is preferably formed between the formation substrate 201 and the separation layer 203, in which case contamination from the glass substrate can be prevented.

The separation layer 203 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer 203 is preferably formed using a high-melting point metal material such as tungsten, titanium, or molybdenum, in which case the degree of freedom of the process for forming the insulating layer 205 and the functional layer 206 can be increased.

The separation layer 203 can be formed by, for example, a sputtering method, a plasma CVD method, a coating method (including a spin coating method, a droplet discharging method, a dispensing method, and the like), a printing method, or the like. The thickness of the separation layer 203 is, for example, greater than or equal to 1 nm and less than or equal to 200 nm, or preferably greater than or equal to 10 nm and less than or equal to 100 nm.

In the case where the separation layer 203 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the separation layer 203 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide (N20) plasma treatment, treatment with a highly oxidizing solution such as ozone water, or the like on the surface of the layer containing tungsten. Plasma treatment or heat treatment may be performed under an atmosphere of oxygen, nitrogen, or nitrous oxide alone, or a mixed gas of any of these gasses and another gas. Surface condition of the separation layer 203 is changed by the plasma treatment or heat treatment, whereby adhesion between the separation layer 203 and the insulating layer 205 can be controlled.

Note that the separation layer is not necessary in the case where separation at the interface between the formation substrate and the layer to be separated is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is improved by laser light irradiation or heat treatment. Then, an insulating layer, a functional layer, and the like are formed over the organic resin. After that, separation at the interface between the formation substrate and the organic resin can be performed by performing laser light irradiation with energy density higher than that of the above laser light irradiation or performing heat treatment at a temperature higher than that of the above heat treatment. Moreover, the interface between the formation substrate and the organic resin may be soaked in a liquid to perform separation.

In the case where the above method is employed, the insulating film, the transistor, and the like are formed over the organic resin having low heat resistance, and thus it is difficult to expose the substrate to high temperatures in the manufacturing process. Here, a manufacturing process at high temperatures is dispensable for a transistor including an oxide semiconductor; therefore, the transistor can be favorably formed over the organic resin.

Note that the organic resin may be used as the substrate of the device. Alternatively, the organic resin may be removed and another substrate may be attached to the exposed surface using an adhesive.

Alternatively, separation at the interface between a metal layer and the organic resin may be performed in the following manner: the metal layer is provided between the formation substrate and the organic resin and current is made to flow in the metal layer so that the metal layer is heated.

The insulating layer 205 preferably has a single-layer structure or a stacked-layer structure including any of a silicon nitride film, a silicon oxynitride film, a silicon oxide film, a silicon nitride oxide film, and the like.

The insulating layer 205 can be formed by a sputtering method, a plasma CVD method, a coating method, a printing method, or the like. For example, the insulating layer 205 is formed at a temperature higher than or equal to 250° C. and lower than or equal to 400° C. by a plasma CVD method, whereby the insulating layer 205 can be a dense film having an excellent moisture-resistant property. Note that the thickness of the insulating layer 205 is preferably greater than or equal to 10 nm and less than or equal to 3000 nm, or further preferably greater than or equal to 200 nm and less than or equal to 1500 nm.

In this embodiment, at least a light-emitting element (organic EL element) is formed as the functional layer 206. A transistor, a capacitor, or the like may also be formed. Alternatively, a display element other than the light-emitting element may be formed. A coloring layer or a light-blocking layer may be formed.

Then, the bonding layer 207 and a partition 209 are formed over the formation substrate 201 or the substrate 259.

The bonding layer 207 and the partition 209 may be formed over either the formation substrate 201 or the substrate 259. Both the bonding layer 207 and the partition 209 may be formed over one of the substrates, or alternatively, the bonding layer 207 may be formed over one substrate and the partition 209 may be formed over the other substrate.

The bonding layer 207 is preferably formed to overlap with the separation layer 203 and the insulating layer 205. In that case, the yield of separation of the formation substrate 201 can be increased. In the case where the bonding layer 207 is formed over the substrate 259, it is acceptable as long as the bonding layer 207 overlaps with the separation layer 203 and the insulating layer 205 when the formation substrate 201 and the substrate 259 overlap with each other in a later step.

Figure 5B:
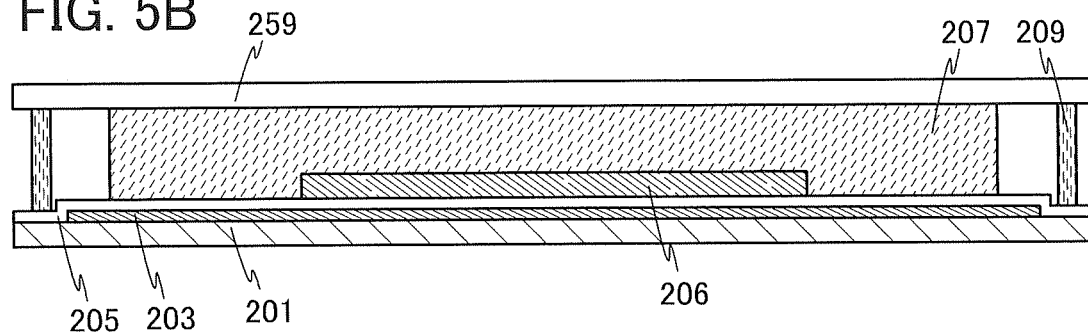

As shown in FIG. 5B, an end portion of the bonding layer 207 is preferably positioned on an inner side of an end portion of the separation layer 203. Alternatively, the end portion of the bonding layer 207 and that of the separation layer 203 may overlap with each other. Accordingly, strong adhesion between the formation substrate 201 and the substrate 259 can be suppressed; thus, a decrease in yield of a subsequent separation process can be suppressed.

The partition 209 is formed to surround the bonding layer 207 and to have a frame-like shape, with a gap left between the partition 209 and the bonding layer 207. In the case where the partition 209 is formed over the substrate other than the substrate over which the bonding layer 207 is formed, it is acceptable as long as the partition 209 surrounds the bonding layer 207 with a gap left therebetween in a later step in which the formation substrate 201 and the substrate 259 overlap with each other.

The thickness of the bonding layer 207 and that of the partition 209 are each greater than or equal to 1 μm and less than or equal to 200 μm, preferably greater than or equal to 1 μm and less than or equal to 100 μm, further preferably greater than or equal to 1 μm and less than or equal to 50 μm, for example.

There is no particular limitation on methods for forming the bonding layer 207 and the partition 209; for example, a droplet discharge method, a printing method (a screen printing method or an offset printing method), a coating method such as a spin coating method or a spray coating method, a dipping method, a dispenser method, or a nano-imprint method can be employed.

The partition 209 may be formed using the same material as the bonding layer 207. The partition 209 is preferably formed using a material having higher viscosity than the bonding layer 207. When the partition 209 is formed using a material with high viscosity, entry of impurities such as moisture from the air can be inhibited.

For the bonding layer 207 and the partition 209, various curable adhesives such as a resin, a reactive curable adhesive, a thermosetting adhesive, an anaerobic adhesive, and a photo-curable adhesive such as an ultraviolet curable adhesive can be used. Examples of these adhesives and resin include an epoxy resin, an acrylic resin, a silicone resin, a phenol resin, a polyimide resin, an imide resin, a poly(vinyl chloride) (PVC) resin, a polyvinyl butyral (PVB) resin, and an ethylene vinyl acetate (EVA) resin. In particular, a material with low moisture permeability, such as an epoxy resin, is preferred.

Furthermore, the resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the light-emitting device.

The above resin may include a leveling agent or a surface-active agent.

When a leveling agent or a surface-active agent is added to the resin, surface tension of the resin can be reduced and the wettability thereof can be increased. High wettability allows uniform application of the resin. Accordingly, inclusion of bubbles at the time of attachment of the pair of substrates can be inhibited, and the probability of a cohesive failure of the bonding layer and interfacial failure between the bonding layer and a layer to be bonded can be reduced. Display defects of the light-emitting device can also be inhibited.

As the leveling agent or the surface-active agent, a material that does not adversely affect the light-emitting element and the like is used. For example, an epoxy resin to which a fluorine-based leveling agent is added at greater than or equal to 0.01 wt % and less than or equal to 0.5 wt % may be used.

In addition, a filler with a high refractive index or a light-scattering member may be mixed into the resin, in which case the efficiency of light extraction from the light-emitting element can be improved. For example, titanium oxide, barium oxide, zeolite, zirconium, or the like can be used.

Next, under a reduced-pressure atmosphere, the formation substrate 201 and the substrate 259 overlap with each other, so that the functional layer 206 is positioned in the space surrounded by the partition 209, the formation substrate 201, and the substrate 259 (FIG. 5B). As a result, the space is in a reduced-pressure state. Since there is a gap between the bonding layer 207 and the partition 209, a hollow portion is formed therebetween.

Figure 5C:
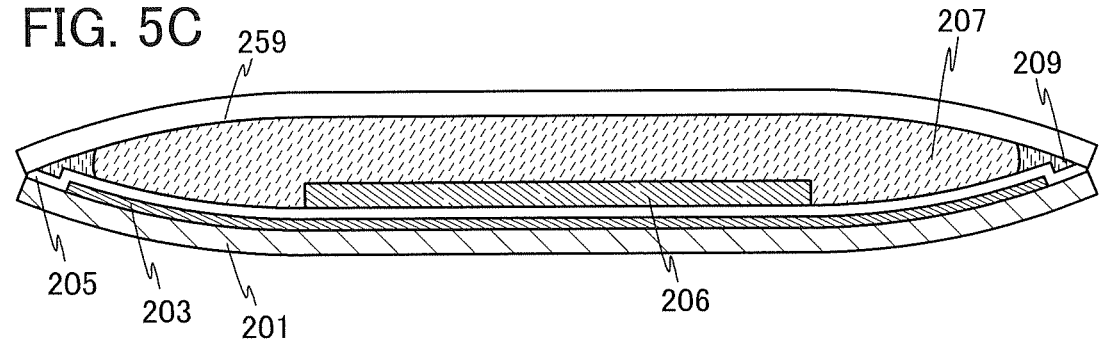

Next, the formation substrate 201 and the substrate 259 are exposed to an air atmosphere. Accordingly, atmospheric pressure is applied to the formation substrate 201 and the substrate 259. Then, the bonding layer 207 spreads toward an end portion of the light-emitting device and fills the hollow portion. As a result, the end portion of the light-emitting device partly has a smaller thickness than the middle portion (FIG. 5C). Note that the bonding layer 207 is preferably formed using a material having lower viscosity than the partition 209 because the bonding layer 207 spreads sufficiently in the above step.

Note that to prevent the distance between the substrates from being too small, the functional layer 206 preferably includes a spacer (e.g., a spacer 823 described in Embodiment 2 (FIG. 26B)).

Then, the bonding layer 207 and the partition 209 are cured. The bonding layer 207 and the partition 209 are cured under an air atmosphere or a pressurized atmosphere.

Curing the partition 209 allows the reduced-pressure state in the light-emitting device to be easily maintained; thus, it is preferable to cure the partition 209 before the bonding layer 207 is cured. Alternatively, the partition 209 and the bonding layer 207 may be cured in the same step.

For example, in the case where a photocurable resin is used for the partition 209 and a thermosetting resin is used for the bonding layer 207, it is preferable that the partition 209 be cured first by light irradiation and then, the bonding layer 207 be cured by heating. In the case where a thermosetting resin is used for both the partition 209 and the bonding layer 207, the partition 209 and the bonding layer 207 are cured at the same time by heating.

Shorter curing time for the partition 209 and the bonding layer 207 reduces the time required for manufacture of the light-emitting device. In the case where the bonding layer 207 is formed using a thermosetting resin, for example, high heating temperature leads to short curing time but also causes many bubbles to be formed in the resin, and the yield of the light-emitting device is reduced in some cases. In view of the above, heating is performed under pressure in one embodiment of the present invention, which can inhibit formation of bubbles even when the heating temperature is high. The resin can be cured using, for example, a pressure defoaming device (e.g., autoclave).

For example, in the case of a resin that takes approximately 12 hours to be cured when heated at 40° C., bubbles are formed therein if heating is performed at 80° C. for 1 hour without pressure application; however, when heating is performed at 80° C. for 1 hour under a pressure of 0.5 MPa, the resin can be cured in a short time while such formation of bubbles is inhibited. By performing heating and pressure application at the same time, bubbles formed at the time of attachment can be dissolved in the resin. Furthermore, bubbles formed before the heating and pressure application can be removed. Note that even when the resin is preserved at room temperature under atmospheric pressure after the heating, bubbles are not formed.

The step of curing a bonding layer by heating with pressure application can be applied to a step other than the step of curing the bonding layer 207.

Then, a separation starting point (or separation trigger) is preferably formed. The separation starting point is formed in a region where the bonding layer 207 and the separation layer 203 overlap with each other.

The separation starting point can be formed through laser light irradiation, etching of the separation layer using a gas, a solution, or the like, division of the substrate, or mechanical removal such as making a cut with a sharp cutting tool such as a knife, a scalpel, or a cutter, for example. Formation of a separation starting point facilitates separation of the separation layer and the layer to be separated.

For example, when the substrate 259 can be divided with a cutting tool or the like, a separation starting point can be formed by making a cut in the substrate 259, the bonding layer 207, and the insulating layer 205.

In the case where laser light irradiation is employed, a region where the bonding layer 207 in a cured state, the insulating layer 205, and the separation layer 203 overlap with one another is preferably irradiated with the laser light. Although laser light irradiation may be performed from either substrate side, it is preferably performed from the formation substrate 201 side in which the separation layer 203 is provided, in order to prevent the functional element or the like from being irradiated with scattered light. Note that a material that transmits the laser light is used for the substrate on the side where laser light irradiation is performed.

The insulating layer 205 is cracked (or broken), whereby the separation starting point can be formed. At this time, not only the insulating layer 205 but also part of the separation layer 203 and the bonding layer 207 may be removed. Laser light irradiation enables part of the films included in the insulating layer 205, the separation layer 203, or the bonding layer 207 to be dissolved, evaporated, or thermally broken.

It is preferable that at a separation process, force of separating the insulating layer 205 and the separation layer 203 be concentrated at the separation starting point; therefore, it is preferable to form the separation starting point not at the center portion of the bonding layer 207 in a cured state but in the vicinity of the end portion. It is particularly preferable to form the separation starting point in the vicinity of the corner portion compared to the vicinity of the side portion among the vicinities of the end portion. In such a case where the separation starting point is formed in a position not overlapping with the bonding layer 207, it is preferable that the position at which the separation starting point is formed be in a short distance from the bonding layer 207, whereby the separation layer 203 and the insulating layer 205 can be separated surely; specifically, it is preferable that the separation starting point be formed in a distance from the end portion of the bonding layer 207 within 1 mm.

There is no particular limitation on a laser used to form a separation starting point. For example, a continuous wave laser or a pulsed oscillation laser can be used. Note that a condition for laser light irradiation such as frequency, power density, energy density, or beam profile is controlled as appropriate in consideration of thicknesses, materials, or the like of the formation substrate 201 and the separation layer 203.

Laser light irradiation is preferably employed, in which case the substrate does not need to be, for example, cut to form the separation starting point and generation of dust can be suppressed. In addition, the time taken to form the separation starting point can be shortened. Moreover, the formation substrate 201 can be reused easily because dust that remains on the surface of the formation substrate 201 can be reduced. Furthermore, laser light irradiation results in low cost and can be easily applied to mass production because it does not cause wear of a sharp cutting tool such as a cutter. Separation can be started by pulling the end portion of any of the substrates and therefore can be easily applied to mass production.

Then, the insulating layer 205 and the formation substrate 201 are separated from each other from the formed separation starting point. At this time, one of the substrates is preferably fixed to a suction stage or the like. For example, the formation substrate 201 may be fixed to the suction stage to separate the insulating layer 205 from the formation substrate 201. Alternatively, the substrate 259 may be fixed to a suction stage to separate the formation substrate 201 from the substrate 259.

For example, the insulating layer 205 and the formation substrate 201 may be separated from the separation starting point by mechanical force (e.g., a separation process with a human hand or a gripper, or a separation process by rotation of a roller).

Alternatively, the formation substrate 201 and the insulating layer 205 may be separated by filling the interface between the separation layer 203 and the insulating layer 205 with a liquid such as water. A portion between the separation layer 203 and the insulating layer 205 absorbs a liquid through capillarity action, so that separation occurs easily. Furthermore, an adverse effect on the functional element included in the insulating layer 205 due to static electricity caused at separation (e.g., a phenomenon in which a semiconductor element is damaged by static electricity) can be suppressed. Note that liquid can be sprayed in the form of mist or steam. As the liquid, pure water, an organic solvent, a neutral, alkaline, or acid aqueous solution, an aqueous solution in which a salt is dissolved, or the like can be used.

Note that after the separation, the bonding layer 207, the partition 209, or the like which does not contribute to attachment between the insulating layer 205 and the substrate 259 and which remains over the substrate 259 may be removed. By such removal, an adverse effect on the functional element in a subsequent step (e.g., entry of impurities) can be preferably suppressed. For example, an unnecessary resin can be removed by wiping or cleaning.

Figure 5D:
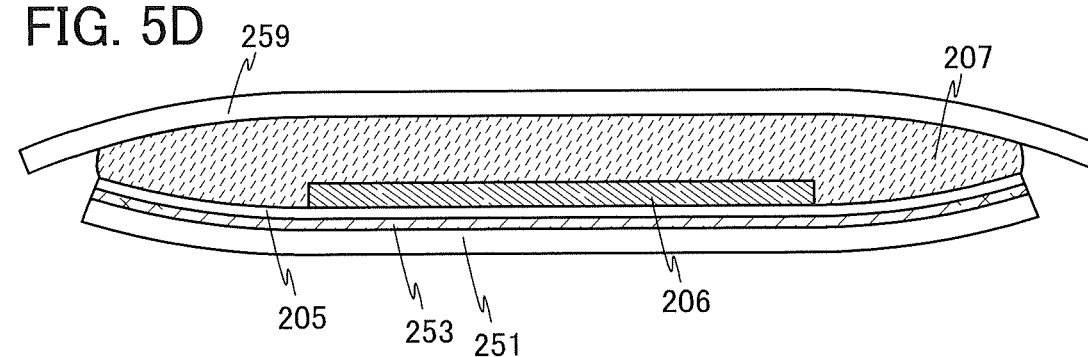
Figure 5E:
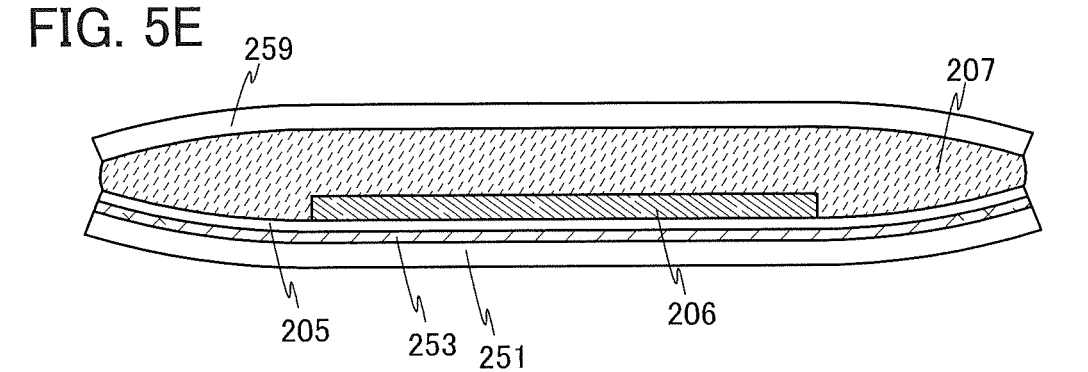

Next, to the insulating layer 205 that is exposed by separation of the formation substrate 201, the substrate 251 is attached with the use of the bonding layer 253 (FIG. 5D). An end portion of the substrate 259 may be cut such that end portions of the substrate 259 and the substrate 251 are substantially aligned with each other (FIG. 5E). Furthermore, an end portion of the light-emitting device may be cut such that end portions of the substrate 251, the bonding layer 253, the insulating layer 205, the bonding layer 207, and the substrate 259 are substantially aligned with each other (see FIG. 3B).

The bonding layer 253 can be formed using a material that can be used for the bonding layer 207 or the partition 209.

Figure 6A:
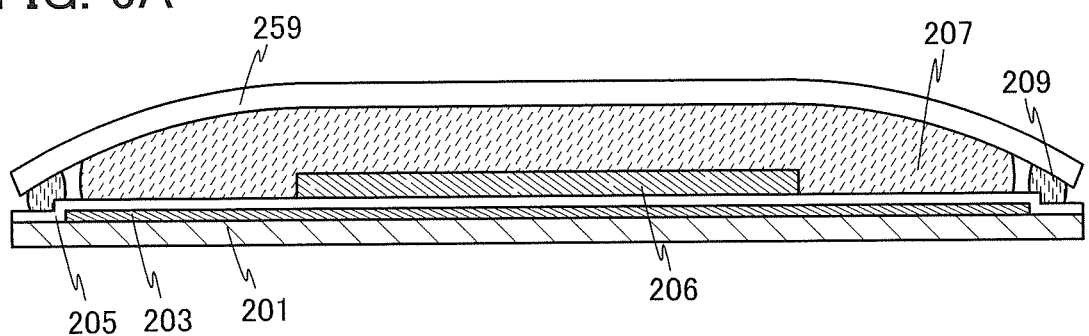
FIGS. 6A and 6B illustrate an example of a method for manufacturing a light-emitting device.
Figure 6B:
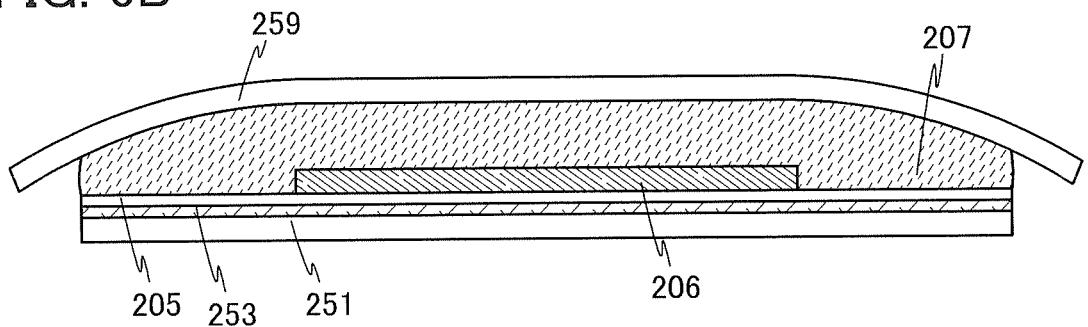
Figure 7A:
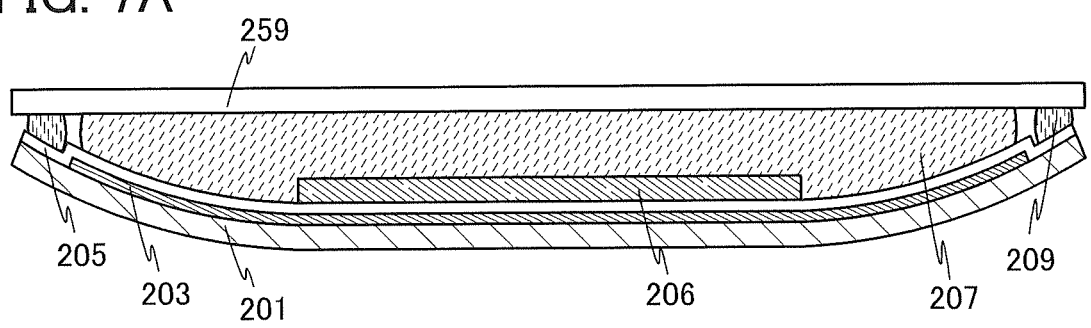
FIGS. 7A and 7B illustrate an example of a method for manufacturing a light-emitting device.
Figure 7B:
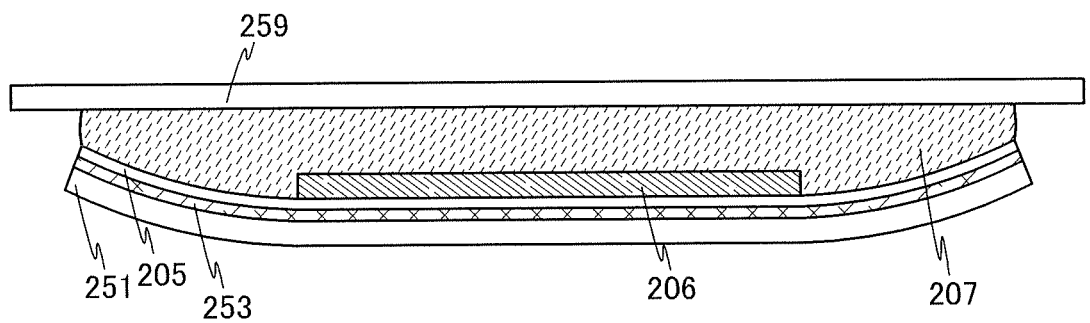

Although FIG. 5C illustrates an example in which both the formation substrate 201 and the substrate 259 are curved, only one substrate is curved in some cases depending on a method for fixing the formation substrate 201 or the substrate 259, the kinds of the materials used for the formation substrate 201 and the substrate 259, or the thickness of the formation substrate 201 or the substrate 259. FIG. 6A illustrates an example in which only the substrate 259 is curved and FIG. 7A illustrates an example in which only the formation substrate 201 is curved. In either case, the end portion of the light-emitting device partly has a smaller thickness than the middle portion. Note that the hollow portion may be left or filled with the bonding layer 207. FIG. 6B and FIG. 7B illustrate the light-emitting devices in FIG. 6A and FIG. 7A from which the formation substrate 201 is separated and to which the substrate 251 is attached. Note that the formation substrate 201 and the substrate 259 can have a thickness of, for example, greater than or equal to 10 μm and less than or equal to 10 mm.

Through the above process, the light-emitting device described in the structure example a-2 can be manufactured.

Example of Manufacturing Method of Structure Example a-3

An example of a manufacturing method of the above structure example a-3 is described with reference to FIGS. 8A to 8D, FIGS. 9A to 9D, and FIGS. 10A and 10B. FIGS. 8A to 8D, FIGS. 9A to 9D, and FIGS. 10A and 10B each illustrate a cross-sectional structure in a step, which is taken along the dashed-dotted line B3-B4 (see FIG. 4A).

Figure 8A:
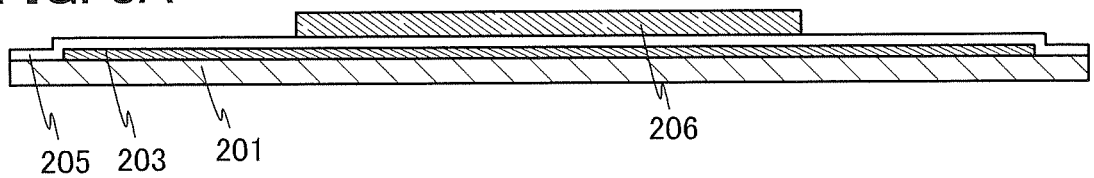
FIGS. 8A to 8D illustrate an example of a method for manufacturing a light-emitting device.
Figure 8B:
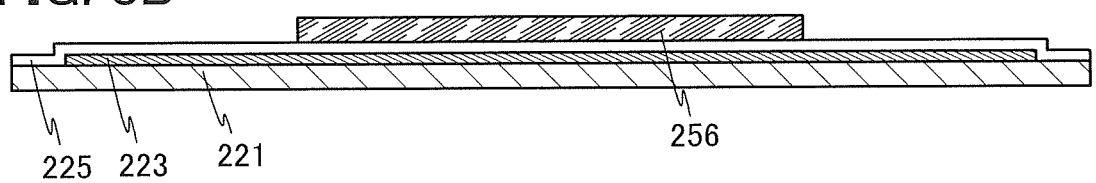

First, the separation layer 203 is formed over the formation substrate 201, the insulating layer 205 is formed over the separation layer 203, and the functional layer 206 is formed over the insulating layer 205 (FIG. 8A). Furthermore, a separation layer 223 is formed over a formation substrate 221, the insulating layer 225 is formed over the separation layer 223, and the functional layer 256 is formed over the insulating layer 225 (FIG. 8B).

Although the separation layer 203 and the separation layer 223 have the same size in this embodiment (FIG. 8C), the two separation layers may have different sizes.

The formation substrate 221 can be formed using a material for the formation substrate 201. The separation layer 223 can be formed using a material for the separation layer 203. The insulating layer 225 can be formed using a material for the insulating layer 205.

In this embodiment, at least a coloring layer is formed as the functional layer 256. A light-blocking layer, a light-emitting element, a display element, a transistor, a touch sensor, a capacitor, or the like may also be formed.

Then, the bonding layer 207 and the partition 209 are formed over the formation substrate 201 or the formation substrate 221. The bonding layer 207 and the partition 209 may be formed over either the formation substrate 201 or the formation substrate 221. Both the bonding layer 207 and the partition 209 may be formed over one of the substrates, or alternatively, the bonding layer 207 may be formed over one substrate and the partition 209 may be formed over the other substrate.

The bonding layer 207 is preferably formed in such a manner that it overlaps with the separation layer 203, the insulating layer 205, the insulating layer 225, and the separation layer 223 in a later step in which the formation substrate 201 and the formation substrate 221 overlap with each other. In that case, the yield of separation of the formation substrate 201 and the formation substrate 221 can be increased.

Figure 8C:
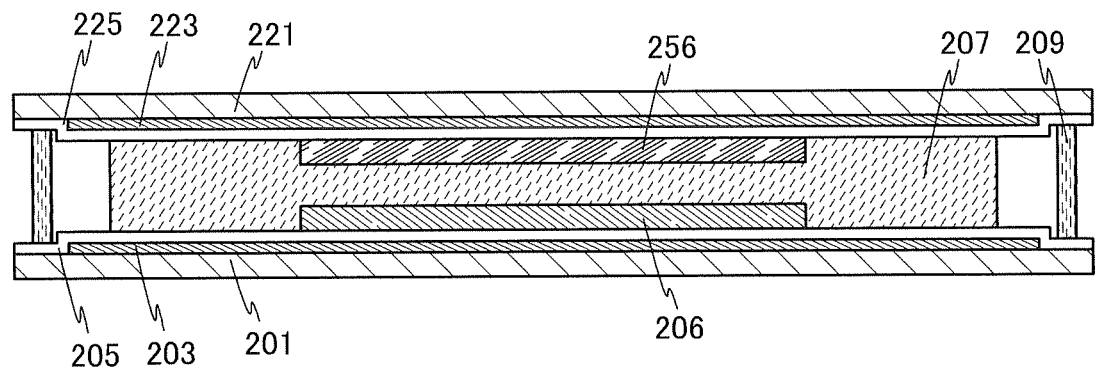

As shown in FIG. 8C, an end portion of the bonding layer 207 is preferably positioned on an inner side of at least an end portion of either the separation layer 203 or the separation layer 223 (the separation layer which is desirably separated first). Accordingly, strong adhesion between the formation substrate 201 and the formation substrate 221 can be suppressed; thus, a decrease in yield of a subsequent separation process can be suppressed.

The partition 209 is formed to surround the bonding layer 207 and to have a frame-like shape, with a gap left between the partition 209 and the bonding layer 207. In the case where the partition 209 is formed over the substrate other than the substrate over which the bonding layer 207 is formed, it is acceptable as long as the partition 209 surrounds the bonding layer 207 with a gap left therebetween in a later step in which the formation substrate 201 and the formation substrate 221 overlap with each other.

Next, under a reduced-pressure atmosphere, the formation substrate 201 and the formation substrate 221 overlap with each other, so that the functional layer 206 and the functional layer 256 are positioned in the space surrounded by the partition 209, the formation substrate 201, and the formation substrate 221 (FIG. 8C). As a result, the space is in a reduced-pressure state. Since there is a gap between the bonding layer 207 and the partition 209, a hollow portion is formed therebetween.

Figure 8D:
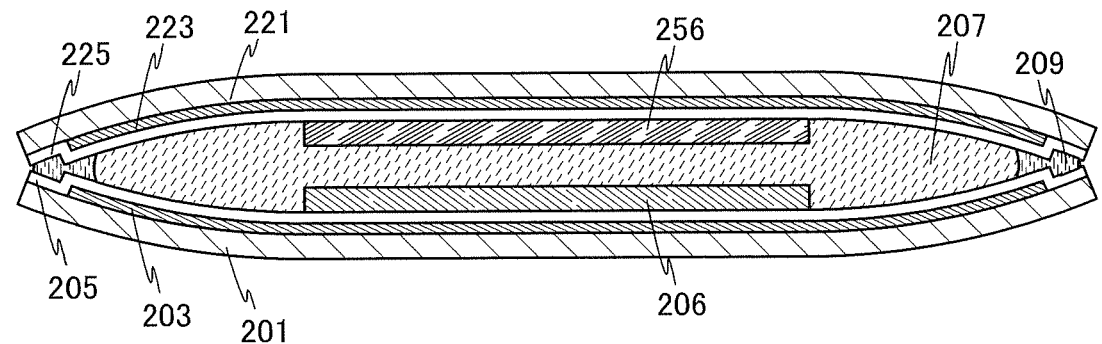

Next, the formation substrate 201 and the formation substrate 221 are exposed to an air atmosphere. Accordingly, atmospheric pressure is applied to the formation substrate 201 and the formation substrate 221. Then, the bonding layer 207 spreads toward an end portion of the light-emitting device and fills the hollow portion. As a result, the end portion of the light-emitting device partly has a smaller thickness than the middle portion (FIG. 8D).

Then, the bonding layer 207 and the partition 209 are cured. The bonding layer 207 and the partition 209 are cured under an air atmosphere or a pressurized atmosphere.

Curing the partition 209 allows the reduced-pressure state in the light-emitting device to be easily maintained; thus, it is preferable to cure the partition 209 before the bonding layer 207 is cured. Alternatively, the partition 209 and the bonding layer 207 may be cured in the same step.

For example, in the case where a photocurable resin is used for the partition 209 and a thermosetting resin is used for the bonding layer 207, it is preferable that the partition 209 be cured first by light irradiation and then, the bonding layer 207 be cured by heating. In the case where a thermosetting resin is used for both the partition 209 and the bonding layer 207, the partition 209 and the bonding layer 207 are cured at the same time by heating.

After that, a separation starting point is formed.

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate on the side where the element is formed may be separated first or the other substrate may be separated first. Here, an example in which the formation substrate 201 is separated first is described. In this case, the separation starting point is formed in a region where the bonding layer 207 and the separation layer 203 overlap with each other.

Figure 9A:
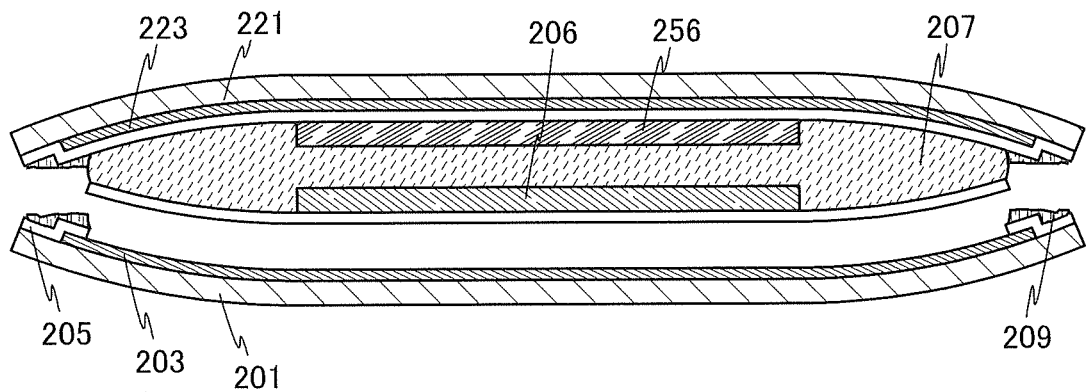
FIGS. 9A to 9D illustrate an example of a method for manufacturing a light-emitting device.

Then, the insulating layer 205 and the formation substrate 201 are separated from each other from the formed separation starting point (FIG. 9A).

Note that the bonding layer 207 and the partition 209 that extend beyond the separation starting point remain on at least one of the formation substrate 201 and the formation substrate 221. Although FIG. 9A illustrates an example in which the partition 209 remains on both substrates, one embodiment of the present invention is not limited to this example.

Figure 9B:
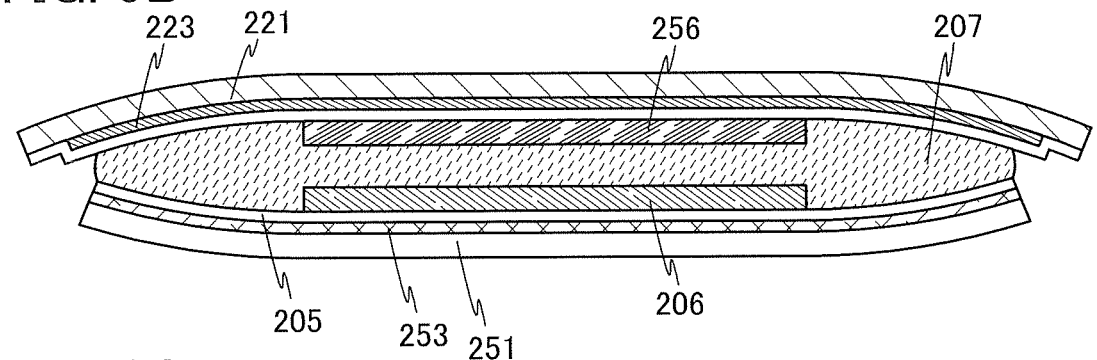

Next, to the insulating layer 205 that is exposed by separation of the formation substrate 201, the substrate 251 is attached with the use of the bonding layer 253 (FIG. 9B).

Figure 9C:
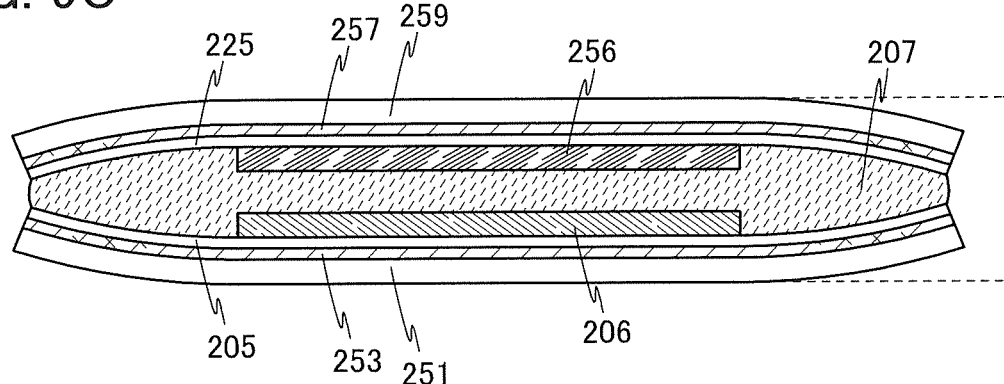

Next, a separation starting point is formed in a region where the bonding layer 207 and the separation layer 223 overlap with each other. Then, the insulating layer 225 and the formation substrate 221 are separated from each other from the formed separation starting point. Next, to the insulating layer 225 that is exposed by separation of the formation substrate 221, the substrate 259 is attached with the use of the bonding layer 257 (FIG. 9C).

Figure 9D:
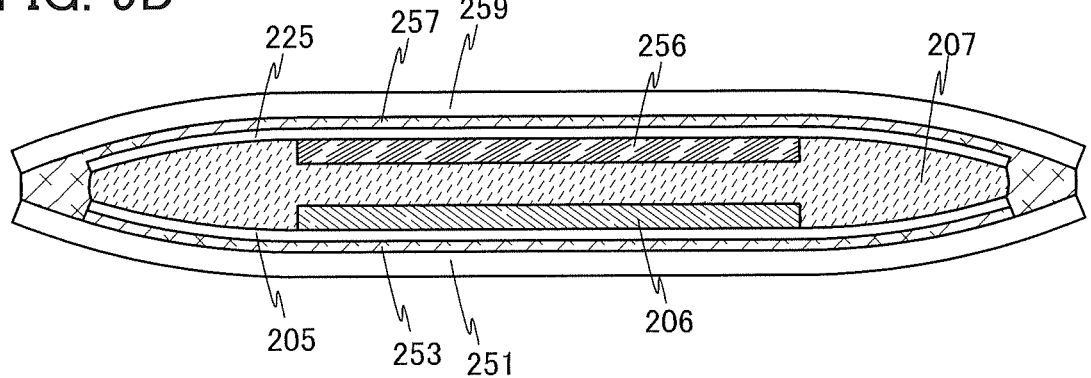

The substrate 251 and the substrate 259 may be attached to each other with not only the bonding layer 207 but also the bonding layer 253. For example, an end portion of the substrate 251 may be in contact with the bonding layer 257 as illustrated in FIG. 9D.

Figure 10A:
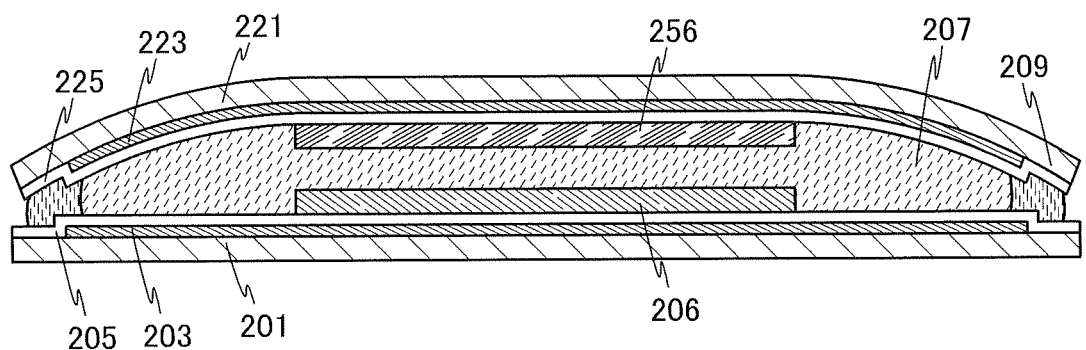
FIGS. 10A and 10B illustrate an example of a method for manufacturing a light-emitting device.
Figure 10B:
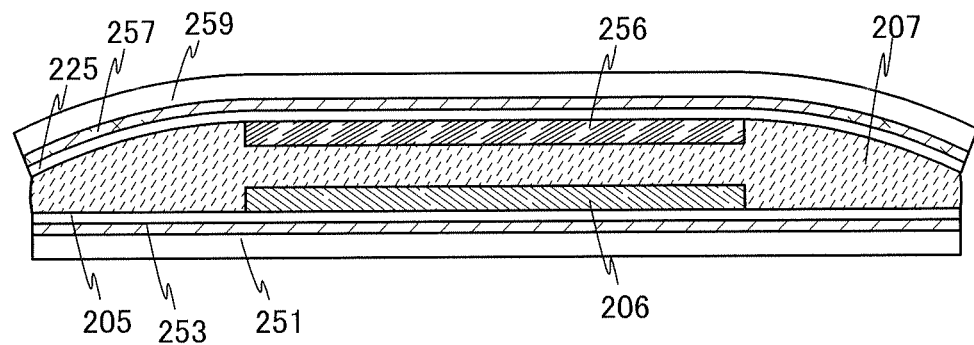

Although FIG. 8D illustrates an example in which both the formation substrate 201 and the formation substrate 221 are curved, only one substrate is curved in some cases depending on a method for fixing the formation substrate 201 or the formation substrate 221, the kinds of the materials used for the formation substrate 201 and the formation substrate 221, or the thickness of the formation substrate 201 or the formation substrate 221. FIG. 10A illustrates an example in which only the formation substrate 221 is curved. In this case, the end portion of the light-emitting device partly has a smaller thickness than the middle portion. FIG. 10B illustrates the light-emitting device in FIG. 10A from which the formation substrate 201 and the formation substrate 221 are separated, in which the substrate 251 and the insulating layer 205 are attached to each other, and in which the substrate 259 and the insulating layer 225 are attached to each other. The light-emitting device in which only the formation substrate 201 is curved is also one embodiment of the present invention.

In the above-described example of a manufacturing method of the structure example a-3, the procedure can be adopted in which the pair of formation substrates each provided with the layer to be separated are attached to each other, separation is performed, and then the substrates of the light-emitting device are attached. Therefore, the formation substrates having low flexibility can be attached to each other when the layers to be separated are attached to each other, whereby alignment accuracy at the time of attachment can be improved as compared to the case where flexible substrates are attached to each other.

Through the above process, the light-emitting device described in the structure example a-3 can be manufactured.

Structure Example b-1

Figure 11A:
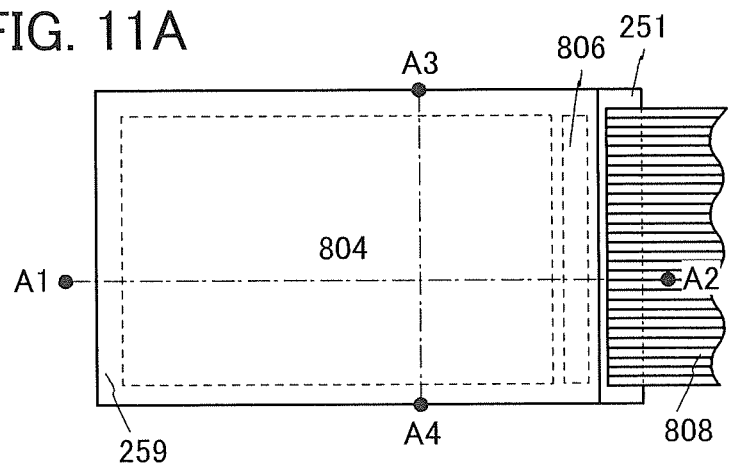
FIGS. 11A to 11C illustrate an example of a light-emitting device.
Figure 11B:
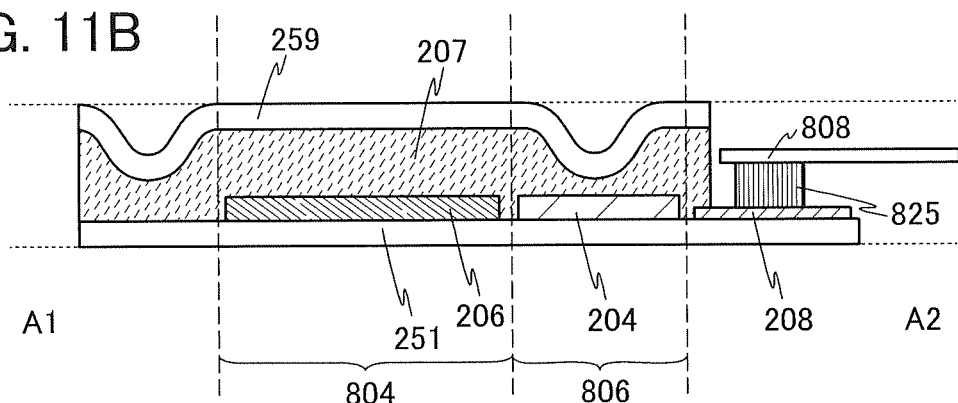
Figure 11C:
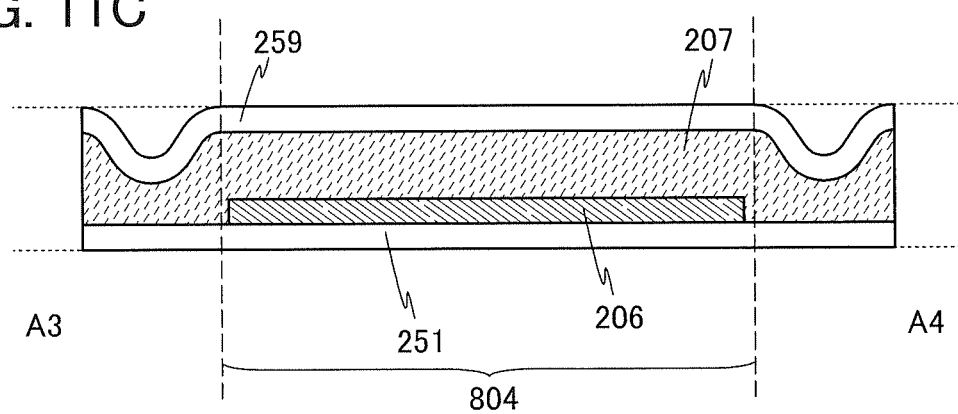

FIG. 11B is a cross-sectional view taken along a dashed-dotted line A1-A2 in FIG. 11A. FIG. 11C is a cross-sectional view taken along a dashed-dotted line A3-A4 in FIG. 11A.

The light-emitting device illustrated in FIG. 11A includes the light-emitting portion 804 and the driver circuit portion 806. Portions other than the light-emitting portion 804 in the light-emitting device can be regarded as non-light-emitting portions. In other words, the non-light-emitting portion is provided outside the light-emitting portion 804 to have a frame-like shape. For example, the driver circuit portion 806 is a non-light-emitting portion.

The light-emitting device in FIGS. 11A to 11C includes the substrate 251, the functional layer 204, the functional layer 206, the bonding layer 207, the conductive layer 208, and the substrate 259.

In the light-emitting portion 804, the functional layer 206 is provided over the substrate 251.

The functional layer 206 includes a light-emitting element and may also include a transistor, a capacitor, or the like.

In the driver circuit portion 806, the functional layer 204 is provided over the substrate 251.

The functional layer 204 includes a transistor and may also include a capacitor, a resistor, a switch element, or the like.

The conductive layer 208 is electrically connected to an external input terminal through which a signal or a potential from the outside is transmitted to the driver circuit portion 806. In FIG. 11B, the conductive layer 208 is electrically connected to the FPC 808 through the connector 825.

The substrate 251 and the substrate 259 are attached to each other with the bonding layer 207.

As shown in FIGS. 11B and 11C, the thickness of the light-emitting device is uniform (or substantially uniform) in the light-emitting portion 804. Meanwhile, the non-light-emitting portion has a region whose thickness is smaller than that of the light-emitting portion 804. In other words, a gap between the substrate 251 and the substrate 259 in part of the non-light-emitting portion is smaller than that in the light-emitting portion 804. Part of the non-light-emitting portion of the light-emitting device has a smaller thickness than the light-emitting portion 804 as described above, whereby entry of impurities such as moisture and oxygen into the light-emitting device can be inhibited.

Formation of a thin region in the non-light-emitting portion can be verified by observation of interference fringes generated in the non-light-emitting portion, for example. In the non-light-emitting portion, a region including interference fringes may be formed to have a width of greater than or equal to 0.1 mm, greater than or equal to 0.5 mm, or greater than or equal to 1 mm, and less than or equal to 10 mm, less than or equal to 5 mm, or less than or equal to 2 mm. When interference fringes are generated in the light-emitting portion 804, display quality deteriorates in some cases. It is thus preferable that in the light-emitting portion 804, interference fringes not be formed and the thickness of the light-emitting device be uniform (or substantially uniform).

FIGS. 11B and 11C illustrate an example in which a thin region is formed on four sides of the light-emitting device (an example in which a thin region is formed to have a frame-like shape in the non-light-emitting portion). FIGS. 11B and 11C illustrate an example in which the substrate 259, which is not provided with the functional layer 206, has a depression (a recessed, depressed portion). One embodiment of the present invention is not limited to the structure illustrated in FIGS. 11B and 11C.

On at least one side of the light-emitting device, the non-light-emitting portion has a region whose thickness is smaller than that of the light-emitting portion. One or both of the pair of substrates has a depression.

FIGS. 12A to 12D are examples of a cross-sectional view taken along the dashed-dotted line A1-A2 in FIG. 11A.

Figure 12A:
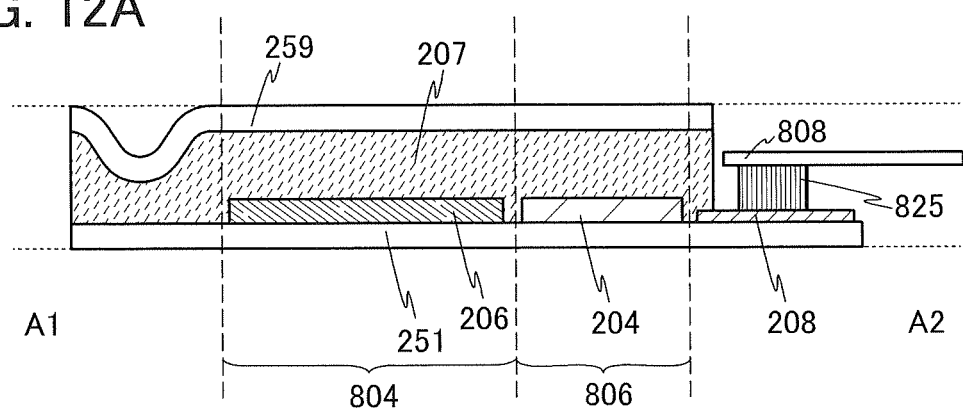
FIGS. 12A to 12D illustrate examples of a light-emitting device.

FIG. 12A illustrates an example in which the non-light-emitting portion in a portion where the driver circuit portion 806 and the conductive layer 208 are provided does not have a region whose thickness is smaller than that of the light-emitting portion. The shortest distance from the side of the light-emitting portion 804 that is adjacent to the driver circuit portion 806 to an end portion of the light-emitting device is longer than the shortest distance from the other sides of the light-emitting portion 804 to other end portions of the light-emitting device; therefore, on the side of the light-emitting device on which the driver circuit portion 806 is provided, impurities are unlikely to reach the light-emitting element or the like. In that case, the non-light-emitting portion does not necessarily have a portion whose thickness is smaller than that of the light-emitting portion. In the above manner, the element included in the driver circuit portion 806 can be prevented from deteriorating because of bending. Moreover, the conductive layer 208 and the FPC 808 can be electrically connected to each other reliably. The elements included in the driver circuit portion 806 can be prevented from being subjected to pressure at the time of formation of the depression, and thus damage to the elements can be inhibited.

Note that as illustrated in FIG. 11B, a depression may be formed in the driver circuit portion 806. For example, the substrate may have a depression in a portion that overlaps with a scan line driver circuit or a signal line driver circuit. The substrate may have a depression in a portion that overlaps with a contact portion between an electrode (an anode or a cathode) of the light-emitting element and a wiring. A thin region may also be formed in a portion of the light-emitting portion as long as providing the thin region in the portion does not adversely affect display quality; for example, a thin region may be formed to overlap with a dummy pixel or an end portion of a color filter.

Figure 12B:
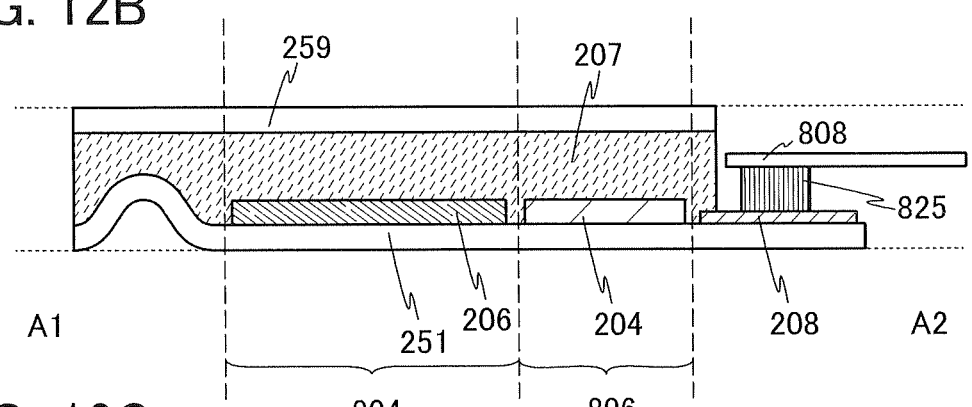
Figure 12C:
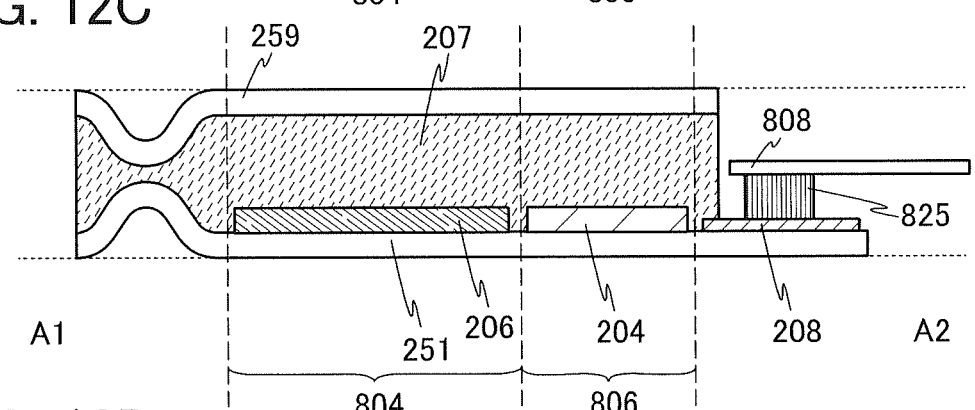
Figure 12D:
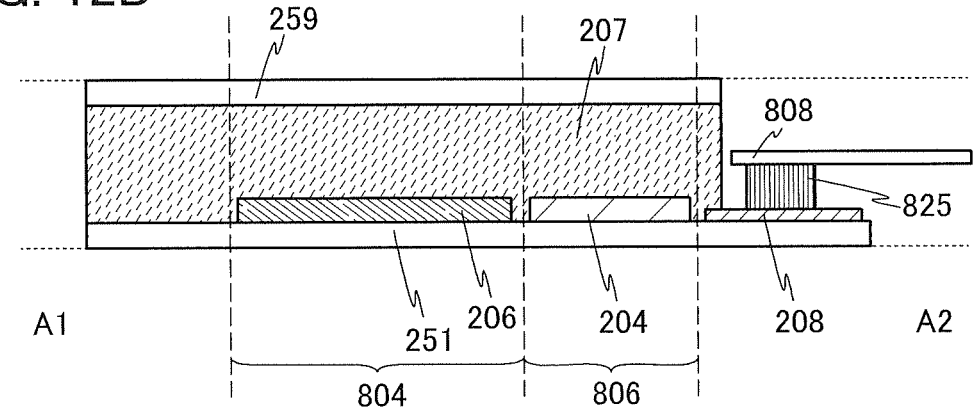

FIG. 12B illustrates an example in which the substrate 251 provided with the functional layer 206 has a depression. As illustrated in FIG. 12C, the pair of substrates (the substrate 251 and substrate 259) may each have a depression. In the case where the non-light-emitting portion has a region thinner than the light-emitting portion in a portion not overlapping with the dashed-dotted line A1-A2 in FIG. 11A, the thickness of the light-emitting portion and that of the non-light-emitting portion may be the same (or substantially the same) in a portion overlapping with the dashed-dotted line A1-A2 in FIG. 11A, as illustrated in FIG. 12D.

FIGS. 13A to 13D are examples of a cross-sectional view taken along the dashed-dotted line A3-A4 in FIG. 11A.

Figure 13A:
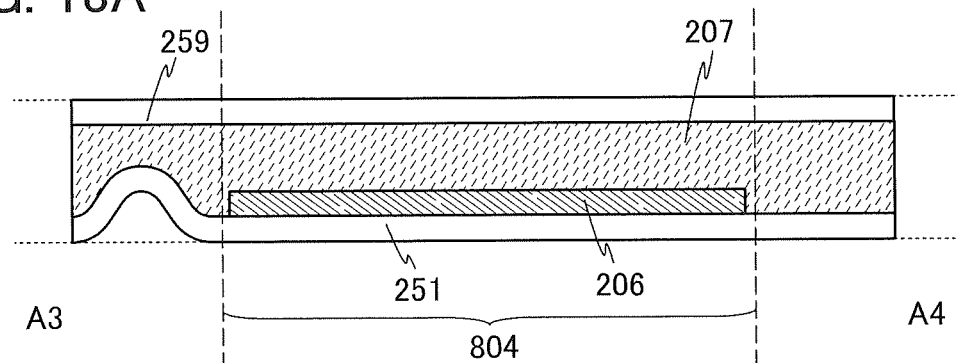
FIGS. 13A to 13D illustrate examples of a light-emitting device.
Figure 13B:
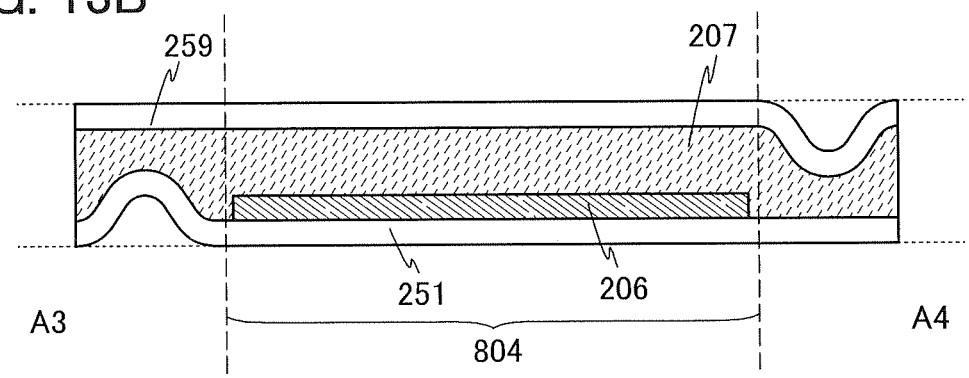
Figure 13C:
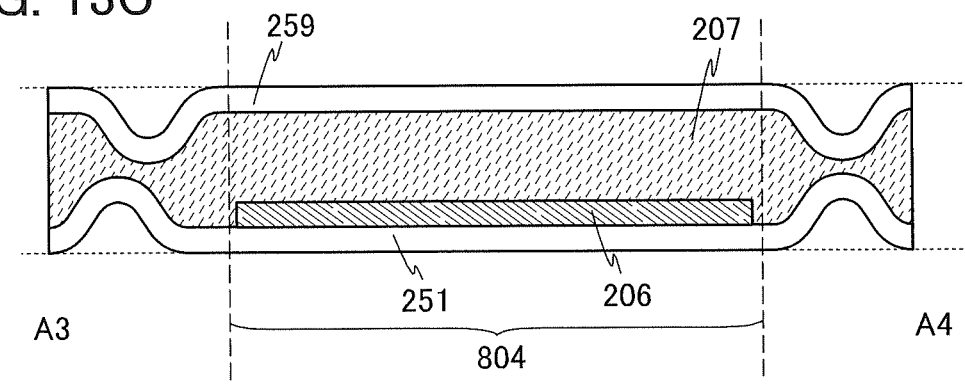

FIG. 13A illustrates an example in which the substrate 251 provided with the functional layer 206 has a depression. As illustrated in FIG. 13B, the pair of substrates (the substrate 251 and substrate 259) may each have a depression. Here, the position of the depression may be different between the substrate 251 and substrate 259. In that case, the non-light-emitting portion has a plurality of regions thinner than the light-emitting portion. As in the non-light-emitting portion on the right side in FIG. 13C, the depression of the substrate 251 and that of the substrate 259 may be formed in the same position. In that case, part of the non-light-emitting portion has a thickness much smaller than that of the light-emitting portion.

Figure 13D:
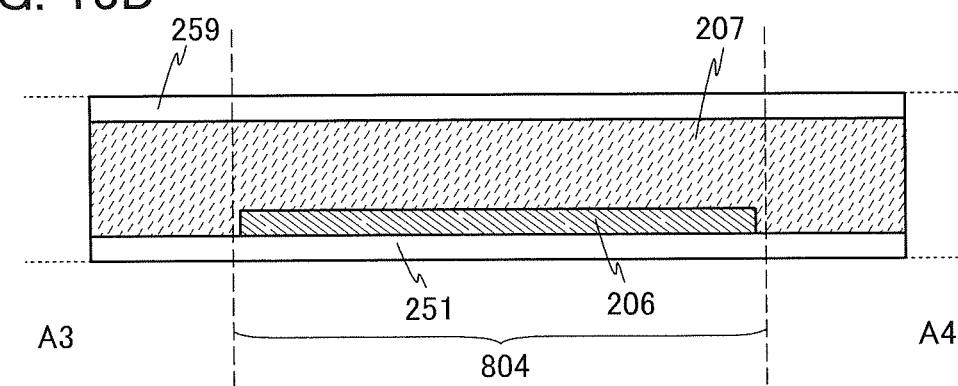

The smaller the minimum thickness of the light-emitting device is, the more difficult it is for impurities to reach the functional element and the more a reduction in the reliability of the light-emitting device can be inhibited, which is preferable. As in the non-light-emitting portion on the left side in FIG. 13C, the depression of the substrate 251 and that of the substrate 259 may be formed in different positions. In the case where the non-light-emitting portion has a region thinner than the light-emitting portion in a portion not overlapping with the dashed-dotted line A3-A4 in FIG. 11A, the thickness of the light-emitting portion and that of the non-light-emitting portion may be the same (or substantially the same) in a portion overlapping with the dashed-dotted line A3-A4 in FIG. 11A, as illustrated in FIG. 13D.

The cross-sectional views in FIGS. 12A to 12D taken along the dashed-dotted line A1-A2 and those in FIGS. 13A to 13D taken along the dashed-dotted line A3-A4 can be combined as appropriate. For example, as in a combination of FIG. 12C and FIG. 13C, which are the cross-sectional view taken along the dashed-dotted line A1-A2 in FIG. 11A and that taken along the dashed-dotted line A3-A4, the non-light-emitting portion may have a region whose thickness is smaller than that of the light-emitting portion, on three of the four sides of the light-emitting device. Alternatively, as in a combination of FIG. 12B and FIG. 13A, the non-light-emitting portion may have a region whose thickness is smaller than that of the light-emitting portion, on two of the four sides of the light-emitting device. Further alternatively, as in a combination of FIG. 12A and FIG. 13D, the non-light-emitting portion may have a region whose thickness is smaller than that of the light-emitting portion, on one of the four sides of the light-emitting device.

Although the functional layer 206 is formed directly over the substrate 251 in the structure example b-1, one embodiment of the present invention is not limited to this structure. As described in the following structure examples b-2 and b-3, the functional layer 206 that has been formed over a formation substrate may be transferred to the substrate 251.

Structure Example b-2

Figure 14A:
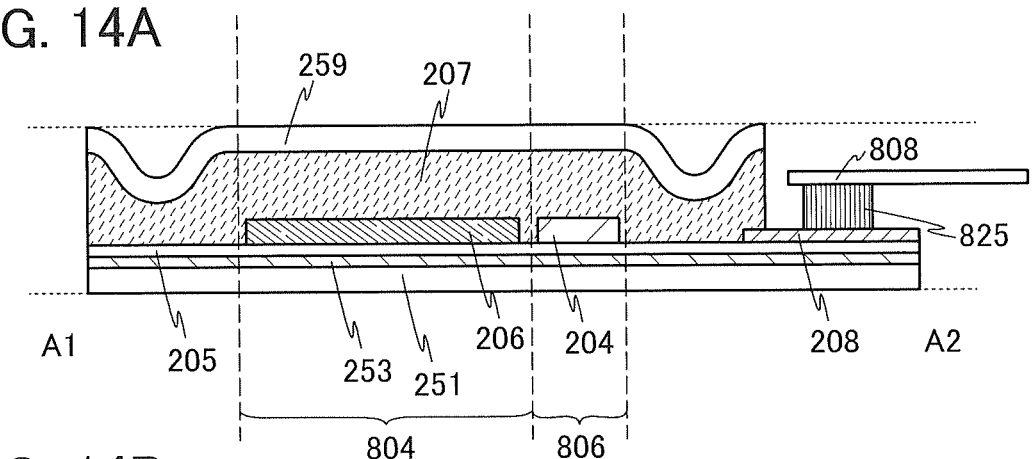
FIGS. 14A and 14B illustrate an example of a light-emitting device.
Figure 14B:
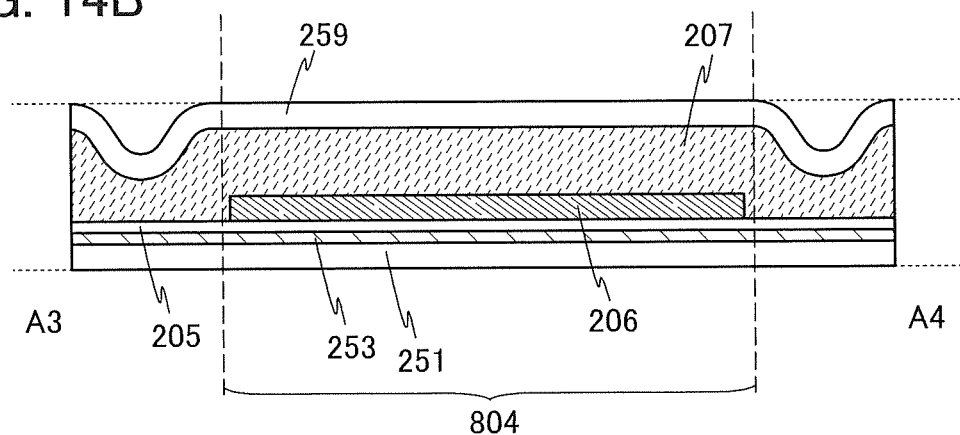

FIG. 14A is a cross-sectional view taken along the dashed-dotted line A1-A2 in FIG. 11A. FIG. 14B is a cross-sectional view taken along the dashed-dotted line A3-A4 in FIG. 11A.

The light-emitting device in FIGS. 14A and 14B includes the substrate 251, the bonding layer 253, the functional layer 204, the insulating layer 205, the functional layer 206, the bonding layer 207, the conductive layer 208, and the substrate 259.

In the light-emitting portion 804, the functional layer 206 is provided over the insulating layer 205. The substrate 251 and the insulating layer 205 are attached to each other with the bonding layer 253.

As the insulating layer 205, an insulating layer having an excellent gas barrier property, an excellent water-resistant property, an excellent moisture-resistant property, or the like is preferably used.

In the driver circuit portion 806, the functional layer 204 is provided over the insulating layer 205.

The conductive layer 208 is electrically connected to the FPC 808 through the connector 825.

The substrate 251 and the substrate 259 are attached to each other with the bonding layer 207.

FIGS. 15A to 15D are examples of a cross-sectional view taken along the dashed-dotted line A3-A4 in FIG. 11A.

Figure 15A:
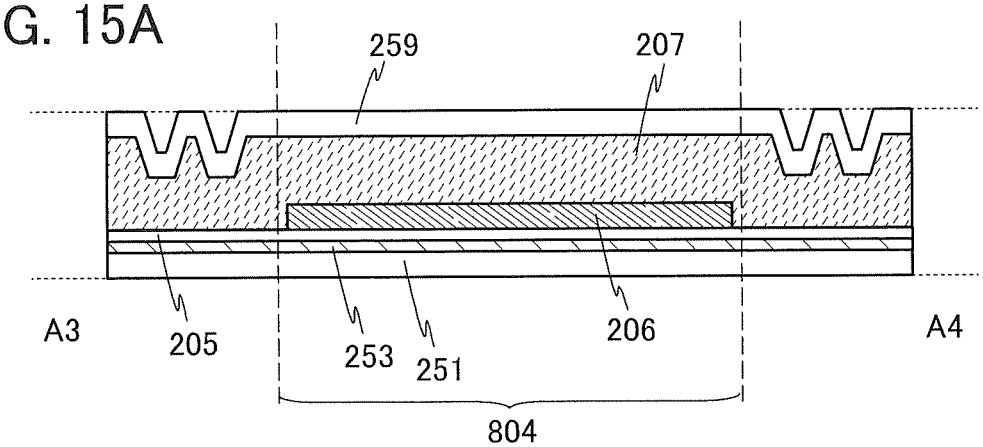
FIGS. 15A to 15D illustrate examples of a light-emitting device.
Figure 15B:
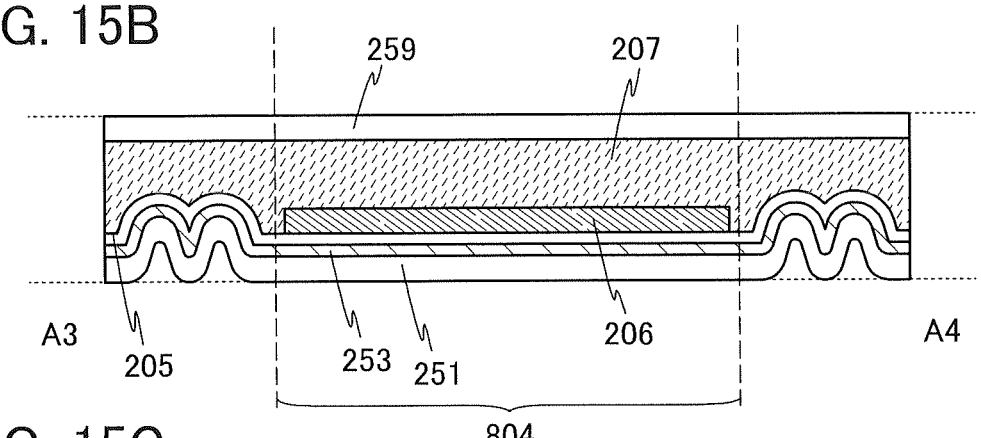
Figure 15C:
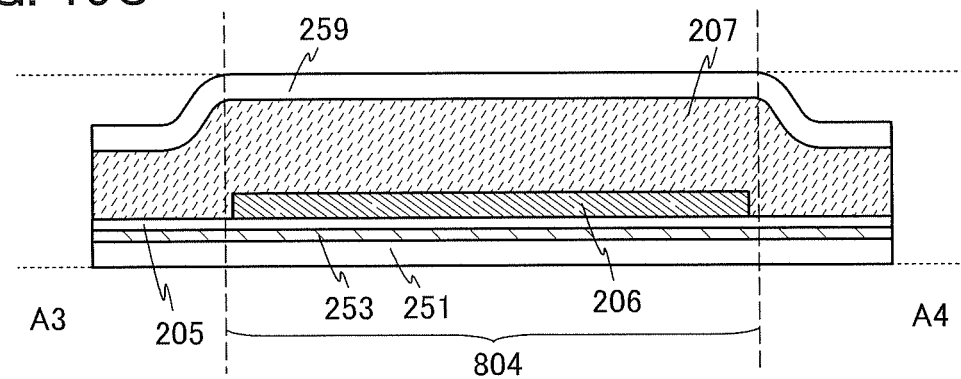
Figure 15D:
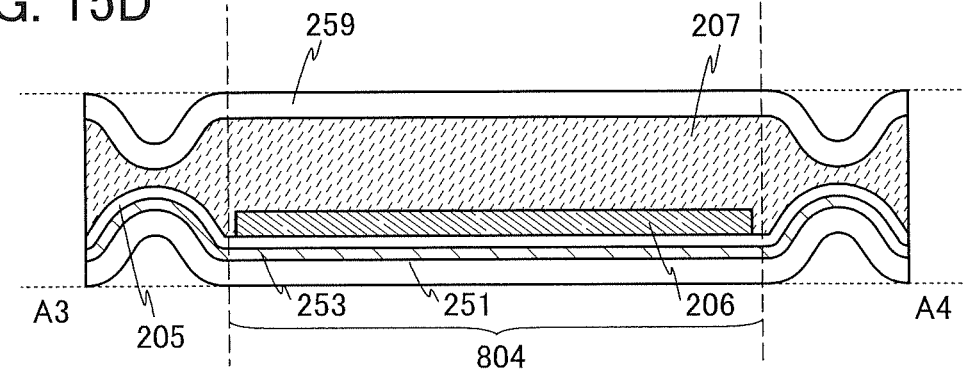

The number of depressions formed in a substrate on any one side of the light-emitting device is not limited and may be one or more. For example, FIGS. 15A and 15B show examples in which a plurality of depressions are formed in a substrate on each of two sides of the light-emitting device. As illustrated in FIG. 15A, the depression does not necessarily have a round shape but may have an angular shape. In one embodiment of the present invention, the substrate does not necessarily have a depression. For example, as illustrated in FIG. 15C, the light-emitting device may have the thinnest region at the end portion; in other words, the substrate may have a projection (a protruding portion). As illustrated in FIG. 15D, the pair of substrates (the substrate 251 and substrate 259) may each have a depression.

Structure Example b-3

Figure 16A:
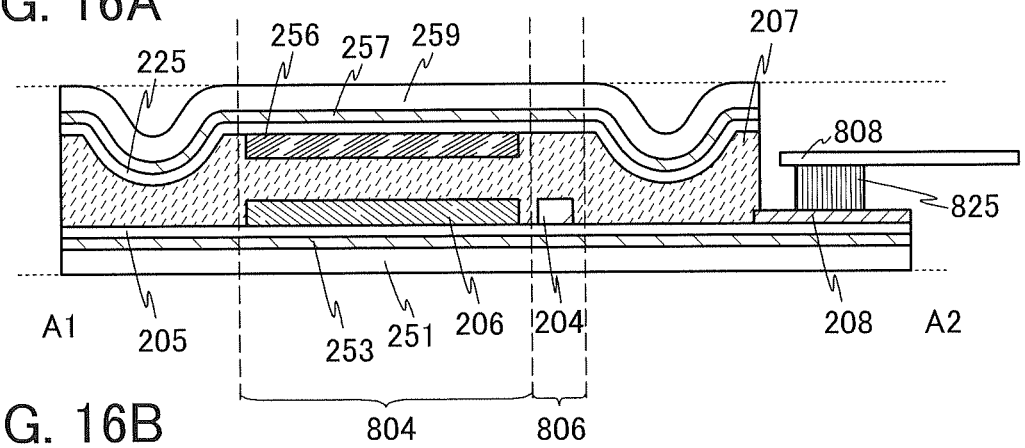
FIGS. 16A to 16D illustrate examples of a light-emitting device.
Figure 16B:
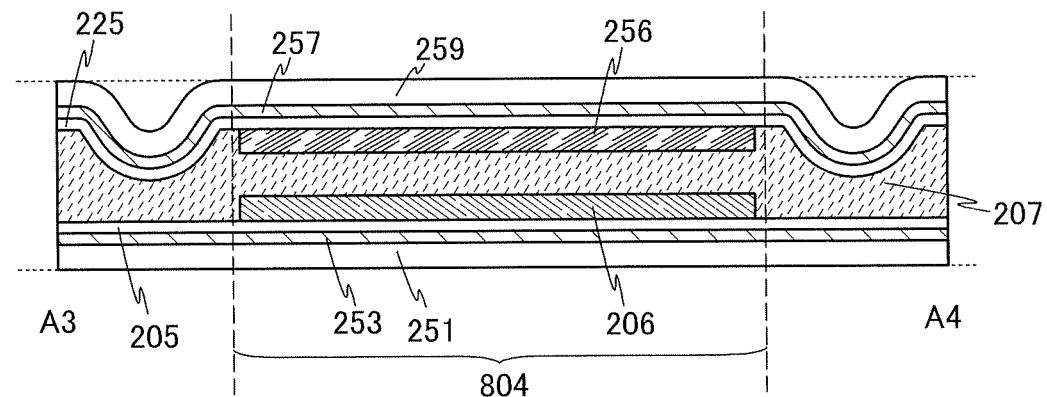

FIG. 16A is a cross-sectional view taken along the dashed-dotted line A1-A2 in FIG. 11A. FIG. 16B is a cross-sectional view taken along the dashed-dotted line A3-A4 in FIG. 11A.

The light-emitting device in FIGS. 16A and 16B includes the substrate 251, the bonding layer 253, the functional layer 204, the insulating layer 205, the functional layer 206, the bonding layer 207, the conductive layer 208, the insulating layer 225, the functional layer 256, the bonding layer 257, and the substrate 259.

It is preferable that a region thinner than the light-emitting portion not overlap with the driver circuit portion 806 in the non-light-emitting portion on the side of the light-emitting device on which the driver circuit portion 806 is provided, as illustrated in FIG. 16A. For example, a region thinner than the light-emitting portion is preferably provided on an outer side of the driver circuit portion 806.

Figure 16C:
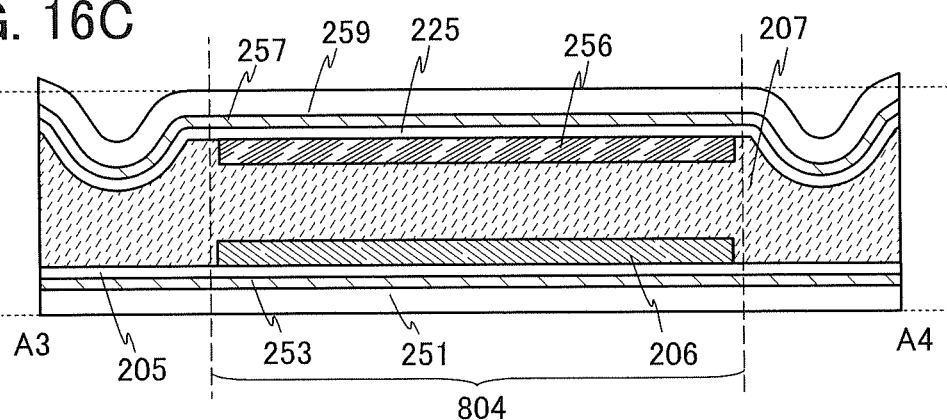
Figure 16D:
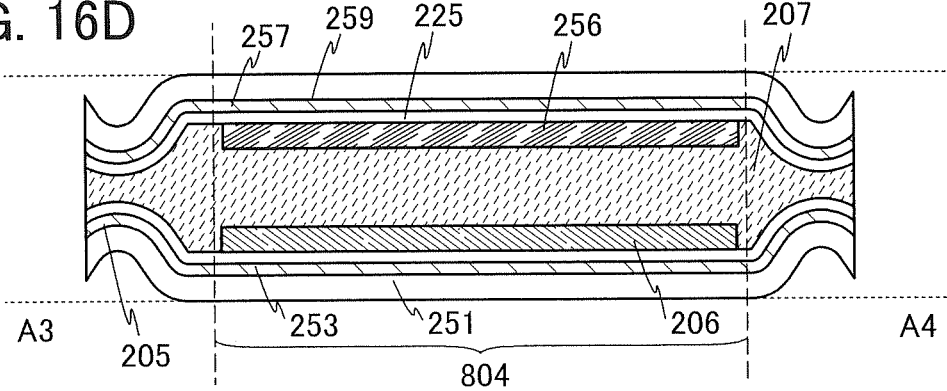

In the example illustrated in FIG. 16B, the thickness of the light-emitting portion 804 and that of an end portion of the light-emitting device are the same (or substantially the same); however, one embodiment of the present invention is not limited to the example. The end portion of the light-emitting device may be thicker than the light-emitting portion 804 as illustrated in FIG. 16C. That is, the light-emitting device may have the thickest region at an end portion. The end portion of the light-emitting device may be thinner than the light-emitting portion 804 as illustrated in FIG. 16D. At this time, a portion thinner than the end portion of the light-emitting device may be provided in the non-light-emitting portion of the light-emitting device, or the end portion of the light-emitting device may be the thinnest region in the light-emitting device.

Figure 17A:
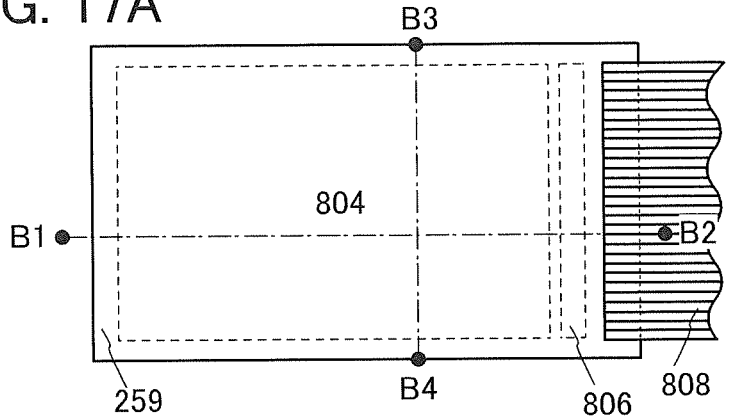
FIGS. 17A to 17C illustrate an example of a light-emitting device.
Figure 17B:
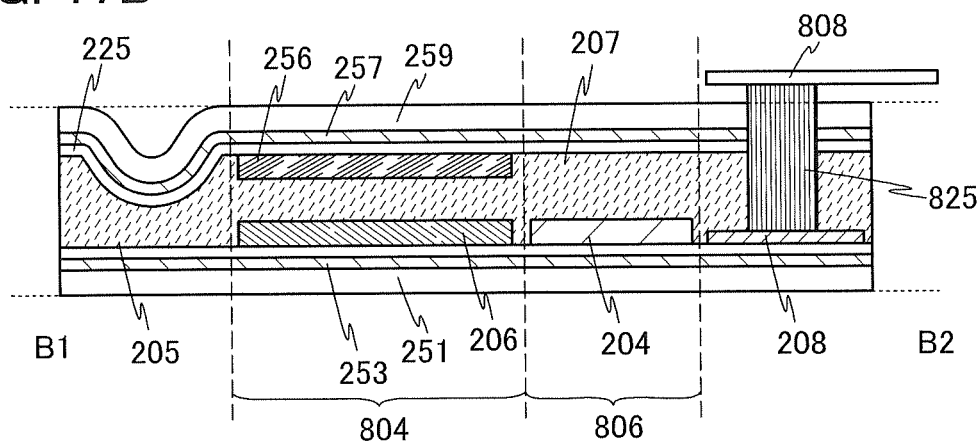
Figure 17C:
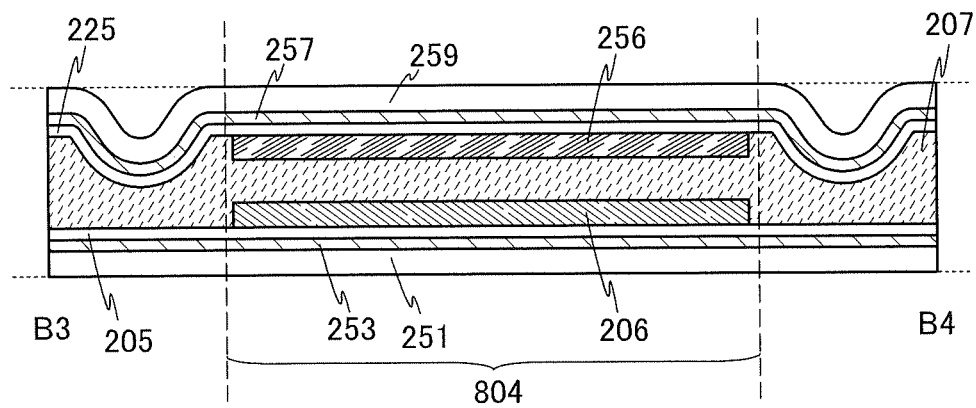

FIG. 17A is a top view of a light-emitting device. FIG. 17B is a cross-sectional view taken along a dashed-dotted line B1-B2 in FIG. 17A. FIG. 17C is a cross-sectional view taken along a dashed-dotted line B3-B4 in FIG. 17A.

The light-emitting device illustrated in FIG. 17A includes the light-emitting portion 804 and the driver circuit portion 806. Portions other than the light-emitting portion 804 in the light-emitting device can be regarded as non-light-emitting portions. In other words, the non-light-emitting portion is provided outside the light-emitting portion 804 to have a frame-like shape. For example, the driver circuit portion 806 is a non-light-emitting portion.

The light-emitting device in FIGS. 17A to 17C includes the substrate 251, the bonding layer 253, the functional layer 204, the insulating layer 205, the functional layer 206, the bonding layer 207, the conductive layer 208, the insulating layer 225, the functional layer 256, the bonding layer 257, and the substrate 259.

The light-emitting portion 804 includes the functional layer 206 and the functional layer 256. The functional layer 206 is closer to the substrate 251 than the bonding layer 207 is, and the functional layer 256 is closer to the substrate 259 than the bonding layer 207 is.

Examples of the functional layer 256 include a coloring layer and a light-blocking layer. The functional layer 256 may be a sensor such as a touch sensor.

The substrate 251 and the insulating layer 205 are attached to each other with the bonding layer 253. The substrate 259 and the insulating layer 225 are attached to each other with the bonding layer 257. As the insulating layer 205 and the insulating layer 225, an insulating layer having an excellent gas barrier property, an excellent water-resistant property, an excellent moisture-resistant property, or the like is preferably used.

The conductive layer 208 is electrically connected to the FPC 808 through the connector 825. Unlike in the structure illustrated in FIG. 16A, the substrate 251 and the substrate 259 have the same size in the example illustrated in FIGS. 17A and 17B. The conductive layer 208 and the connector 825 can be connected to each other through an opening provided in the substrate 259, the bonding layer 257, the insulating layer 225, and the bonding layer 207.

The substrate 251 and the substrate 259 are attached to each other with the bonding layer 207.

Figure 18A:
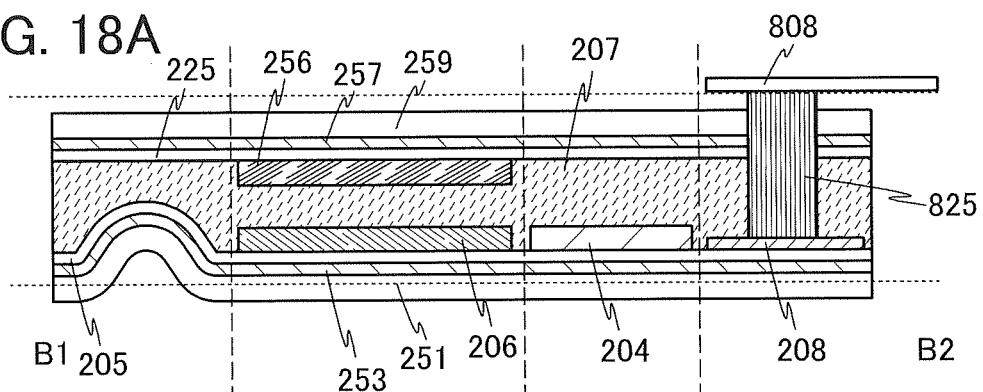
FIGS. 18A to 18D illustrate examples of a light-emitting device.
Figure 18B:
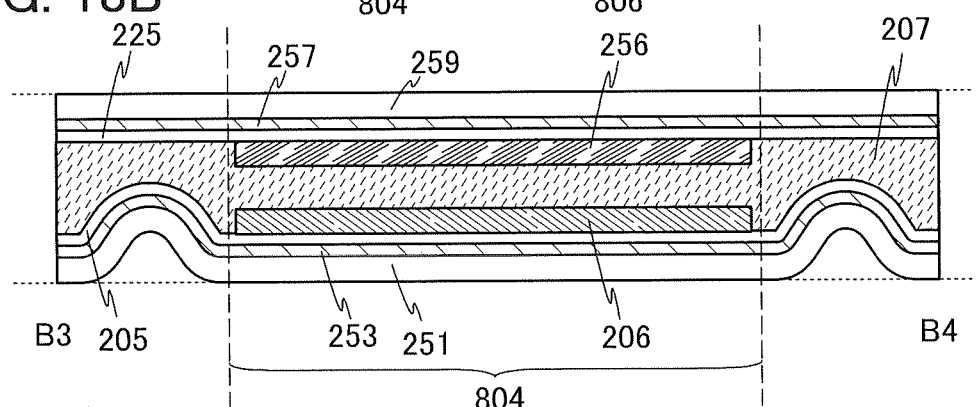
Figure 18C:
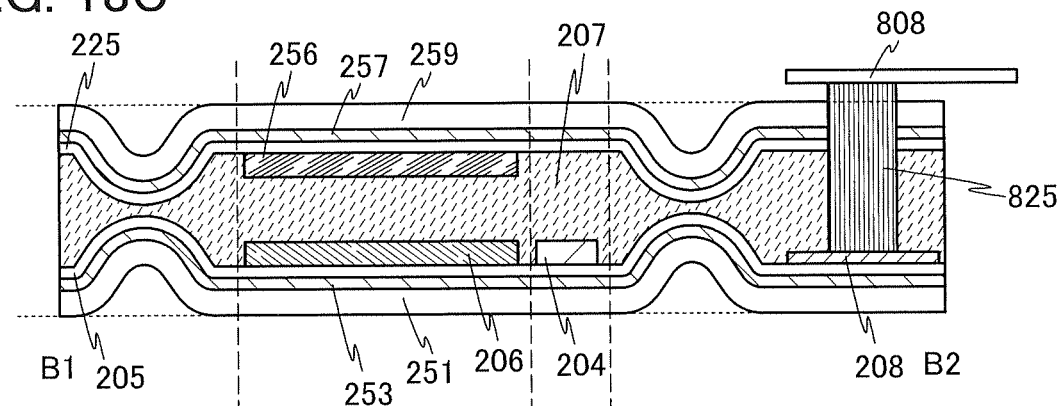
Figure 18D:
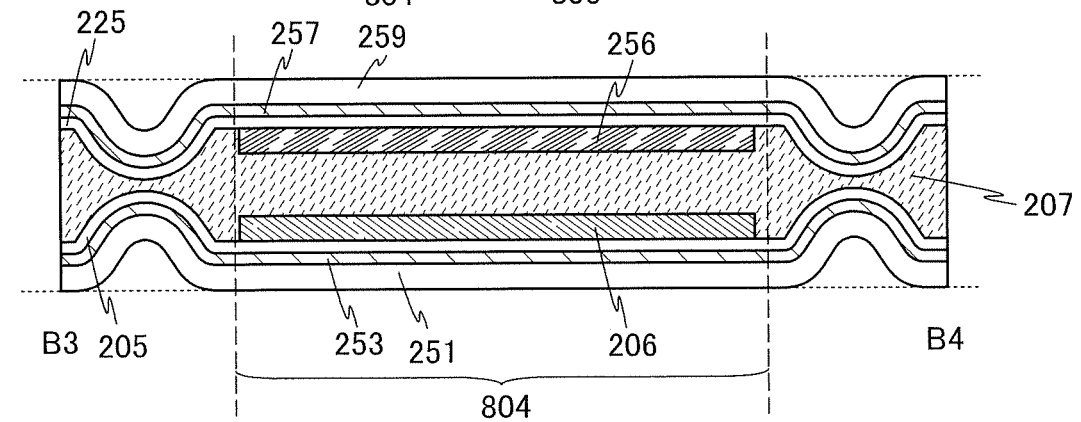

In the example illustrated in FIGS. 17A and 17B, the substrate 259 has a depression; however, the substrate 251, which is a supporting substrate for the conductive layer 208 connected to the FPC 808, may have a depression as illustrated in FIGS. 18A and 18B. As illustrated in FIGS. 18C and 18D, the pair of substrates (the substrate 251 and substrate 259) may each have a depression.

FIG. 17B and FIG. 18A each illustrate an example in which on the side of the light-emitting device on which the driver circuit portion 806 is provided, the non-light-emitting portion does not have a region whose thickness is smaller than that of the light-emitting portion; however, as shown in FIG. 18C, the non-light-emitting portion may have a region whose thickness is smaller than that of the light-emitting portion, on the side of the light-emitting device on which the driver circuit portion 806 is provided. In that case, entry of impurities such as moisture and oxygen into the light-emitting device can be further inhibited.

Example of Manufacturing Method of Structure Example b-1

Figure 19A:
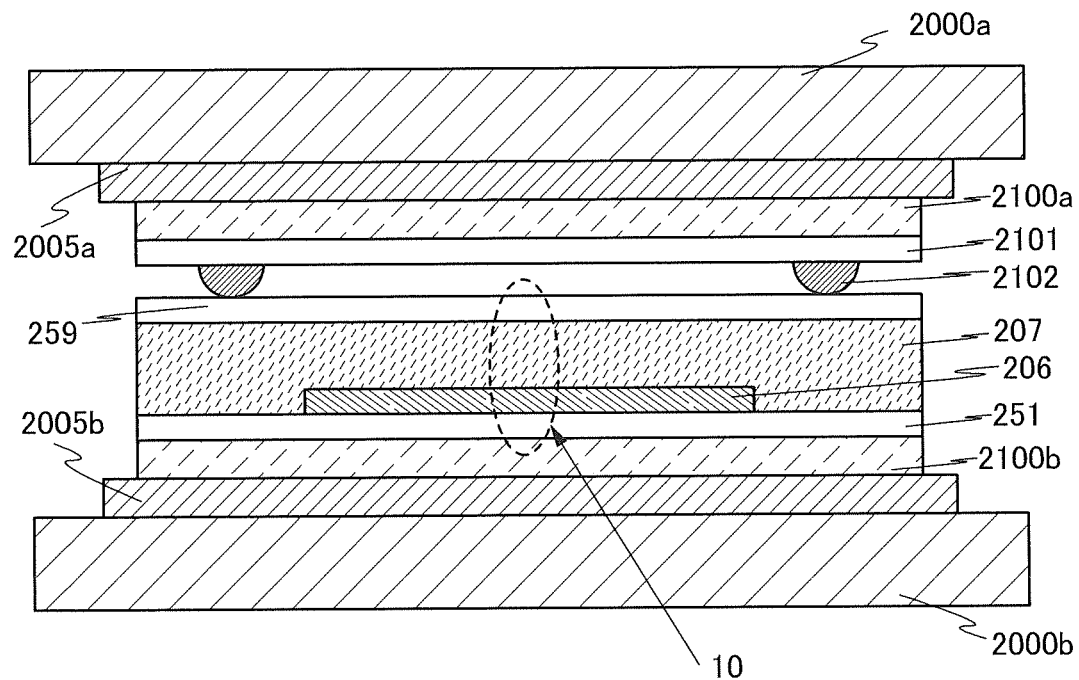
FIGS. 19A to 19D illustrate examples of a method for manufacturing a light-emitting device.

An example of a manufacturing method of the above structure example b-1 is described with reference to FIGS. 19A to 19D. First, the functional layer 206 is formed over the substrate 251. Then, the bonding layer 207 is formed over the substrate 251 or the substrate 259. Next, under a reduced-pressure atmosphere, the substrate 251 and the substrate 259 overlap with each other, so that the functional layer 206 is surrounded by the bonding layer 207, the substrate 251, and the substrate 259. A light-emitting device 10 at this stage is placed in an apparatus capable of pressure application as illustrated in FIG. 19A. For example, a press, a hot press, or the like can be used.

FIG. 19A illustrates an example of using a hot press that includes an upper plate 2000a and a lower plate 2000b. The hot press has a heat source and heats one or both of the upper plate 2000a and the lower plate 2000b. A substrate 2100b is provided over the lower plate 2000b with a cushioning material 2005b positioned therebetween. The light-emitting device 10 is placed over the substrate 2100b. Over the light-emitting device 10, a substrate 2101 having a projection 2102 is provided. The projection 2102 is in contact with the substrate 259. The projection 2102 overlaps with a non-light-emitting portion of the light-emitting device 10. Between the substrate 2101 and the upper plate 2000a, a cushioning material 2005a and a substrate 2100a are provided.

The projection 2102 can be formed over the substrate 2101 with the use of an organic material such as a resin or an inorganic material such as a metal. There is no limitation on a method for forming the projection 2102, and a sputtering method, a CVD method, a coating method, a printing method, a droplet discharge method, or a dispensing method may be used, for example. Alternatively, a mold having a projection may be used. The mold can be formed using the material that can be used for the substrate. For example, the mold can be formed using a resin, glass, a metal, or an alloy.

The projection 2102 can be formed by curing an adhesive provided over the substrate 2101.

Figure 19B:
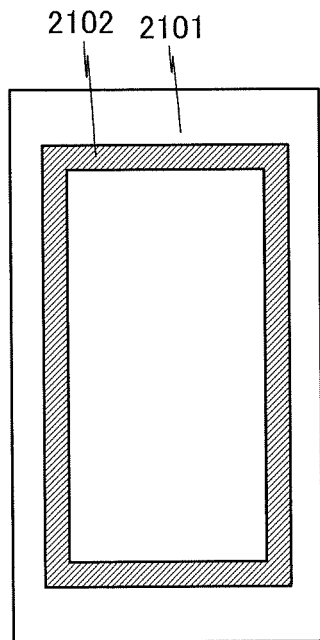
Figure 19C:
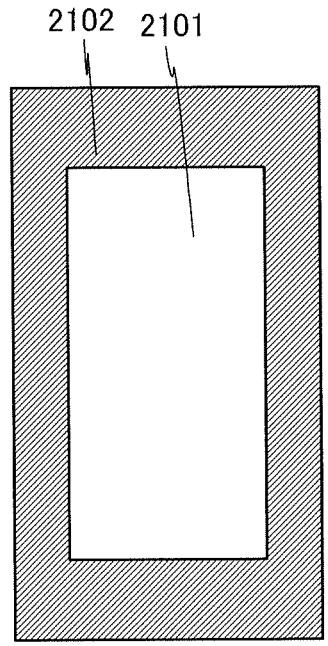
Figure 19D:
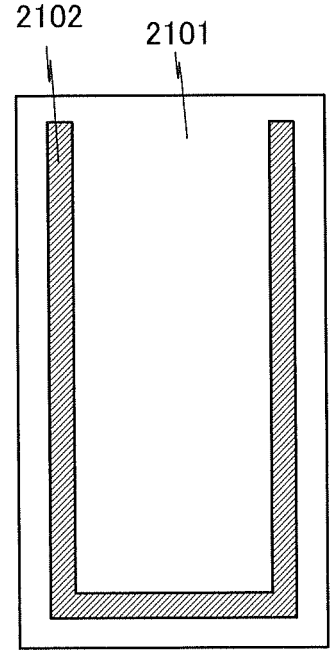

As illustrated in FIGS. 19B and 19C, the projection 2102 may be formed to have a frame-like shape. It is possible to employ a structure in which the projection 2102 is not positioned at end portions of the substrate 2101 as illustrated in FIG. 19B or a structure in which the projection 2102 is positioned at end portions of the substrate 2101 as illustrated in FIG. 19C. The projection 2102 may be formed on three of the four sides of the substrate 2101 as illustrated in FIG. 19D, or may be provided on two sides or one side thereof. Note that the projection 2102 is not necessarily formed parallel to a side of the substrate 2101.

When pressure is applied to the light-emitting device 10 in the state shown in FIG. 19A with the hot press, a thin region can be formed in the non-light-emitting portion of the light-emitting device 10.

Note that the bonding layer 207 is preferably cured while pressure is applied to the light-emitting device 10 because the light-emitting device 10 can easily retain the shape formed by the pressure application.

In the case where the bonding layer 207 is formed using a thermosetting adhesive or a UV delay curing adhesive, for example, the light-emitting device 10 is preferably subjected to heat and pressure with the use of the hot press.

The time or load for the pressure application is not particularly limited. The load can be, for example, greater than or equal to 0.5 t, greater than or equal to 0.8 t, or greater than or equal to 1.0 t and less than or equal to 1.5 t, less than or equal to 2.0 t, or less than or equal to 3.0 t. The heating time is not particularly limited and can be determined in accordance with cure conditions of the material for the bonding layer 207, or the like. The heating temperature can be determined in accordance with the heat resistance of the materials used for the light-emitting device 10. For example, the heating temperature can be higher than or equal to 80° C., higher than or equal to 90° C., or higher than or equal to 100° C. and lower than or equal to 120° C., lower than or equal to 150° C., or lower than or equal to 200° C.

In addition, heating or light irradiation may be additionally performed after the pressure application to cure the bonding layer 207.

Through the above process, the light-emitting device described in the structure example b-1 can be manufactured.

Example of Manufacturing Method of Structure Example b-2

An example of a manufacturing method of the above structure example b-2 is described with reference to FIG. 19A and FIGS. 20A to 20D. FIGS. 20A to 20D each illustrate a cross-sectional structure in a step, which is taken along the dashed-dotted line A3-A4 (see FIG. 11A).

Figure 20A:
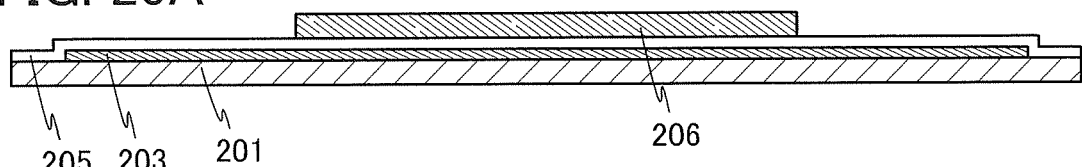
FIGS. 20A to 20D illustrate an example of a method for manufacturing a light-emitting device.

First, the separation layer 203 is formed over the formation substrate 201, the insulating layer 205 is formed over the separation layer 203, and the functional layer 206 is formed over the insulating layer 205 (FIG. 20A). Note that the insulating layer 205 and the functional layer 206 can be collectively referred to as a layer to be separated.

In this embodiment, at least a light-emitting element (organic EL element) is formed as the functional layer 206. A transistor, a capacitor, a touch sensor, or the like may also be formed. Alternatively, a display element other than the light-emitting element may be formed. A coloring layer or a light-blocking layer may be formed.

Then, the bonding layer 207 is formed over the formation substrate 201 or the substrate 259.

The bonding layer 207 is preferably formed to overlap with the separation layer 203 and the insulating layer 205. In that case, the yield of separation of the formation substrate 201 can be increased. In the case where the bonding layer 207 is formed over the substrate 259, it is acceptable as long as the bonding layer 207 overlaps with the separation layer 203 and the insulating layer 205 when the formation substrate 201 and the substrate 259 overlap with each other in a later step.

Figure 20B:
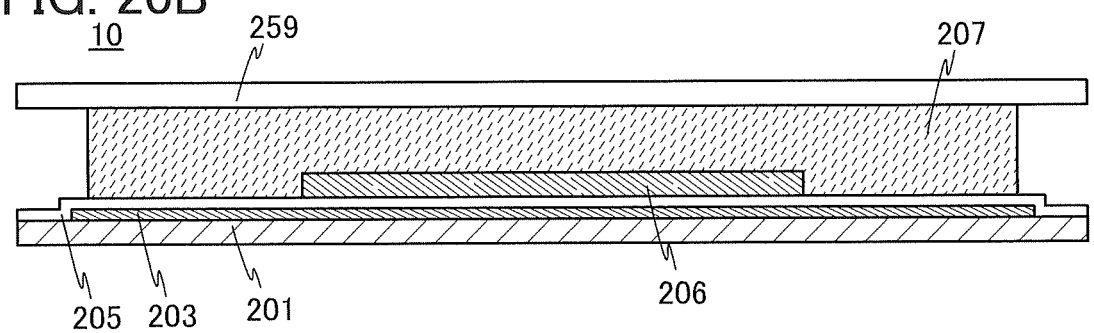

As shown in FIG. 20B, an end portion of the bonding layer 207 is preferably positioned on an inner side of an end portion of the separation layer 203. Alternatively, the end portion of the bonding layer 207 and that of the separation layer 203 may overlap with each other. Accordingly, strong adhesion between the formation substrate 201 and the substrate 259 can be suppressed; thus, a decrease in yield of a subsequent separation process can be suppressed. In the case where the bonding layer 207 is formed using a material with high fluidity, a partition is preferably used to hold the bonding layer 207.

The thickness of the bonding layer 207 is greater than or equal to 1 μm and less than or equal to 200 μm, preferably greater than or equal to 1 μm and less than or equal to 100 μm, further preferably greater than or equal to 1 μm and less than or equal to 50 μm, for example.

Next, under a reduced-pressure atmosphere, the formation substrate 201 and the substrate 259 overlap with each other, so that the functional layer 206 is surrounded by the bonding layer 207, the formation substrate 201, and the substrate 259 (FIG. 20B). Then, the light-emitting device 10 shown in FIG. 20B is placed in the above-described press (see FIG. 19A). With the projection 2102 formed on the substrate 2101, pressure is applied to the non-light-emitting portion of the light-emitting device 10.

Figure 20C:
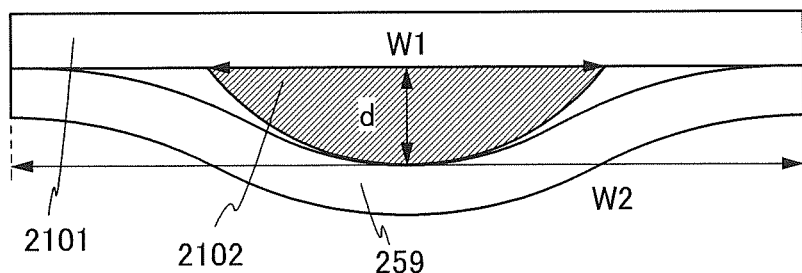

At this time, a width W2 of the depression formed in the substrate 259 of the light-emitting device 10 is larger than a width W1 of the projection 2102 (FIG. 20C). For example, the width W2 is larger than 1 time and smaller than or equal to 1.5 times, smaller than or equal to 2 times, or smaller than or equal to 3 times the width W1. The width W2 may be more than 3 times the width W1. The depth of the depression formed in the substrate 259 of the light-emitting device 10 is smaller than or equal to a height d of the projection 2102. The width W2 can be larger than or equal to 1 time, larger than or equal to 5 times, or larger than or equal to 10 times and smaller than or equal to 20 times, smaller than or equal to 50 times, or smaller than or equal to 100 times the depth of the depression.

For example, the depth of the depression can be greater than or equal to 0.01 mm, greater than or equal to 0.05 mm, or greater than or equal to 0.1 mm and less than or equal to 2 mm, less than or equal to 1 mm, or less than or equal to 0.5 mm. The width W2 can be greater than or equal to 0.1 mm, greater than or equal to 1 mm, or greater than or equal to 1 cm and less than or equal to 10 cm, less than or equal to 5 cm, or less than or equal to 3 cm. The width W2 is preferably larger than or equal to 0 times and smaller than or equal to 1 time the width of the non-light-emitting portion, and may be larger than or equal to 0.2 times and smaller than or equal to 0.8 times, or larger than or equal to 0.4 times and smaller than or equal to 0.6 times the width of the non-light-emitting portion. Note that the width W2 is not necessarily the width of the depression and may be the width of the region thinner than the light-emitting portion.

Figure 20D:
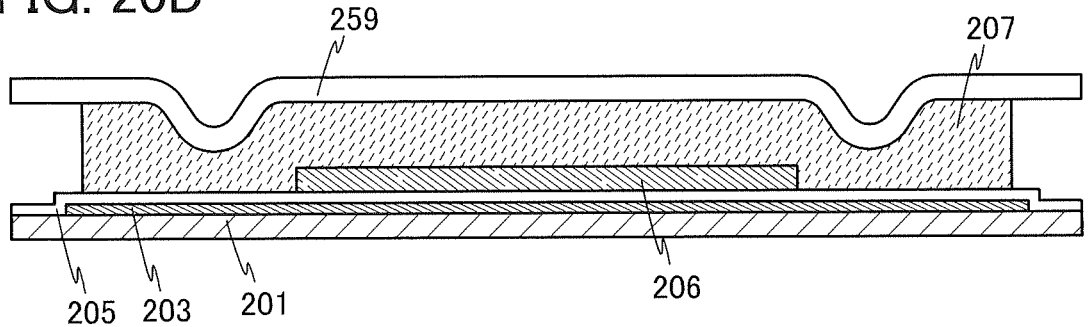

When pressure is applied to the light-emitting device 10 with the press, a thin portion can be formed in the non-light-emitting portion of the light-emitting device 10 (FIG. 20D). Heating is preferably performed at the same time as the pressure application to cure the bonding layer 207.

Next, the formation substrate 201 and the insulating layer 205 are separated from each other. Here, a separation starting point for separation of the formation substrate 201 is preferably formed. The separation starting point is formed in a region where the bonding layer 207 and the separation layer 203 overlap with each other.

The insulating layer 205 is cracked (or broken), whereby the separation starting point can be formed.

Then, the insulating layer 205 and the formation substrate 201 are separated from each other from the formed separation starting point.

Next, to the insulating layer 205 that is exposed by separation of the formation substrate 201, the substrate 251 is attached with the use of the bonding layer 253. A step of, for example, cutting an end portion (e.g., part of the substrate 259 that is not in contact with the bonding layer 207) of the light-emitting device is performed, so that the light-emitting device illustrated in FIG. 14B can be manufactured.

Through the above process, the light-emitting device described in the structure example b-2 can be manufactured.

Example 1 of Manufacturing Method of Structure Example b-3

An example of a manufacturing method of the above structure example b-3 is described with reference to FIG. 19A and FIGS. 21A to 21D. FIGS. 21A to 21D each illustrate a cross-sectional structure in a step, which is taken along the dashed-dotted line B3-B4 (see FIG. 17A).

Figure 21A:
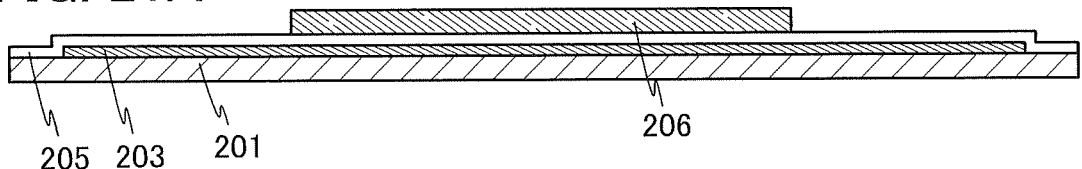
FIGS. 21A to 21D illustrate an example of a method for manufacturing a light-emitting device.
Figure 21B:
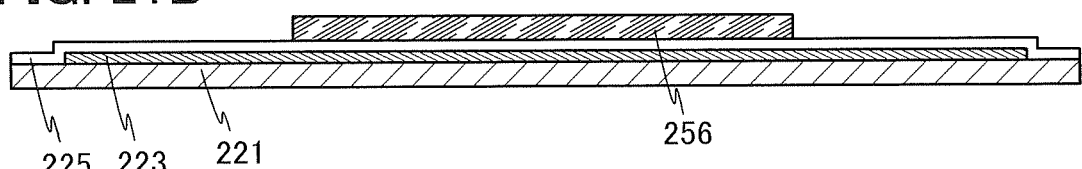

First, the separation layer 203 is formed over the formation substrate 201, the insulating layer 205 is formed over the separation layer 203, and the functional layer 206 is formed over the insulating layer 205 (FIG. 21A). Furthermore, the separation layer 223 is formed over the formation substrate 221, the insulating layer 225 is formed over the separation layer 223, and the functional layer 256 is formed over the insulating layer 225 (FIG. 21B).

Although the separation layer 203 and the separation layer 223 have the same size in this embodiment (FIG. 21C), the two separation layers may have different sizes.

The formation substrate 221 can be formed using a material for the formation substrate 201. The separation layer 223 can be formed using a material for the separation layer 203. The insulating layer 225 can be formed using a material for the insulating layer 205.

In this embodiment, at least a coloring layer is formed as the functional layer 256. A light-blocking layer, a light-emitting element, a display element, a transistor, a touch sensor, a capacitor, or the like may also be formed.

Then, the bonding layer 207, a partition 242, and a temporary sealing layer 244 are formed over the formation substrate 201 or the formation substrate 221.

The bonding layer 207, the partition 242, and the temporary sealing layer 244 may be formed over either the formation substrate 201 or the formation substrate 221. All of the bonding layer 207, the partition 242, and the temporary sealing layer 244 may be formed over one of the substrates, or alternatively, the bonding layer 207 and the partition 242 may be formed over one substrate and the temporary sealing layer 244 may be formed over the other substrate.

The bonding layer 207 is preferably formed in such a manner that it overlaps with the separation layer 203, the insulating layer 205, the insulating layer 225, and the separation layer 223 in a later step in which the formation substrate 201 and the formation substrate 221 overlap with each other. In that case, the yield of separation of the formation substrate 201 and the formation substrate 221 can be increased.

Figure 21C:
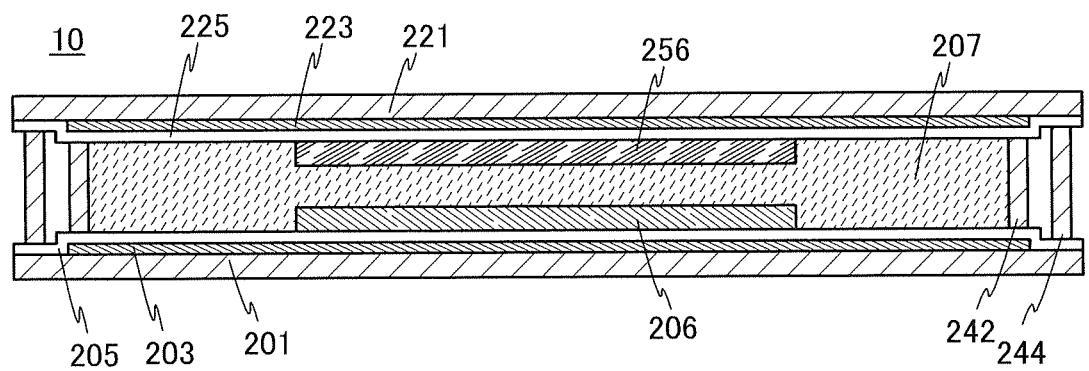

As shown in FIG. 21C, an end portion of the bonding layer 207 is preferably positioned on an inner side of at least an end portion of either the separation layer 203 or the separation layer 223 (the separation layer which is desirably separated first). Accordingly, strong adhesion between the formation substrate 201 and the formation substrate 221 can be suppressed; thus, a decrease in yield of a subsequent separation process can be suppressed.

The thickness of the partition 242 and that of the temporary sealing layer 244 are each greater than or equal to 1 μm and less than or equal to 200 μm, preferably greater than or equal to 1 μm and less than or equal to 100 μm, further preferably greater than or equal to 1 μm and less than or equal to 50 μm, for example.

There is no particular limitation on methods for forming the partition 242 and the temporary sealing layer 244; for example, a droplet discharge method, a printing method (a screen printing method or an offset printing method), a coating method such as a spin coating method or a spray coating method, a dipping method, a dispenser method, a nanoimprint method, or the like can be employed.

The partition 242 may be formed using the same material as the bonding layer 207. The partition 242 is preferably formed using a material having higher viscosity than the bonding layer 207. When the partition 242 is formed using a material with high viscosity, entry of impurities such as moisture from the air can be inhibited.

A variety of materials that can be used for the bonding layer 207 can be used for the partition 242 and the temporary sealing layer 244.

Next, under a reduced-pressure atmosphere, the formation substrate 201 and the formation substrate 221 overlap with each other, so that the functional layer 206 and the functional layer 256 are surrounded by the temporary sealing layer 244, the formation substrate 201, and the formation substrate 221 (FIG. 21C).

Then, at least part of the temporary sealing layer 244 may be cured. When the light-emitting device 10 is exposed to an air atmosphere, atmospheric pressure is applied to the formation substrate 201 and the formation substrate 221. As a result, the reduced-pressure state of the space surrounded by the temporary sealing layer 244, the formation substrate 201, and the formation substrate 221 is maintained. Thus, impurities such as moisture in the air can be prevented from entering the light-emitting device 10.

Then, the light-emitting device 10 shown in FIG. 21C is placed in the above-described press (see FIG. 19A). With the projection 2102 formed on the substrate 2101, pressure is applied to the non-light-emitting portion of the light-emitting device 10.

Figure 21D:
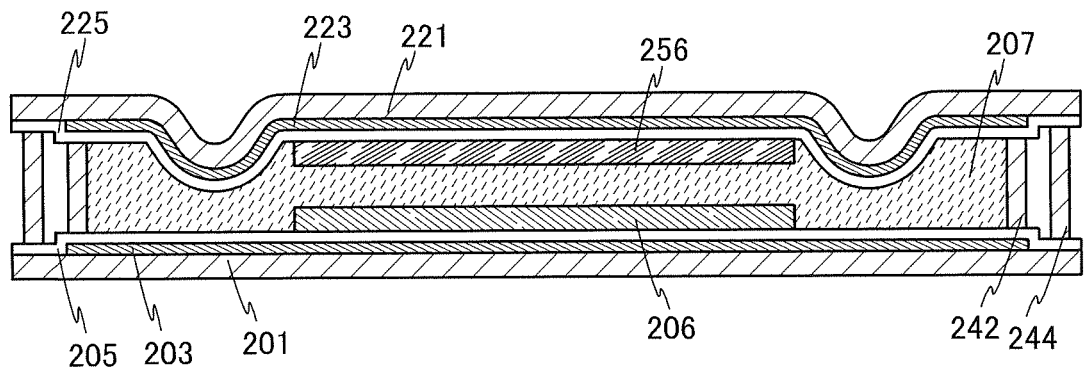

When pressure is applied to the light-emitting device 10 with the press, a thin portion can be formed in the non-light-emitting portion of the light-emitting device 10 (FIG. 21D). Heating is preferably performed at the same time as the pressure application to cure the bonding layer 207. In addition, heating or light irradiation may be additionally performed after the pressure application to cure the bonding layer 207.

After that, a separation starting point is formed. Then, the insulating layer and the formation substrate are separated from each other from the formed separation starting point. To the insulating layer that is exposed by separation of the formation substrate, a substrate is attached with the use of a bonding layer.

Either the formation substrate 201 or the formation substrate 221 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed only over one of the substrates, the substrate on the side where the element is formed may be separated first or the other substrate may be separated first.

Through the above process, the light-emitting device described in the structure example b-3 can be manufactured.

Note that in one embodiment of the present invention, a method for forming a thin region in the non-light-emitting portion is not limited to the method in which pressure is applied to the non-light-emitting portion to change the shape of the light-emitting device.

Example 2 of Manufacturing Method of Structure Example b-3

An example of a manufacturing method of the above structure example b-3 is described with reference to FIGS. 22A to 22D. FIGS. 22A to 22D each illustrate a cross-sectional structure in a step, which is taken along the dashed-dotted line B3-B4 (see FIG. 17A).

Figure 22A:
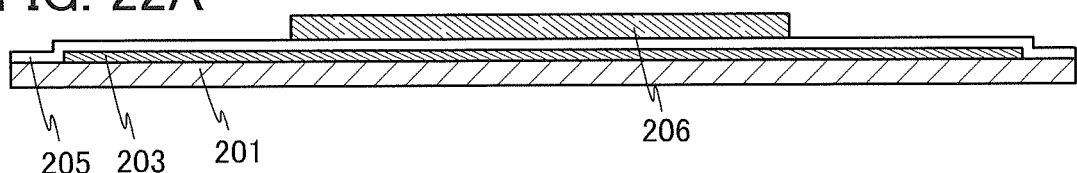
FIGS. 22A to 22D illustrate an example of a method for manufacturing a light-emitting device.
Figure 22B:
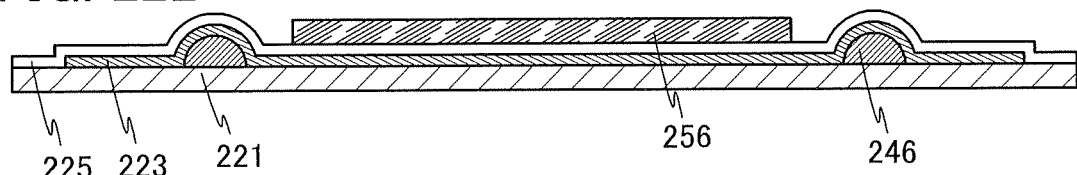

First, the separation layer 203 is formed over the formation substrate 201, the insulating layer 205 is formed over the separation layer 203, and the functional layer 206 is formed over the insulating layer 205 (FIG. 22A). Furthermore, a projection 246 is formed over the formation substrate 221, the separation layer 223 is formed over the projection 246, the insulating layer 225 is formed over the separation layer 223, and the functional layer 256 is formed over the insulating layer 225 (FIG. 22B).

Then, the bonding layer 207 is formed over the formation substrate 201 or the formation substrate 221.

Figure 22C:
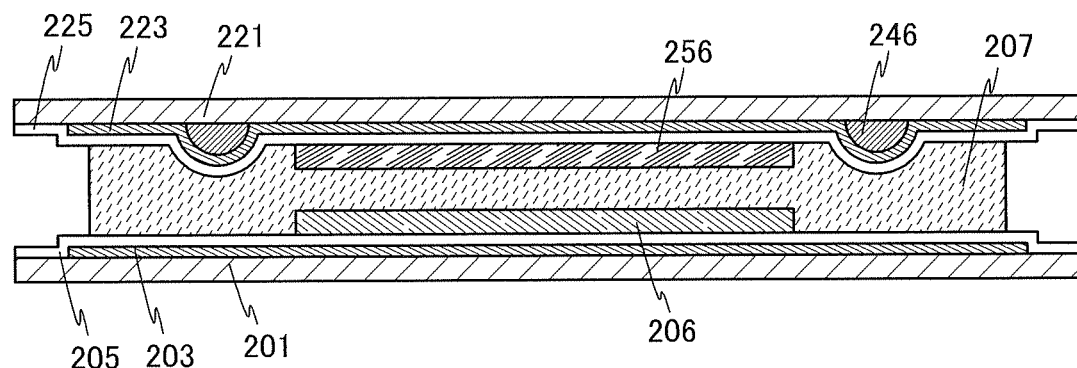

Next, under a reduced-pressure atmosphere, the formation substrate 201 and the formation substrate 221 overlap with each other, so that the functional layer 206 and the functional layer 256 are surrounded by the bonding layer 207, the formation substrate 201, and the formation substrate 221 (FIG. 22C). Then, the bonding layer 207 is cured. Then, the insulating layer and the formation substrate are separated from each other. To the insulating layer that is exposed by separation of the formation substrate, a substrate is attached with the use of a bonding layer.

Figure 22D:
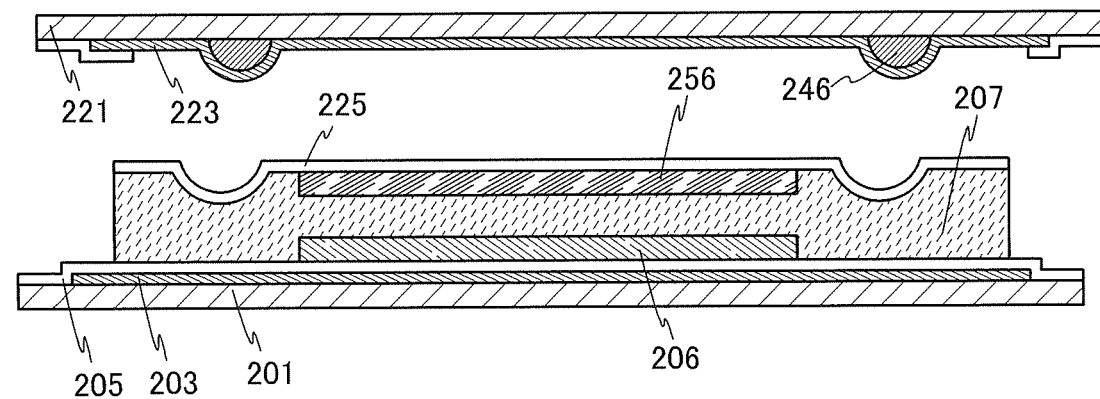

FIG. 22D illustrates an example in which the formation substrate 221 is separated ahead of the formation substrate 201.

In the case where a projection is formed on the formation substrate in advance or a formation substrate having a projection is used, pressure application to the light-emitting device during manufacture is not needed. Accordingly, the manufacturing process of the light-emitting device can be simplified and a reduction in yield can be inhibited.

In the above-described examples 1 and 2 of a manufacturing method of the structure example b-3, the procedure can be adopted in which the pair of formation substrates each provided with the layer to be separated are attached to each other, separation is performed, and then the substrates of the light-emitting device are attached. Therefore, the formation substrates having low flexibility can be attached to each other when the layers to be separated are attached to each other, whereby alignment accuracy at the time of attachment can be improved as compared to the case where flexible substrates are attached to each other.

Example of Plan View of Light-Emitting Device

The light-emitting device of one embodiment of the present invention may be a system-on-panel in which part or the whole of a driver circuit including a transistor is formed over the same substrate as a light-emitting portion in an integrated manner.

In FIGS. 23A1 and 23A2, a light-emitting portion 4002 is sealed with a first substrate 4001, a bonding layer (not shown), and a second substrate 4006. In FIGS. 23A1 and 23A2, over a region of the first substrate 4001 that does not overlap with the second substrate 4006, a signal line driver circuit 4003 and a scan line driver circuit 4004 formed over the respective separate substrates are mounted. Signals and potentials are supplied from an FPC 4018a and an FPC 4018b to the signal line driver circuit 4003, the scan line driver circuit 4004, or the light-emitting portion 4002.

In FIGS. 23B1, 23B2, and 23C, the light-emitting portion 4002 and the scan line driver circuit 4004 are sealed with the first substrate 4001, a bonding layer (not shown), and the second substrate 4006. In FIGS. 23B1, 23B2, and 23C, over a region of the first substrate 4001 that does not overlap with the second substrate 4006, the signal line driver circuit 4003 formed over a separate substrate is mounted. In FIGS. 23B1, 23B2, and 23C, signals and potentials are supplied from an FPC 4018 to the signal line driver circuit 4003, the scan line driver circuit 4004, or the light-emitting portion 4002.

Although FIGS. 23B1, 23B2, and 23C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a COG, a TCP, a chip on film (COF), or the like can be used. FIGS. 23A1 and 23A2 each illustrate an example in which the signal line driver circuit 4003 and the scan line driver circuit 4004 are mounted by a COG of a COF; FIGS. 23B1 and 23B2 each illustrate an example in which the signal line driver circuit 4003 is mounted by a COG of a COF; and FIG. 23C illustrates an example in which the signal line driver circuit 4003 is mounted by a TCP.

A frame-like non-light-emitting portion is provided outside the light-emitting portion 4002. Here, the non-light-emitting portion means a portion other than the light-emitting portion 4002 in a region overlapping with the second substrate 4006 over the first substrate 4001. A region 4005 in the non-light-emitting portion is a region thinner than the light-emitting portion 4002. For example, in the region 4005, at least one of the first substrate 4001 and the second substrate 4006 have a depression.

Figure 23C:
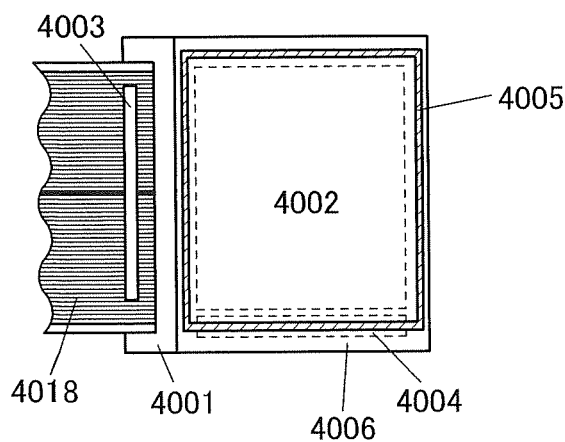

Although FIG. 23A1 illustrates an example in which the region 4005 having a frame-like shape exists in part of the non-light-emitting portion, the region 4005 may be provided in the entire non-light-emitting portion as illustrated in FIG. 23A2. The region 4005 does not necessarily have a frame-like shape. In the example illustrated in FIG. 23B1, the region 4005 extends through three sides of the light-emitting device. In the example illustrated in FIG. 23B2, the region 4005 is provided on each of three sides of the light-emitting device. In this manner, the plurality of regions 4005 may be provided. In the example illustrated in FIG. 23C, the scan line driver circuit 4004 overlaps with the region 4005. In the case where part or the whole of a driver circuit that includes a transistor is provided on the same substrate as the light-emitting portion in the light-emitting device, the driver circuit and the region 4005 may partly overlap with each other.

As described in this embodiment, in one embodiment of the present invention, entry of impurities through a side surface of the light-emitting device can be inhibited because the non-light-emitting portion has a region thinner than the light-emitting portion. Thus, the light-emitting device can be highly reliable.

This embodiment can be combined with any other embodiment as appropriate.

Embodiment 2

In this embodiment, a light-emitting device of one embodiment of the present invention will be described with reference to drawings.

Although a light-emitting device including an organic EL element is mainly described in this embodiment as an example, one embodiment of the present invention is not limited to this example. The light-emitting devices described in this embodiment each have a region thinner than a light-emitting portion in a non-light-emitting portion and are thus highly reliable.

Specific Example 1

Figure 24A:
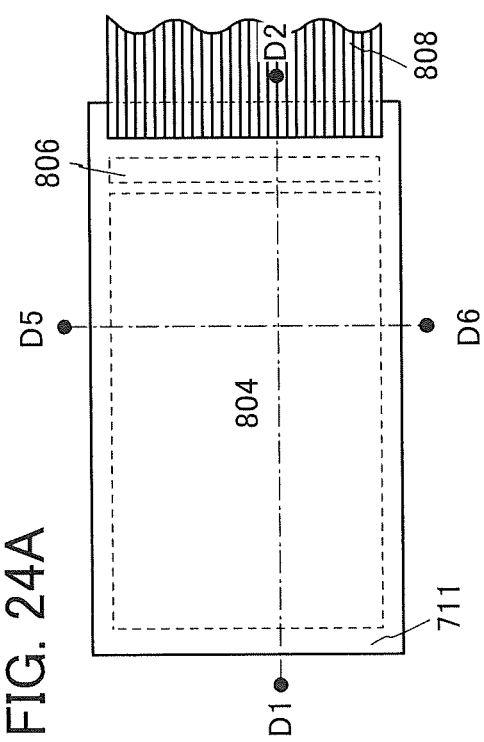
FIGS. 24A and 24B illustrate an example of a light-emitting device.
Figure 24B:
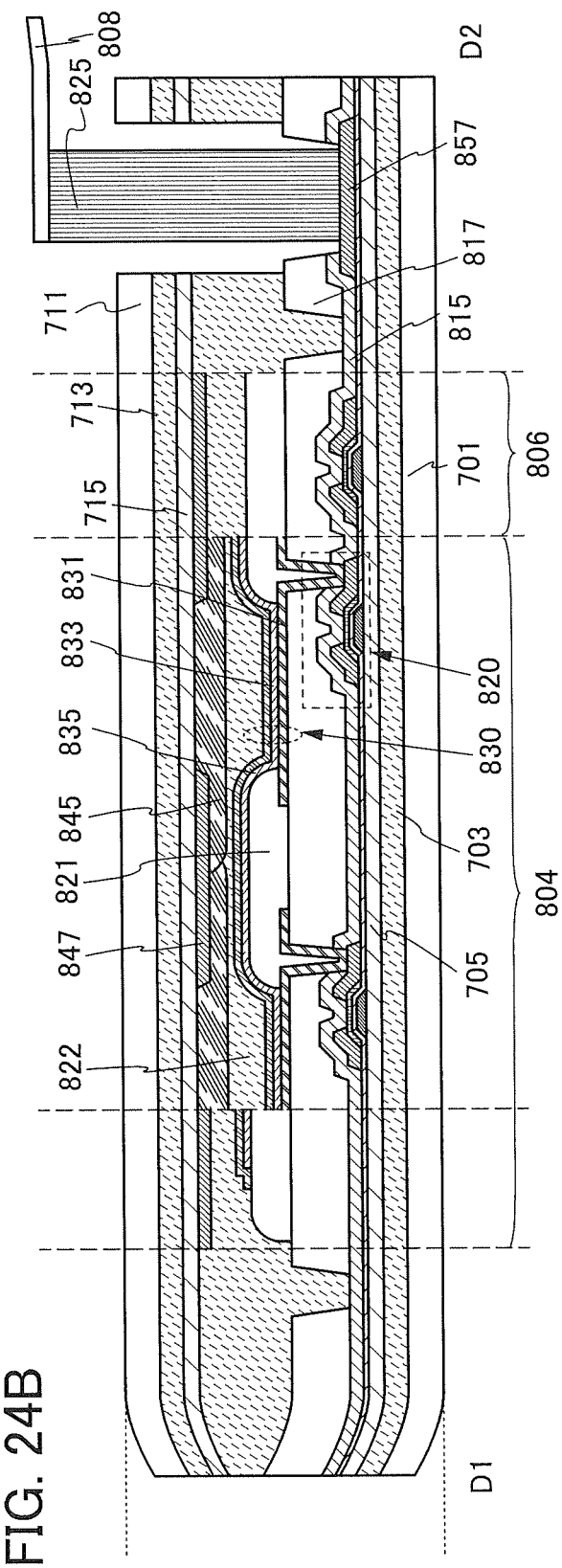

FIG. 24A is a plan view of a light-emitting device, and FIG. 24B and FIG. 31A show examples of a cross-sectional view taken along a dashed-dotted line D1-D2 in FIG. 24A. Specifically, FIG. 24B and FIG. 31A show an application example of the structure example a-3 and an application example of the structure example b-3, respectively. The light-emitting device in Specific Example 1 is a top-emission light-emitting device using a color filter method. In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan or magenta, or the like may be used.

The light-emitting device illustrated in FIG. 24A includes the light-emitting portion 804, the driver circuit portion 806, and the FPC 808.

The light-emitting devices in FIG. 24B and FIG. 31A each include a first flexible substrate 701, a first bonding layer 703, a first insulating layer 705, a first functional layer (a plurality of transistors, a conductive layer 857, an insulating layer 815, an insulating layer 817, a plurality of light-emitting elements, and an insulating layer 821), a third bonding layer 822, a second functional layer (a coloring layer 845 and a light-blocking layer 847), a second insulating layer 715, a second bonding layer 713, and a second flexible substrate 711. The third bonding layer 822, the second insulating layer 715, the second bonding layer 713, and the second flexible substrate 711 transmit visible light. Light-emitting elements and transistors included in the light-emitting portion 804 and the driver circuit portion 806 are sealed with the first flexible substrate 701, the second flexible substrate 711, and the third bonding layer 822.

The light-emitting portion 804 includes the transistor 820 and a light-emitting element 830 over the first flexible substrate 701 with the first bonding layer 703 and the first insulating layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the third bonding layer 822.

The insulating layer 815 has an effect of inhibiting diffusion of impurities to a semiconductor included in the transistor. As the insulating layer 817, an insulating layer having a planarization function is preferably selected in order to reduce surface unevenness due to the transistor.

The driver circuit portion 806 includes a plurality of transistors over the first flexible substrate 701 with the first bonding layer 703 and the first insulating layer 705 provided therebetween. In FIG. 24B and FIG. 31A, one of the transistors included in the driver circuit portion 806 is illustrated.

The first insulating layer 705 and the first flexible substrate 701 are attached to each other with the first bonding layer 703. The second insulating layer 715 and the second flexible substrate 711 are attached to each other with the second bonding layer 713. The first insulating layer 705 and the second insulating layer 715 are preferably highly resistant to moisture, in which case impurities such as water can be prevented from entering the light-emitting element 830 or the transistor 820, leading to higher reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting devices in FIG. 24B and FIG. 31A, the FPC 808 is positioned over the second flexible substrate 711. The connector 825 is connected to the conductive layer 857 through an opening provided in the second flexible substrate 711, the second bonding layer 713, the second insulating layer 715, the third bonding layer 822, the insulating layer 817, and the insulating layer 815. The connector 825 is also connected to the FPC 808. The FPC 808 and the conductive layer 857 are electrically connected to each other via the connector 825. When the conductive layer 857 and the second flexible substrate 711 overlap with each other, an opening is formed in the second flexible substrate 711 (or a substrate with an opening portion is used) so that the conductive layer 857, the connector 825, and the FPC 808 can be electrically connected to each other.

Figure 25A:
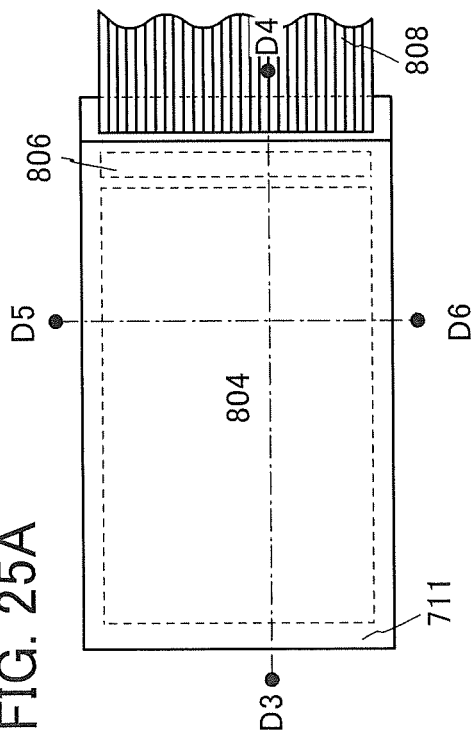
FIGS. 25A and 25B illustrate an example of a light-emitting device.
Figure 25B:
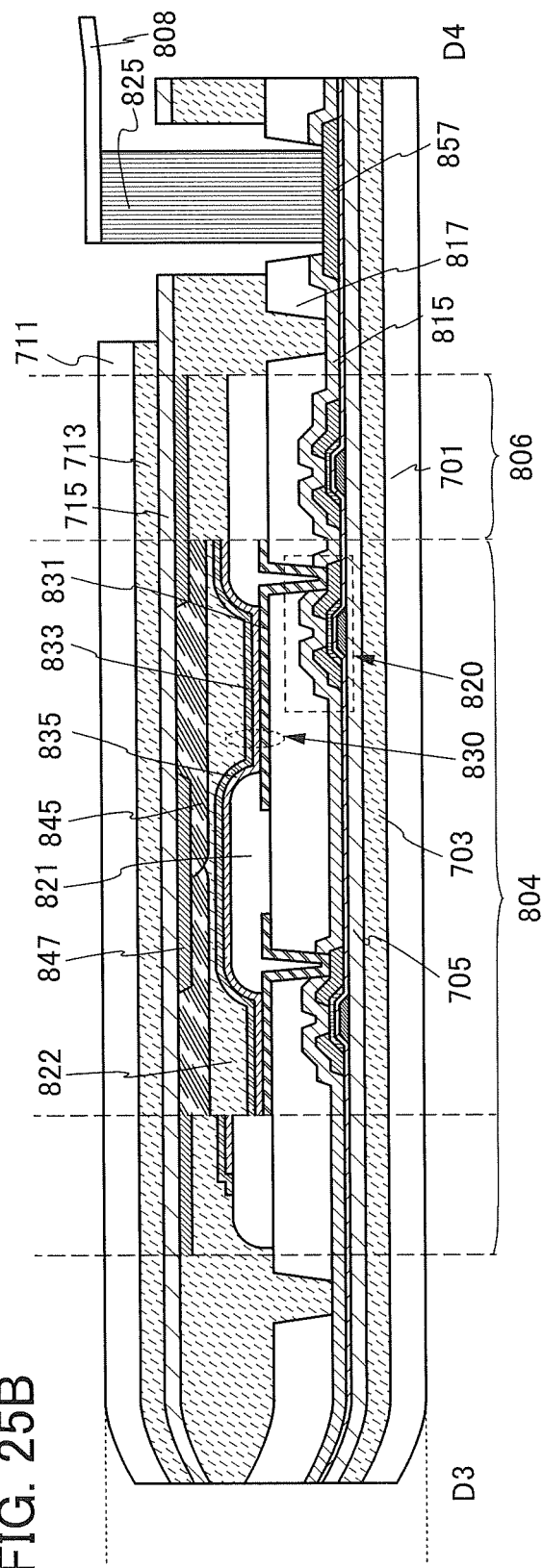
Figure 28:
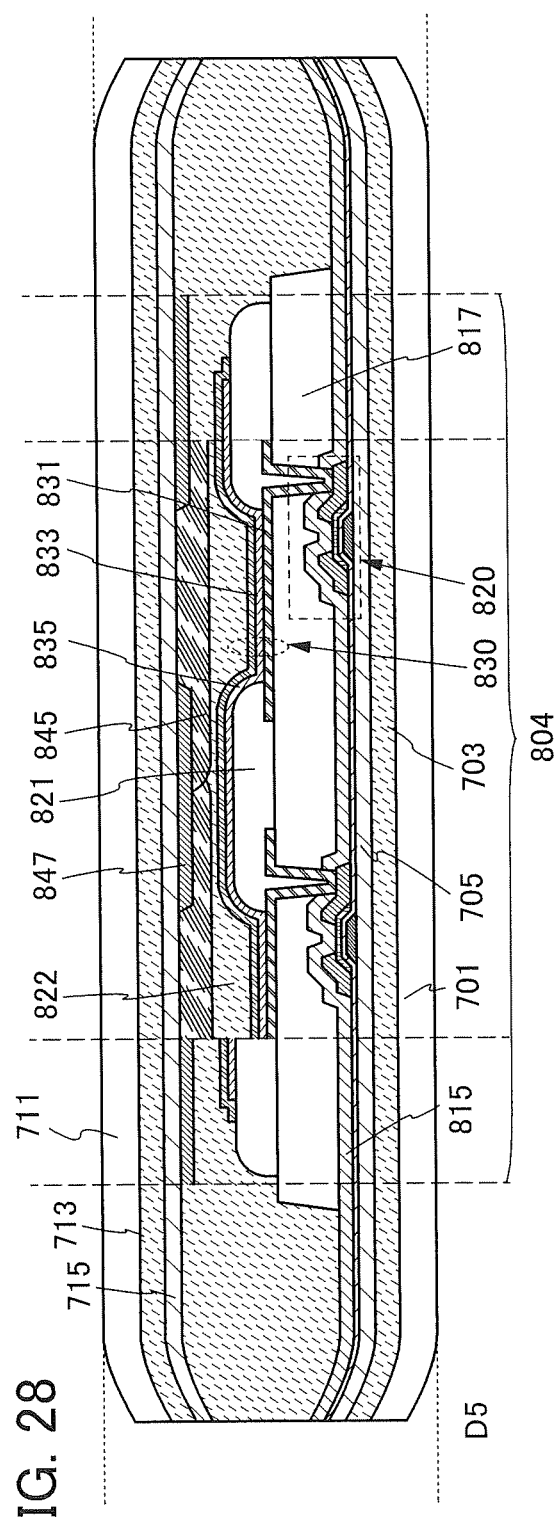
FIG. 28 illustrates an example of a light-emitting device.

A modification example of the light-emitting device shown in FIGS. 24A and 24B is described. FIG. 25A is a plan view of a light-emitting device, and FIG. 25B and FIG. 31B show examples of a cross-sectional view taken along a dashed-dotted line D3-D4 in FIG. 25A. Specifically, FIG. 25B and FIG. 31B show an application example of the structure example a-3 and an application example of the structure example b-3, respectively.

The light-emitting devices shown in FIGS. 25A and 25B and FIG. 31B are examples in which the first flexible substrate 701 and the second flexible substrate 711 have different sizes. The FPC 808 is located over the second insulating layer 715 and does not overlap with the second flexible substrate 711. The connector 825 is connected to the conductive layer 857 through an opening provided in the second insulating layer 715, the third bonding layer 822, the insulating layer 817, and the insulating layer 815. Since no opening needs to be provided in the second flexible substrate 711, there is no limitation on the material for the second flexible substrate 711.

Figure 32:
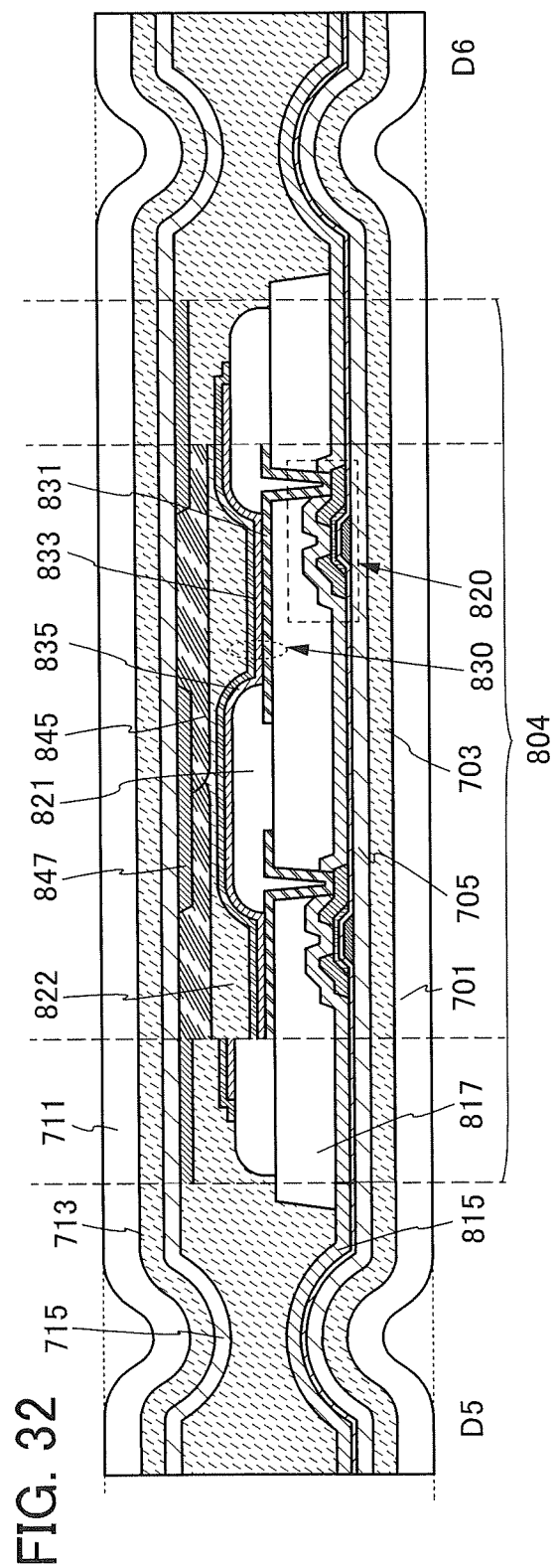
FIG. 32 illustrates an example of a light-emitting device.

FIG. 26A and FIG. 32 illustrate examples of a cross-sectional view taken along a dashed-dotted line D5-D6 in FIG. 24A and FIG. 25A.

Each of the light-emitting device in FIG. 24B and FIG. 26A and the light-emitting device in FIG. 25B and FIG. 26A has, on three of the four sides thereof, a portion where the thickness continuously (smoothly) decreases from the light-emitting portion side of the non-light-emitting portion to an end portion of the light-emitting device. With the above structure, entry of impurities through a side surface of the light-emitting device can be inhibited.

In the non-light-emitting portion of the light-emitting device illustrated in FIG. 31A and FIG. 32 and that of the light-emitting device illustrated in FIG. 31B and FIG. 32, the second flexible substrate 711, the second bonding layer 713, and the second insulating layer 715 have depressions. In the non-light-emitting portion of the light-emitting device illustrated in FIG. 31B and FIG. 32, the first flexible substrate 701, the first bonding layer 703, and the first insulating layer 705 have depressions. The non-light-emitting portion has a portion thinner than the light-emitting portion in this manner, whereby entry of impurities through a side surface of the light-emitting device can be inhibited.

In the case where an organic resin with a low gas barrier property or a low moisture-resistant property is used for forming an insulating layer, it is preferable that the insulating layer not be exposed at an end portion of the light-emitting device. With this structure, entry of impurities through a side surface of the light-emitting device can be inhibited. For example, a structure may be employed in which the insulating layer 817 is not provided at an end portion of the light-emitting device as illustrated in FIGS. 27A and 27B, FIG. 28, FIG. 31B, and FIG. 32.

FIG. 26B illustrates a modification example of the light-emitting portion 804.

The light-emitting device illustrated in FIG. 26B includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting device in FIG. 26B includes the spacer 823 over the insulating layer 821. The spacer 823 can adjust the gap between the first flexible substrate 701 and the second flexible substrate 711.

The light-emitting device in FIG. 26B includes an overcoat 849 covering the coloring layer 845 and the light-blocking layer 847. The space between the light-emitting element 830 and the overcoat 849 is filled with the bonding layer 822.

FIG. 26C illustrates a modification example of the light-emitting element 830.

Note that as illustrated in FIG. 26C, the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer may be set in accordance with the emission color of the sub-pixel.

Specific Example 2

A light-emitting device illustrated in FIG. 26D includes the first flexible substrate 701, the first bonding layer 703, the first insulating layer 705, a first functional layer (a conductive layer 814, a conductive layer 857a, a conductive layer 857b, the light-emitting element 830, and the insulating layer 821), the second bonding layer 713, and the second flexible substrate 711.

The conductive layer 857a and the conductive layer 857b, which are external connection electrodes of the light-emitting device, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, and aluminum, an alloy material containing any of these materials as its main component, and the like. The thickness of the conductive layer 814 can be greater than or equal to 0.1 µm and less than or equal to 3 µm, preferably greater than or equal to 0.1 µm and less than or equal to 0.5 µm, for example.

Specific Example 3

FIG. 25A is a plan view of a light-emitting device, and FIG. 29A is an example of a cross-sectional view taken along the dashed-dotted line D3-D4 in FIG. 25A. The light-emitting device in Specific Example 3 is a bottom-emission light-emitting device using a color filter method.

The light-emitting device in FIG. 29A includes the first flexible substrate 701, the first bonding layer 703, the first insulating layer 705, a first functional layer (a plurality of transistors, the conductive layer 857, the insulating layer 815, the coloring layer 845, the insulating layer 817a, the insulating layer 817b, the conductive layer 856, a plurality of light-emitting elements, and the insulating layer 821), the second bonding layer 713, and the second flexible substrate 711. The first flexible substrate 701, the first bonding layer 703, the first insulating layer 705, the insulating layer 815, the insulating layer 817a, and the insulating layer 817b transmit visible light.

In Specific Example 3, the first flexible substrate 701 is curved but the second flexible substrate 711 is not. The light-emitting device in Specific Example 3 has a portion where the thickness thereof continuously (smoothly) decreases from the light-emitting portion side of the non-light-emitting portion toward an end portion of the light-emitting device. In addition, at the end portion of the light-emitting device and the vicinity thereof, a portion is provided where the thickness of the light-emitting device is smaller than that of the light-emitting portion and is uniform. With the above structure, entry of impurities through a side surface of the light-emitting device can be inhibited.

The light-emitting portion 804 includes the transistor 820, a transistor 824, and the light-emitting element 830 over the first flexible substrate 701 with the first bonding layer 703 and the first insulating layer 705 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The driver circuit portion 806 includes a plurality of transistors over the first flexible substrate 701 with the first bonding layer 703 and the first insulating layer 705 provided therebetween. In FIG. 29A, two of the transistors included in the driver circuit portion 806 are illustrated.

The first insulating layer 705 and the first flexible substrate 701 are attached to each other with the first bonding layer 703. The first insulating layer 705 is preferably highly resistant to moisture, in which case impurities such as water can be prevented from entering the light-emitting element 830, the transistor 820, the transistor 824, leading to higher reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. Furthermore, an example is described in which the conductive layer 857 is formed using the same material and the same step(s) as those of the conductive layer 856.

Figures 30A, 30B:
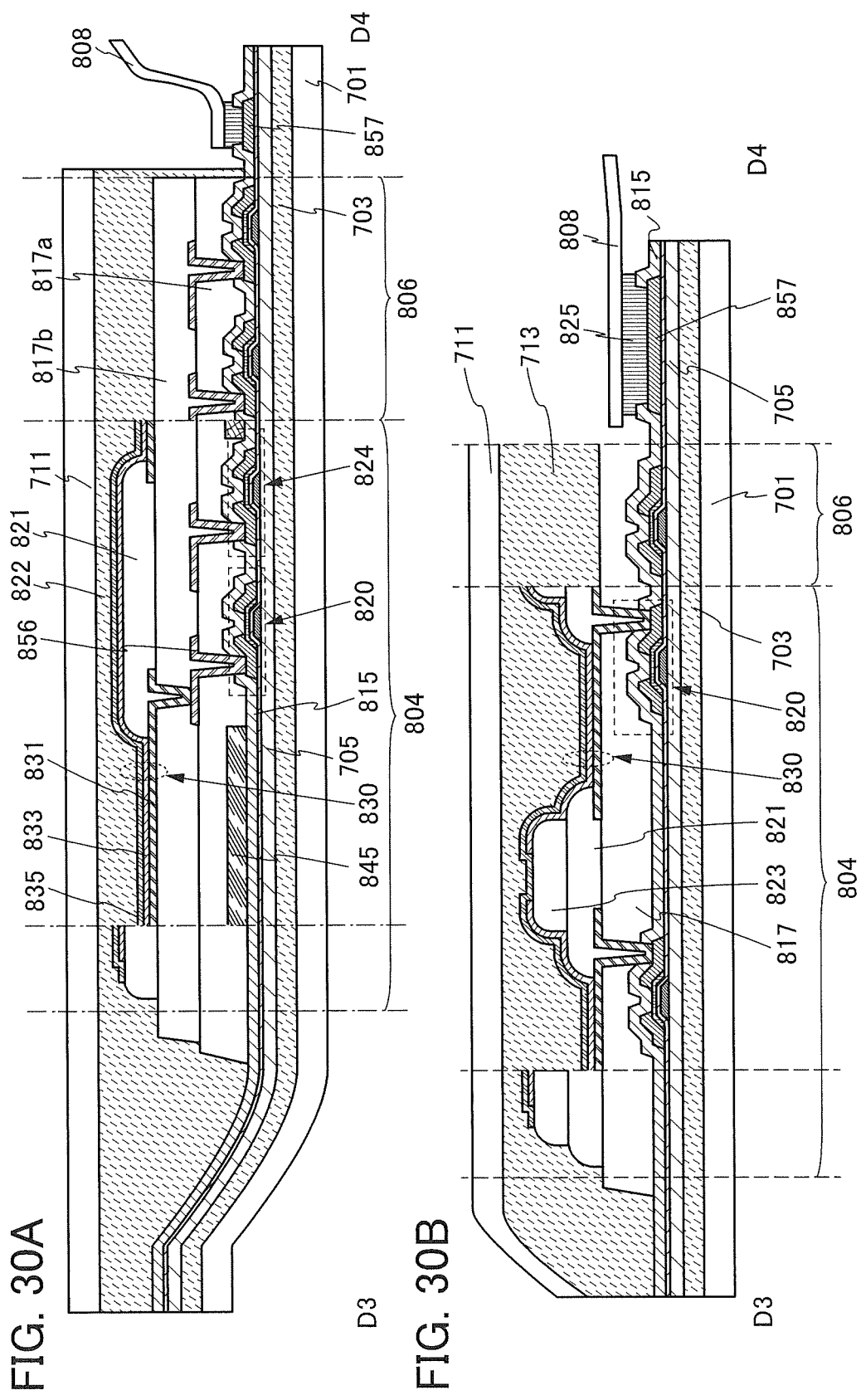
FIGS. 30A and 30B illustrate examples of a light-emitting device.

A structure in which the insulating layer 817a and the insulating layer 817b are not provided at the end portion of the light-emitting device as illustrated in FIG. 30A may be employed.

Specific Example 4

FIG. 25A is a plan view of a light-emitting device, and FIG. 29B is an example of a cross-sectional view taken along the dashed-dotted line D3-D4 in FIG. 25A. The light-emitting device in Specific Example 4 is a top-emission light-emitting device using a separate coloring method.

The light-emitting device in FIG. 29B includes the first flexible substrate 701, the first bonding layer 703, the first insulating layer 705, a first functional layer (a plurality of transistors, the conductive layer 857, the insulating layer 815, the insulating layer 817, a plurality of light-emitting elements, the insulating layer 821, and the spacer 823), the second bonding layer 713, and the second flexible substrate 711. The second bonding layer 713 and the second flexible substrate 711 transmit visible light.

In Specific Example 4, the second flexible substrate 711 is curved but the first flexible substrate 701 is not. The light-emitting device in Specific Example 4 has a portion where the thickness thereof continuously (smoothly) decreases from the light-emitting portion side of the non-light-emitting portion toward an end portion of the light-emitting device. With the above structure, entry of impurities through a side surface of the light-emitting device can be inhibited.

In the light-emitting device in FIG. 29B, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other with the connector 825 provided therebetween.

A structure in which the insulating layer 817 is not provided at the end portion of the light-emitting device as illustrated in FIG. 30B may be employed.

Examples of Materials

Next, materials and the like that can be used for a light-emitting device are described. Note that description of the components already described in this specification is omitted in some cases.

There is no particular limitation on the structure of the transistor in the light-emitting device. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided if not necessary. In each of the above specific examples, the first insulating layer 705 can serve as a base film of the transistor.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes recombine in the EL layer 833 and a light-emitting substance contained in the EL layer 833 emits light. A conductive film that transmits visible light is used as the electrode through which light is extracted. A conductive film that reflects visible light is preferably used as the electrode through which light is not extracted.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be obtained. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be deposited by evaporation separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating layers having an excellent moisture-resistant property. In that case, entry of an impurity such as water into the light-emitting element can be inhibited, leading to inhibition of a decrease in the reliability of the light-emitting device. Specifically, the use of an insulating film having high resistance to moisture for the insulating layer 205 and the insulating layer 225 allows the light-emitting element to be located between a pair of insulating films having high resistance to moisture, by which a decrease in reliability of the light-emitting device can be prevented.

As the insulating layer 815, for example, an inorganic insulating film such as a silicon oxide film, a silicon oxynitride film, or an aluminum oxide film can be used. As the insulating layer 817, the insulating layer 817a, and the insulating layer 817b, an organic material such as a polyimide, an acrylic resin, a polyamide, a poly(imide amide), or a benzocyclobutene-based resin can be used, for example. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material to have an opening portion over the lower electrode 831 so that a side wall of the opening portion is formed as an inclined surface with a continuous curvature.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the aforementioned insulating layers can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a transparent resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

As described above, one embodiment of the present invention can be applied to a variety of devices such as a semiconductor device, a light-emitting device, a display device, and an input-output device.

As examples of the display element, an organic EL element, a liquid crystal element, an electrophoretic element, and a display element using micro electro mechanical systems (MEMS) can be given.

Note that the light-emitting device of one embodiment of the present invention may be used as a display device or as a lighting device. For example, it may be used as a light source such as a backlight or a front light, that is, a lighting device for a display panel.

As described in this embodiment, in one embodiment of the present invention, entry of impurities through a side surface of the light-emitting device can be inhibited because the non-light-emitting portion has a region thinner than the light-emitting portion. Thus, the light-emitting device can be highly reliable.

This embodiment can be combined with any other embodiment as appropriate.

Embodiment 3

In this embodiment, an input-output device of one embodiment of the present invention will be described with reference to drawings. Note that the above description can be referred to for the components of an input-output device, which are similar to those of the light-emitting device described in Embodiment 2. Although an input-output device including a light-emitting element is described as an example in this embodiment, one embodiment of the present invention is not limited thereto. The input-output device described in this embodiment is also a touch panel.

The input-output devices described in this embodiment each have a region thinner than a display portion in a non-display portion and are thus highly reliable. Portions other than the display portion (light-emitting portion) in the input-output device can be regarded as the non-display portions (non-light-emitting portions). In other words, the non-display portion is provided outside a display portion 301 and a display portion 501 to have a frame-like shape. For example, a driver circuit portion is a non-light-emitting portion.

Structure Example 1

Figure 33A:
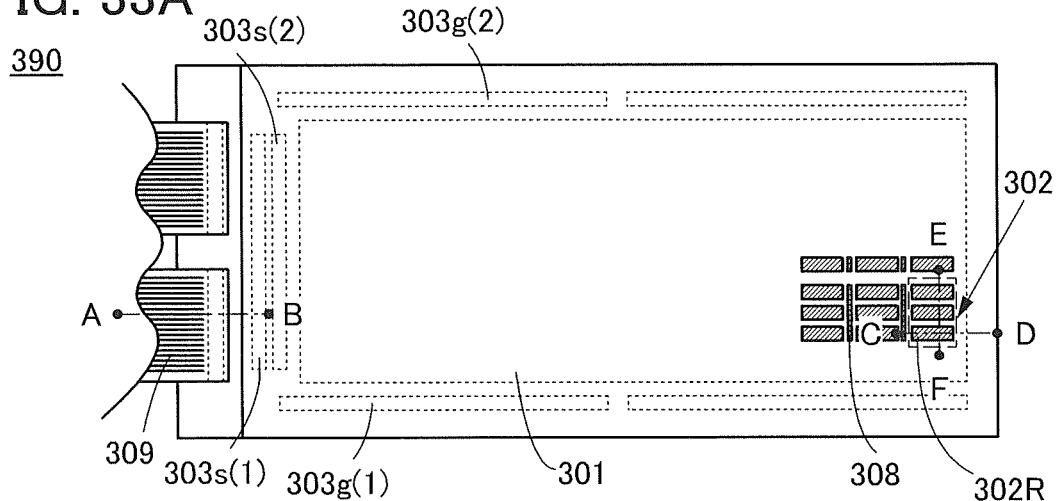
FIGS. 33A to 33C illustrate an example of a light-emitting device.
Figure 33B:
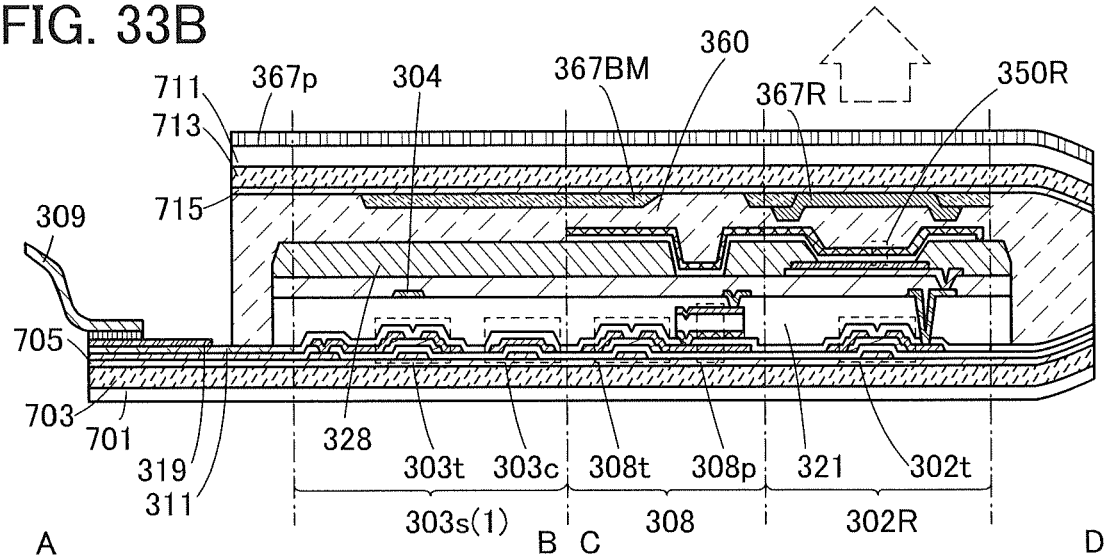
Figure 33C:
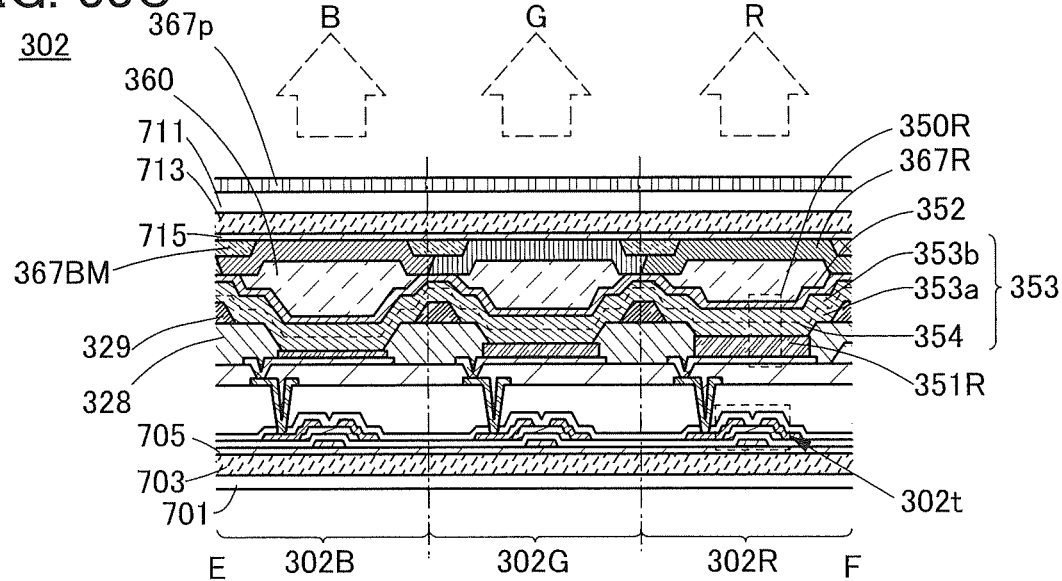
Figure 37A:
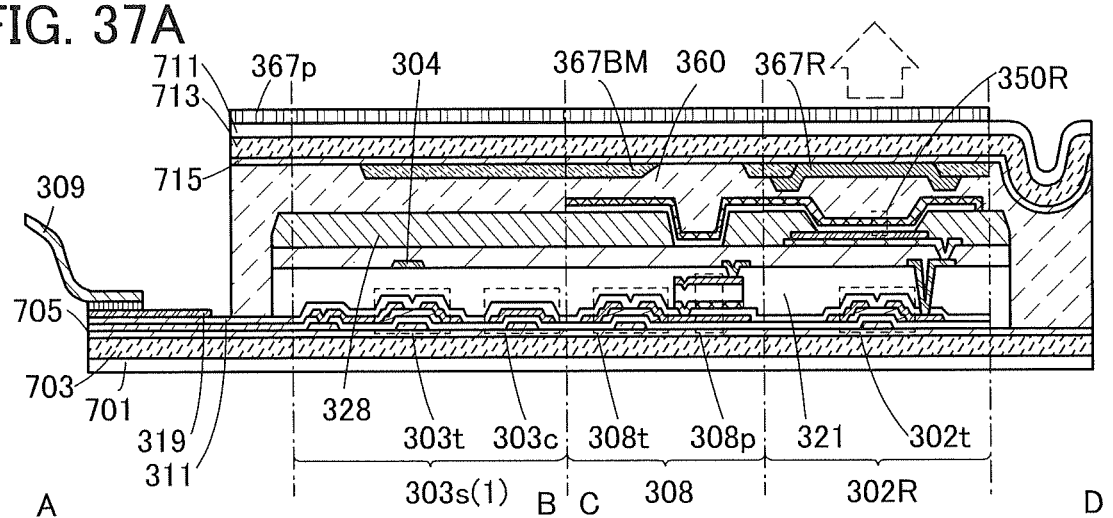
FIGS. 37A to 37C illustrate examples of an input-output device.

FIG. 33A is a top view of the input-output device. FIG. 33B and FIG. 37A are cross-sectional views each taken along the dashed-dotted line A-B and dashed-dotted line C-D in FIG. 33A. Specifically, FIG. 33B and FIG. 37A show an application example of the structure example a-3 and an application example of the structure example b-3, respectively. FIG. 33C is a cross-sectional view taken along the dashed-dotted line E-F in FIG. 33A.

An input-output device 390 illustrated in FIG. 33A includes the display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 33B and 33C and FIG. 37A, the input-output device 390 includes the first flexible substrate 701, the first bonding layer 703, the first insulating layer 705, the second flexible substrate 711, the second bonding layer 713, the second insulating layer 715. The first and second flexible substrates 701 and 711 are attached to each other with a third bonding layer 360.

The input-output device in FIG. 33B has a portion where the thickness continuously (smoothly) decreases from the display portion side of the non-display portion to an end portion of the input-output device. In FIG. 37A, a depression is formed in the non-display portion. In the depression, the thickness of the third bonding layer 360 is small. With the above structure, entry of impurities through a side surface of the input-output device can be inhibited.

The first flexible substrate 701 and the first insulating layer 705 are attached to each other with the first bonding layer 703. The second flexible substrate 711 and the second insulating layer 715 are attached to each other with the second bonding layer 713. Embodiment 2 can be referred to for materials used for the substrates, the bonding layers, and the insulating layers.

Each of the pixels 302 includes the sub-pixel 302R, a sub-pixel 302G, and a sub-pixel 302B (see FIG. 33C).

For example, the sub-pixel 302R includes the light-emitting element 350R and the pixel circuit. The pixel circuit includes a transistor 302*t* that can supply electric power to the light-emitting element 350R. The sub-pixel 302R further includes an optical element (e.g., a coloring layer 367R that transmits red light).

The light-emitting element 350R includes a lower electrode 351R, an EL layer 353, and an upper electrode 352, which are stacked in this order (see FIG. 33C).

The EL layer 353 includes a first EL layer 353*a*, an intermediate layer 354, and a second EL layer 353*b*, which are stacked in this order.

Note that a microcavity structure can be provided for the light-emitting element 350R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The sub-pixel 302R includes the third bonding layer 360 that is in contact with the light-emitting element 350R and the coloring layer 367R. The coloring layer 367R is positioned in a region overlapping with the light-emitting element 350R. Accordingly, part of light emitted from the light-emitting element 350R passes through the third bonding layer 360 and through the coloring layer 367R and is emitted to the outside of the sub-pixel 302R as indicated by an arrow in FIG. 33B or 33C.

The input-output device 390 includes a light-blocking layer 367BM. The light-blocking layer 367BM is provided so as to surround the coloring layer (e.g., the coloring layer 367R).

The input-output device 390 includes an anti-reflective layer 367*p* positioned in a region overlapping with the display portion 301. As the anti-reflective layer 367*p*, a circular polarizing plate can be used, for example.

The input-output device 390 includes an insulating layer 321. The insulating layer 321 covers the transistor 302*t* and the like. Note that the insulating layer 321 can be used as a layer covering unevenness caused by the pixel circuits and the imaging pixel circuits to provide a flat surface. The transistor 302*t* and the like are preferably covered with an insulating layer that can inhibit diffusion of impurities to the transistor 302*t* and the like.

The input-output device 390 includes a partition 328 that overlaps with an end portion of the lower electrode 351R. A spacer 329 that controls the gap between the first flexible substrate 701 and the second flexible substrate 711 is provided on the partition 328.

The image signal line driver circuit 303*s*(1) includes a transistor 303*t* and a capacitor 303*c*. Note that the driver circuit can be formed in the same process and over the same substrate as those of the pixel circuits. As illustrated in FIG. 33B and FIG. 37A, the transistor 303*t* may include a second gate 304 over the insulating layer 321. The second gate 304 may be electrically connected to a gate of the transistor 303*t*, or different potentials may be supplied to these gates. Alternatively, if necessary, the second gate 304 may be provided for a transistor 308*t*, the transistor 302*t*, or the like.

The imaging pixels 308 each include a photoelectric conversion element 308*p* and an imaging pixel circuit. The imaging pixel circuit can sense light received by the photoelectric conversion element 308*p*. The imaging pixel circuit includes the transistor 308*t*. For example, a PIN photodiode can be used as the photoelectric conversion element 308*p*.

The input-output device 390 includes a wiring 311 through which a signal is supplied. The wiring 311 is provided with a terminal 319. An FPC 309 through which a signal such as an image signal or a synchronization signal is supplied is electrically connected to the terminal 319. A printed wiring board (PWB) may be attached to the FPC 309.

Note that transistors such as the transistors 302*t*, 303*t*, and 308*t* can be formed in the same process. Alternatively, the transistors may be formed in different processes.

Structure Example 2

Figure 34A:
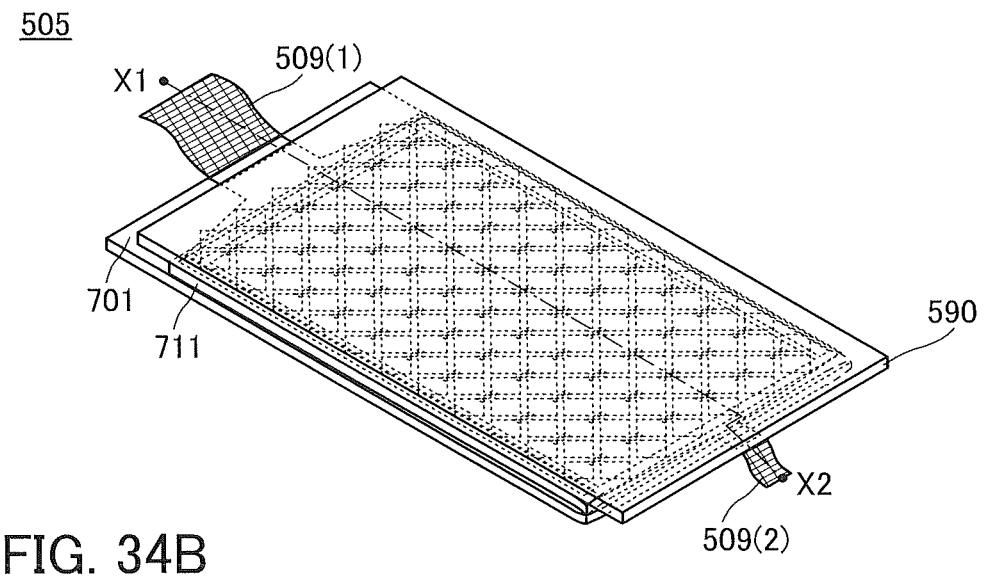
FIGS. 34A and 34B illustrate an example of an input-output device.
Figure 34B:
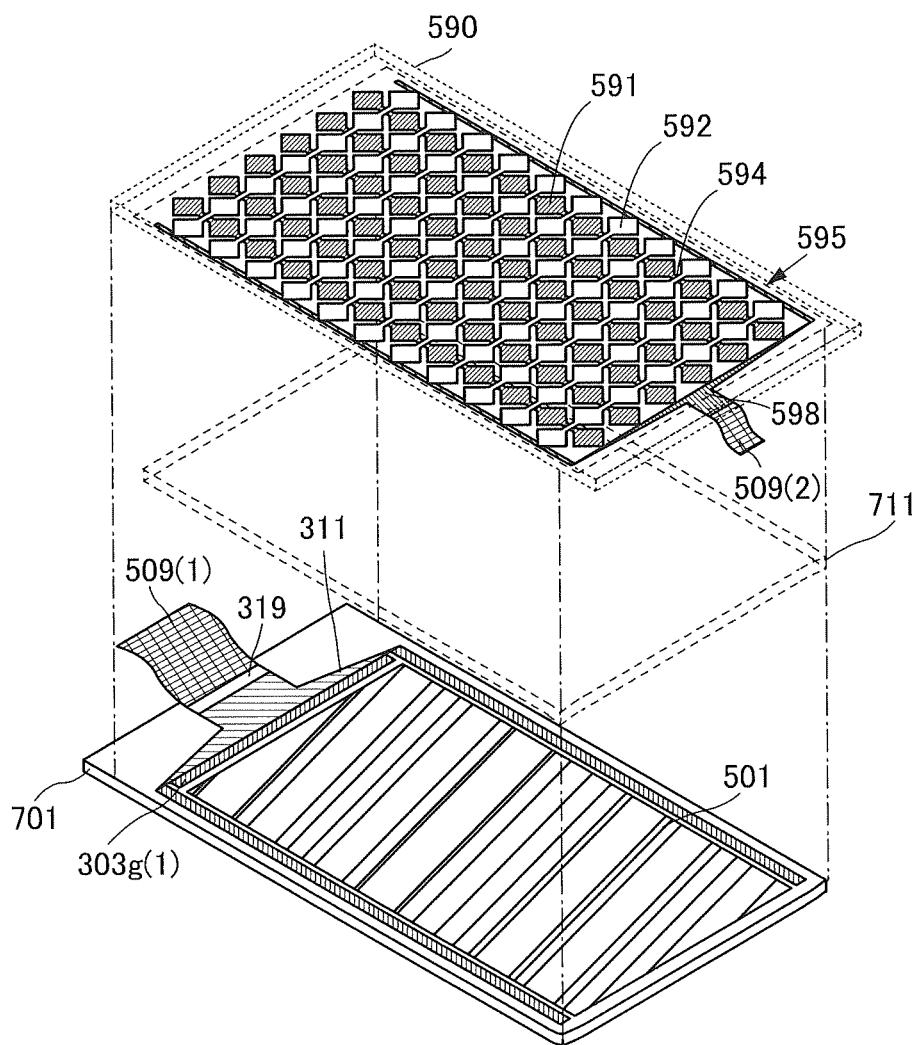
Figure 35A:
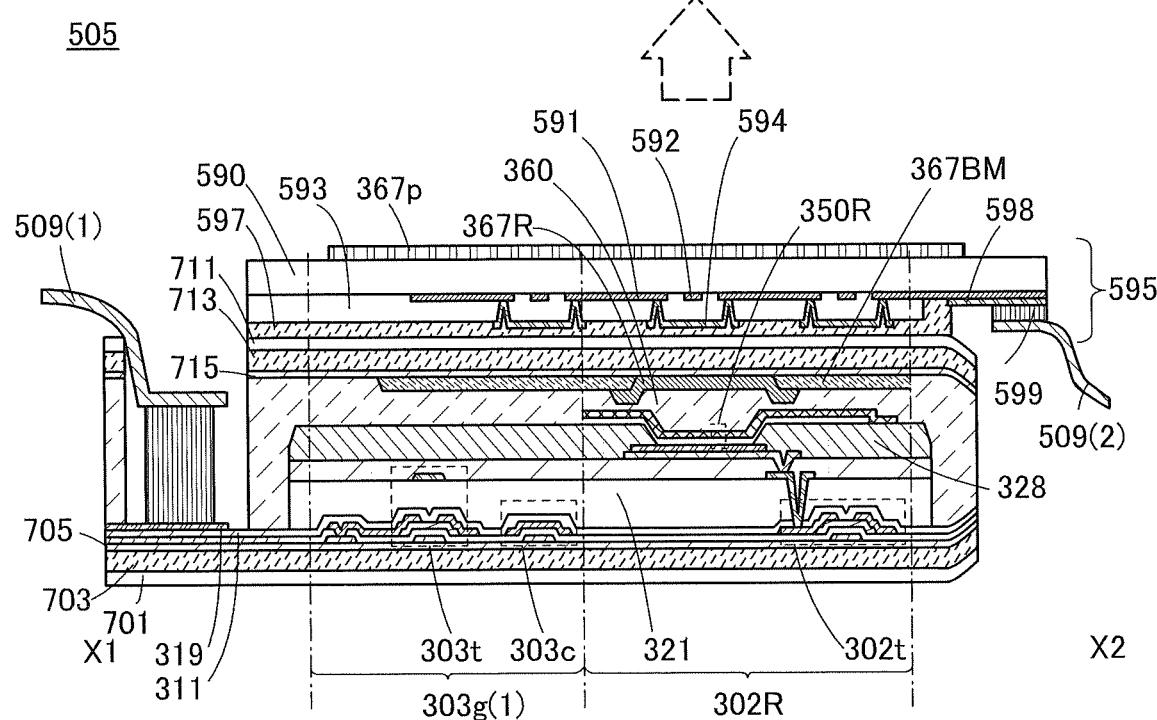
FIGS. 35A and 35B illustrate examples of an input-output device.
Figure 37B:
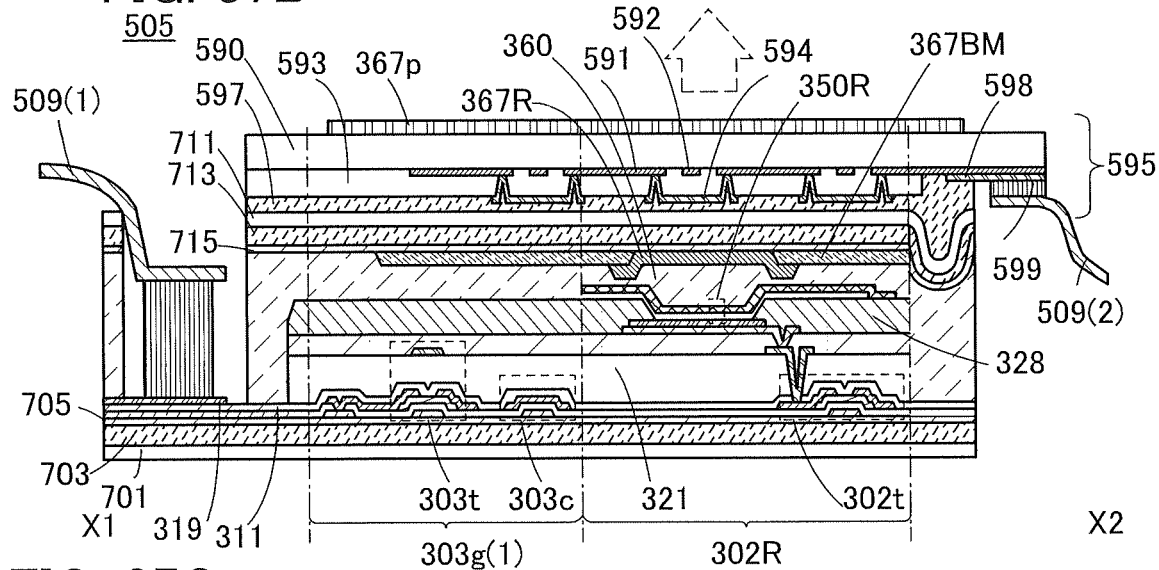

FIGS. 34A and 34B are perspective views of an input-output device 505. FIGS. 34A and 34B illustrate only main components for simplicity. FIG. 35A is a cross-sectional view taken along the dashed-dotted line X1-X2 in FIG. 34A. FIG. 35A illustrates an application example of the structure example a-3. As a modification example, FIG. 37B illustrates an application example of the structure example b-3.

As illustrated in FIGS. 34A and 34B, the input-output device 505 includes the display portion 501, the scan line driver circuit 303*g*(1), a touch sensor 595, and the like. Furthermore, the input-output device 505 includes the first flexible substrate 701, the second flexible substrate 711, and a flexible substrate 590.

The input-output device 505 includes a plurality of pixels and a plurality of wirings 311. The plurality of wirings 311 can supply signals to the pixels. The plurality of wirings 311 are arranged to a peripheral portion of the first flexible substrate 701, and part of the plurality of wirings 311 form the terminal 319. The terminal 319 is electrically connected to an FPC 509(1).

The input-output device 505 includes the touch sensor 595 and a plurality of wirings 598. The plurality of wirings 598 are electrically connected to the touch sensor 595. The plurality of wirings 598 are arranged to a peripheral portion of the flexible substrate 590, and part of the plurality of wirings 598 forms a terminal. The terminal is electrically connected to an FPC 509(2). Note that in FIG. 34B, electrodes, wirings, and the like of the touch sensor 595 provided on the back side of the flexible substrate 590 (the side facing the first flexible substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self-capacitive touch sensor and a mutual capacitive touch sensor. The use of a mutual capacitive touch sensor is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 34A and 34B.

The electrodes 591 each have a quadrangular shape and are arranged in a direction intersecting with the direction in which the electrodes 592 extend. Note that the plurality of electrodes 591 are not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which one electrode 592 is positioned. The intersecting area of the electrode 592 and the wiring 594 is preferably as small as possible. Such a structure allows a reduction in the area of a region where the electrodes are not provided, reducing unevenness in light transmittance. As a result, unevenness in luminance of light emitted through the touch sensor 595 can be reduced.

Note that the shapes of the electrodes 591 and the electrodes 592 are not limited to the above-mentioned shapes and can be any of a variety of shapes.

As illustrated in FIG. 35A and FIG. 37B, the input-output device 505 includes the first flexible substrate 701, the first bonding layer 703, the first insulating layer 705, the second flexible substrate 711, the second bonding layer 713, the second insulating layer 715. The first and second flexible substrates 701 and 711 are attached to each other with the third bonding layer 360.

A bonding layer 597 attaches the flexible substrate 590 to the second flexible substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. A film including graphene may be used as well. The film including graphene can be formed, for example, by reducing a film including graphene oxide. As a reducing method, heating or the like can be employed.

Note that as an example of a material for the conductive films such as the electrodes 591, the electrodes 592, and the wirings 594, that is, wirings and electrodes forming a touch panel, a transparent conductive film including indium oxide, tin oxide, zinc oxide, or the like (e.g., ITO) can be given. The resistance of materials used for wirings and electrodes of the touch panel is preferably low. For example, silver, copper, aluminum, a carbon nanotube, graphene, or a metal halide (such as silver halide) may be used. Alternatively, a metal nanowire including a plurality of conductors with an extremely small width (for example, a diameter of several nanometers) may be used. Further alternatively, a metal mesh which is a net-like conductor may be used. For example, an Ag nanowire, a Cu nanowire, an Al nanowire, an Ag mesh, a Cu mesh, or an Al mesh may be used. In the case of using an Ag nanowire for a wiring or an electrode of the touch panel, a visible light transmittance of 89% or more and a sheet resistance of 40 Ω/square or more and 100 Ω/square or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

The electrodes 591 and the electrodes 592 can be formed by depositing a light-transmitting conductive material on the flexible substrate 590 by a sputtering method and then removing an unneeded portion by a variety of patterning technique such as photolithography.

The electrodes 591 and the electrodes 592 are covered with an insulating layer 593. Openings reaching the electrodes 591 are formed in the insulating layer 593, and the wiring 594 electrically connects the adjacent electrodes 591. A light-transmitting conductive material can be favorably used as the wiring 594 because the aperture ratio of the input-output device can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

A connection layer 599 electrically connects the wirings 598 to the FPC 509(2).

The display portion 501 includes a plurality of pixels arranged in a matrix. Each pixel has the same structure as Structure Example 1; thus, description is omitted.

Figure 35B:
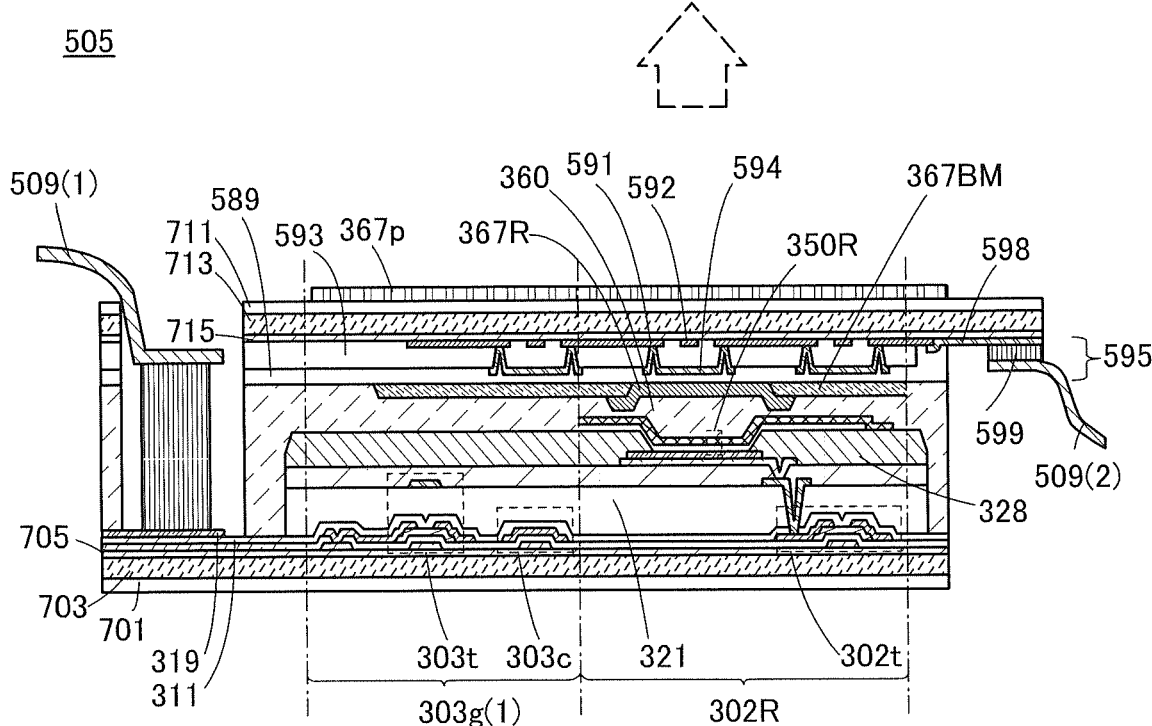

As illustrated in FIG. 35B, the touch panel may include two substrates of the first flexible substrate 701 and the second flexible substrate 711 without including the flexible substrate 590. The second flexible substrate 711 and the second insulating layer 715 are attached to each other with the second bonding layer 713, and the touch sensor 595 is provided in contact with the second insulating layer 715. The coloring layer 367R and the light-blocking layer 367BM are provided in contact with the insulating layer 589 that covers the touch sensor 595. The insulating layer 589 is not necessarily provided, in which case the coloring layer 367R and the light-blocking layer 367BM are provided in contact with the wiring 594.

Structure Example 3

Figure 36A:
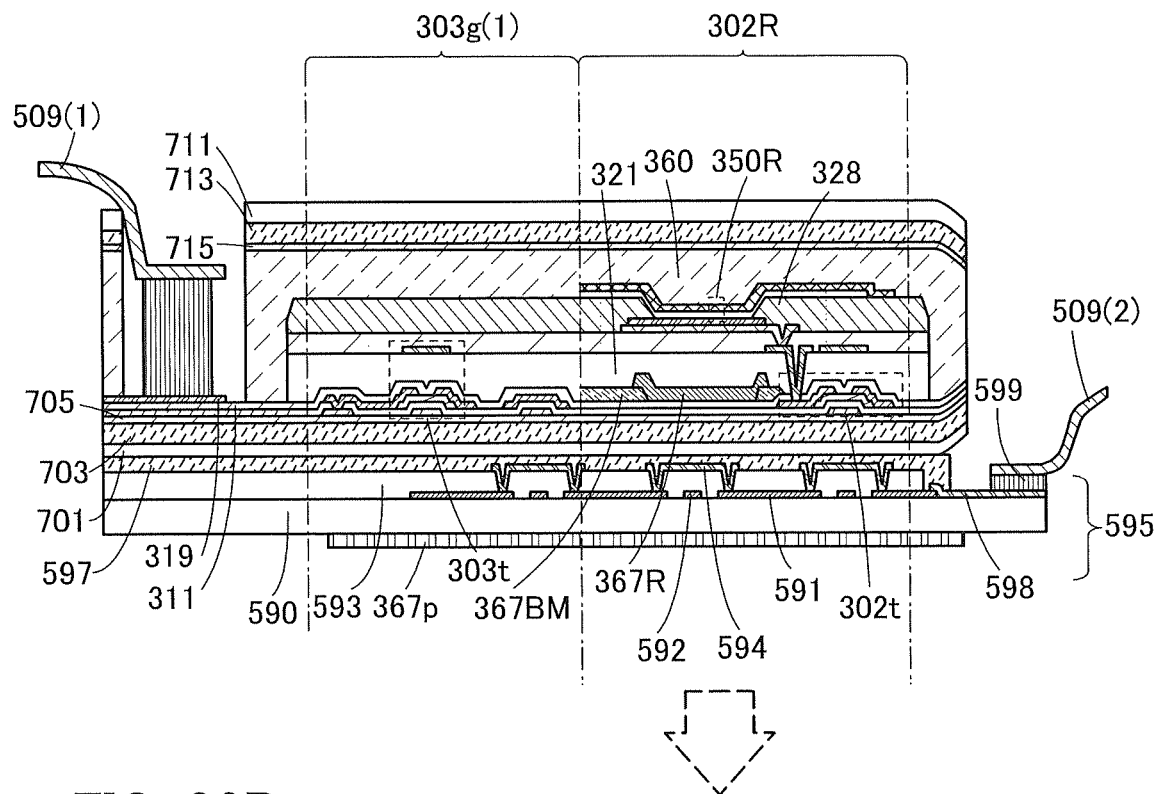
FIGS. 36A to 36C illustrate examples of an input-output device.
Figure 36B:
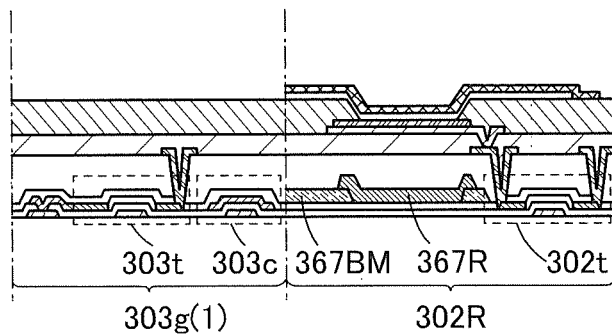
Figure 36C:
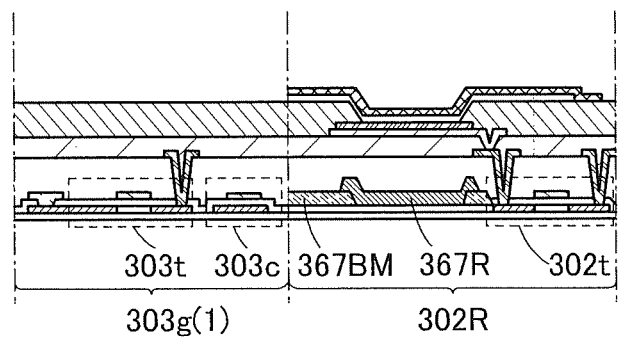

FIGS. 36A to 36C are cross-sectional views of an input-output device 505B. The input-output device 505B described in this embodiment is different from the input-output device 505 in Structure Example 2 in that received image data is displayed on the side where the transistors are provided and that the touch sensor is provided on the first flexible substrate 701 side of the display portion. Different structures will be described in detail below, and the above description is referred to for the other similar structures. FIG. 36A illustrates an application example of the structure example a-3. As a modification example, FIG. 37C illustrates an application example of the structure example b-3.

The coloring layer 367R is positioned in a region overlapping with the light-emitting element 350R. The light-emitting element 350R illustrated in FIG. 36A and FIG. 37C emits light to the side where the transistor 302t is provided. Accordingly, part of light emitted from the light-emitting element 350R passes through the coloring layer 367R and is emitted to the outside of the input-output device 505B as indicated by an arrow in FIG. 36A or FIG. 37C.

The input-output device 505B includes the light-blocking layer 367BM on the light extraction side. The light-blocking layer 367BM is provided so as to surround the coloring layer (e.g., the coloring layer 367R).

Figure 37C:
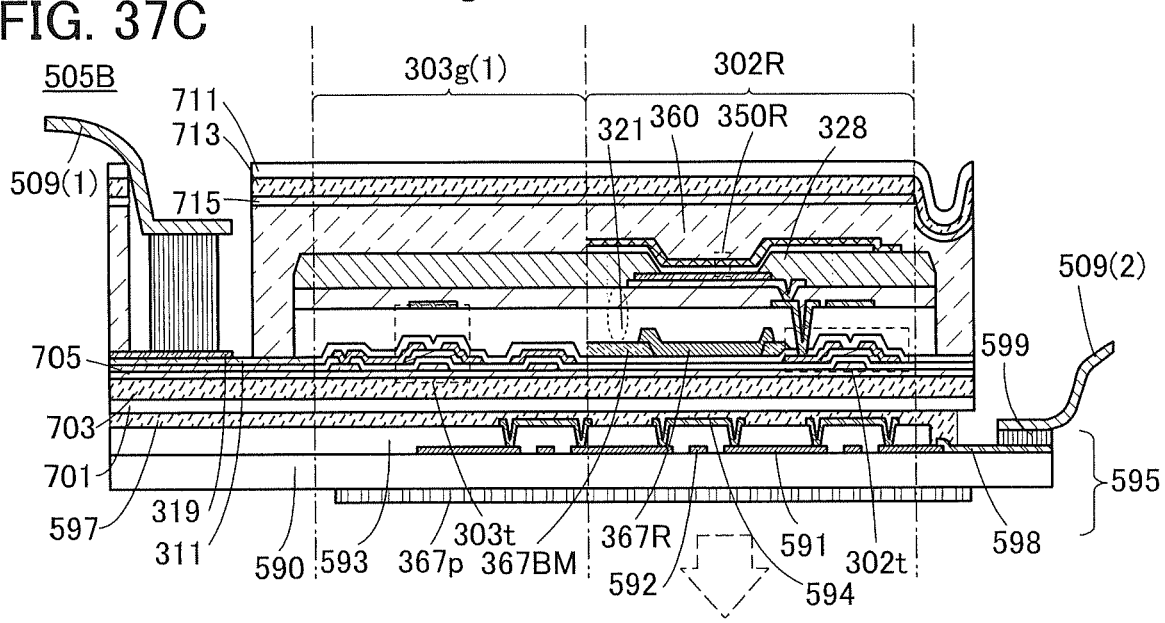

The touch sensor 595 is provided not on the second flexible substrate 711 side but on the first flexible substrate 701 side (see FIG. 36A and FIG. 37C).

The bonding layer 597 attaches the flexible substrate 590 to the first flexible substrate 701 so that the touch sensor 595 overlaps with the display portion. The bonding layer 597 has a light-transmitting property.

Note that a structure in the case of using bottom-gate transistors in the display portion 501 is illustrated in FIGS. 36A and 36B and FIG. 37C.

For example, a semiconductor layer containing an oxide semiconductor, amorphous silicon, or the like can be used in the transistor 302*t* and the transistor 303*t* illustrated in FIG. 36A and FIG. 37C.

For example, a semiconductor layer containing polycrystalline silicon can be used in the transistor 302*t* and the transistor 303*t* illustrated in FIG. 36B.

A structure in the case of using top-gate transistors is illustrated in FIG. 36C.

For example, a semiconductor layer containing polycrystalline silicon, a single crystal silicon film that is transferred from a single crystal silicon substrate, or the like can be used in the transistor 302*t* and the transistor 303*t* illustrated in FIG. 36C.

This embodiment can be combined with any other embodiment as appropriate.

Embodiment 4

In this embodiment, electronic devices and lighting devices of embodiments of the present invention will be described with reference to drawings.

With the use of the light-emitting device, the display device, the input-output device, or the like of one embodiment of the present invention, an electronic device or a lighting device with high reliability can be fabricated. Furthermore, with the use of the light-emitting device, the display device, the input-output device, or the like of one embodiment of the present invention, an electronic device or a lighting device with high reliability that has a curved surface or flexibility can be fabricated.

Examples of electronic devices include a television set (also referred to as a television or a television receiver), a monitor of a computer or the like, a digital camera, a digital video camera, a digital photo frame, a mobile phone (also referred to as a cellular phone or a mobile phone device), a portable game console, a portable information terminal, an audio reproducing device, and a large game machine such as a pinball machine.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

FIGS. 38A, 38B, 38C1, 38C2, 38D, and 38E illustrate examples of an electronic device including a display portion 7000 with a curved surface. The display surface of the display portion 7000 is curved, and images can be displayed on the curved display surface. The display portion 7000 may be flexible.

The display portion 7000 is formed using the light-emitting device, the display device, the input-output device, or the like of one embodiment of the present invention.

One embodiment of the present invention makes it possible to provide an electronic device having a curved display portion and high reliability.

FIG. 38A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 38A includes a touch sensor in the display portion 7000. Moreover, operations such as making a call and inputting characters can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

FIG. 38B illustrates an example of a television set. In the television set 7200, the display portion 7000 is incorporated into the housing 7201. Here, the housing 7201 is supported by a stand 7203.

The television set 7200 illustrated in FIG. 38B can be operated with an operation switch of the housing 7201 or a separate remote controller 7211. The display portion 7000 may include a touch sensor. The television set 7200 can be operated by touching the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 38C1, 38C2, 38D, and 38E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 38C1 is a perspective view of a portable information terminal 7300. FIG. 38C2 is a top view of the portable information terminal 7300. FIG. 38D is a perspective view of a portable information terminal 7310. FIG. 38E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals described in this embodiment is capable of executing a variety of applications such as mobile phone calls, e-mailing, reading and editing texts, music reproduction, Internet communication, and a computer game, for example.

The portable information terminals 7300, 7310, and 7320 can display characters and image data on its plurality of surfaces. For example, as illustrated in FIGS. 38C1 and 38D, three operation buttons 7302 can be displayed on one surface, and data 7303 indicated by a rectangle can be displayed on another surface. FIGS. 38C1 and 38C2 illustrate an example in which data is displayed at the top of the portable information terminal. FIG. 38D illustrates an example in which data is displayed on the side of the portable information terminal. Data may be displayed on three or more surfaces of the portable information terminal. FIG. 38E illustrates an example where data 7304, data 7305, and data 7306 are displayed on different surfaces.

Examples of the data include notification from a social networking service (SNS), display indicating reception of e-mail or an incoming call, the title of e-mail or the like, the sender of e-mail or the like, the date, the time, remaining battery, the reception strength of an antenna, and the like. Instead of the data, an operation button, an icon, or the like may be displayed on the position where the data is displayed.

For example, a user of the portable information terminal 7300 can see the display (here, the data 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 38F to 38H each illustrate an example of a lighting device having a curved light-emitting portion.

The light-emitting portion included in each of the lighting devices illustrated in FIGS. 38F to 38H can be manufactured using the light-emitting device or the like of one embodiment of the present invention.

One embodiment of the present invention makes it possible to provide a lighting device having a curved light-emitting portion and high reliability.

A lighting device 7400 illustrated in FIG. 38F includes a light-emitting portion 7402 having a wave-shaped light-emitting surface, which is a good-design lighting device.

A light-emitting portion 7412 included in the lighting device 7410 illustrated in FIG. 38G has two convex-curved light-emitting portions symmetrically placed. Thus, all directions can be illuminated with the lighting device 7410 as a center.

A lighting device 7420 illustrated in FIG. 38H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that an emission surface of the light-emitting portion can be curved freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 39A1, 39A2, and 39B to 39I illustrate examples of a portable information terminal including a display portion 7001 having flexibility.

The display portion 7001 is manufactured using the light-emitting device, the display device, the input-output device, or the like of one embodiment of the present invention. For example, a light-emitting device, a display device, or an input-output device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

One embodiment of the present invention makes it possible to provide a highly reliable electronic device including a display portion having flexibility.

FIG. 39A1 is a perspective view illustrating an example of a portable information terminal and FIG. 39A2 is a side view illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 39A1, 39A2, and 39B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 39B illustrates the portable information terminal 7500 in a state where the display portion 7001 is pulled out. Videos can be displayed on the display portion 7001 in this state. In addition, the portable information terminal 7500 may perform different displays in the state where part of the display portion 7001 is rolled as shown in FIG. 39A1 and in the state where the display portion 7001 is pulled out with the display portion tab 7502 as shown in FIG. 39B. For example, in the state shown in FIG. 39A1, the rolled portion of the display portion 7001 is put in a non-display state, which results in a reduction in power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 39C to 39E illustrate an example of a foldable portable information terminal. FIG. 39C illustrates a portable information terminal 7600 that is opened. FIG. 39D illustrates the portable information terminal 7600 that is being opened or being folded. FIG. 39E illustrates the portable information terminal 7600 that is folded. The portable information terminal 7600 is highly portable when folded, and is highly browsable when opened because of a large seamless display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 39F and 39G illustrate an example of a foldable portable information terminal. FIG. 39F illustrates a portable information terminal 7650 that is folded so that the display portion 7001 is on the inside. FIG. 39G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 39H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be changed in shape freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 39I illustrates an example of a wrist-watch-type portable information terminal. The portable information terminal 7800 includes a band 7801, the display portion 7001, an input-output terminal 7802, operation buttons 7803, and the like. The band 7801 has a function of a housing. A flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 40A:
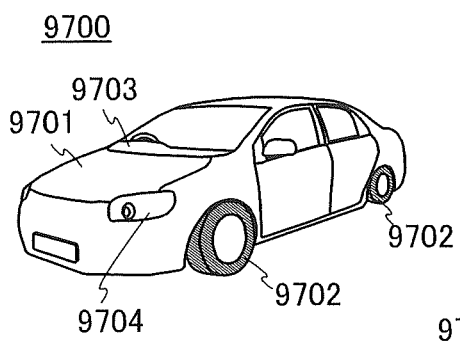
FIGS. 40A to 40E illustrate examples of an electronic device.
Figure 40B:
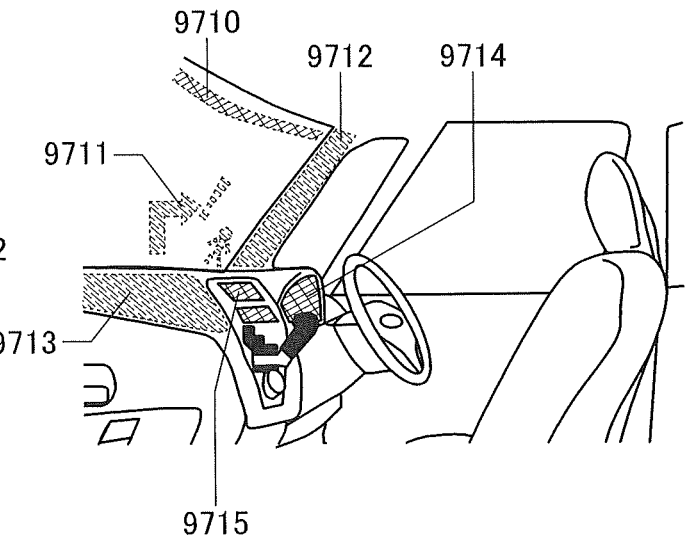

FIG. 40A is an external view of an automobile 9700. FIG. 40B illustrates a driver's seat of the automobile 9700. The automobile 9700 includes a car body 9701, wheels 9702, a dashboard 9703, lights 9704, and the like. The light-emitting device, the display device, the input-output device, or the like of one embodiment of the present invention can be used in a display portion or the like of the automobile 9700. For example, the light-emitting device, the display device, the input-output device, or the like of one embodiment of the present invention can be used in display portions 9710 to 9715 illustrated in FIG. 40B.

The display portion 9710 and the display portion 9711 are display devices provided in an automobile windshield. The light-emitting device, the display device, the input-output device, or the like of one embodiment of the present invention can be a see-through device, through which the opposite side can be seen, by using a light-transmitting conductive material for its electrodes and wirings. The see-through display portion 9710 and the see-through display portion 9711 do not hinder driver's vision during driving of the automobile 9700. Therefore, the light-emitting device, the display device, the input-output device, or the like of one embodiment of the present invention can be provided in the windshield of the automobile 9700. Note that in the case where a transistor or the like for driving the light-emitting device, the display device, the input-output device, or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 40C:
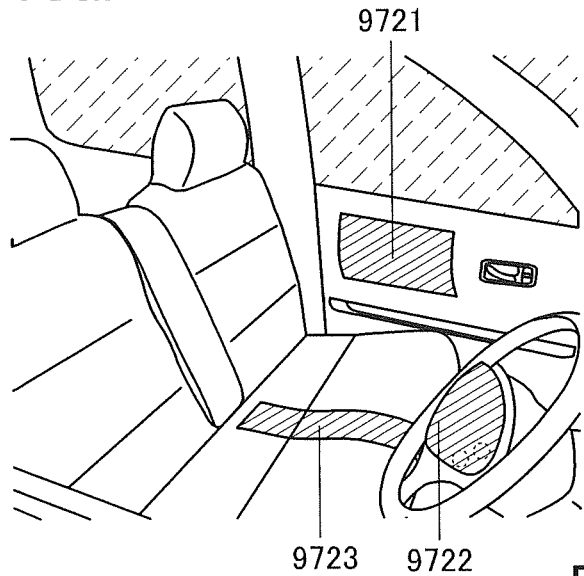

FIG. 40C illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of data such as navigation data, a speedometer, a tachometer, a mileage, a fuel meter, a gearshift indicator, and air-condition setting. The content, layout, or the like of the display on the display portions can be changed freely by a user as appropriate. The data listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portion in which the light-emitting device, display device, input-output device, or the like of one embodiment of the present invention is used may have a flat surface.

Figure 40D:
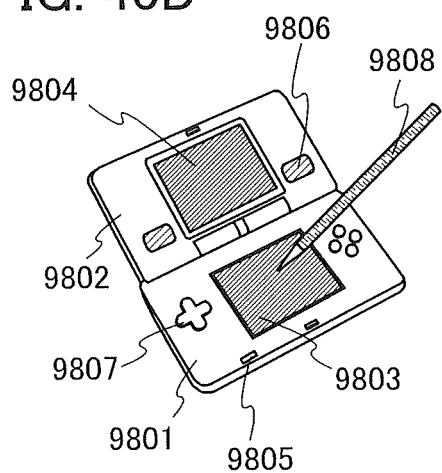

FIG. 40D illustrates a portable game console including a housing 9801, a housing 9802, a display portion 9803, a display portion 9804, a microphone 9805, a speaker 9806, an operation key 9807, a stylus 9808, and the like.

The portable game console shown in FIG. 40D includes two display portions 9803 and 9804. Note that the number of display portions of an electronic device of one embodiment of the present invention is not limited to two and can be one or three or more as long as at least one display portion includes the light-emitting device, the display device, the input-output device, or the like of one embodiment of the present invention.

Figure 40E:
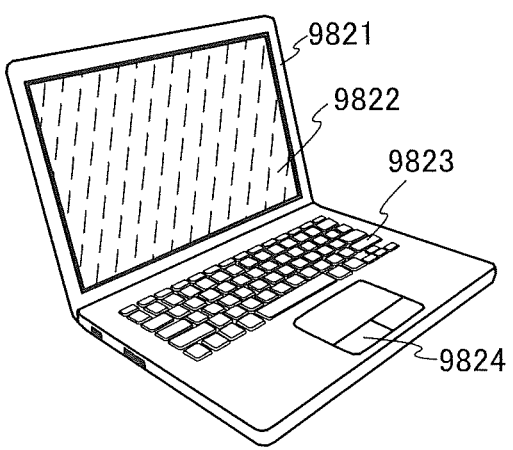

FIG. 40E illustrates a laptop personal computer, which includes a housing 9821, a display portion 9822, a keyboard 9823, a pointing device 9824, and the like.

This embodiment can be combined with any other embodiment as appropriate.

Example 1

In this example, description will be made on a sample fabricated with the use of one embodiment of the present invention.

The sample in this example was designed with a light-emitting device in mind. The sample had the structure of the light-emitting device described in Embodiment 2, but some components (the EL layer and the upper electrode) of the light-emitting element were not formed.

The sample had a region corresponding to a light-emitting portion, and a region corresponding to a non-light-emitting portion is provided outside the light-emitting portion to have a frame-like shape.

First, a method for manufacturing the sample is described with reference to FIGS. 8A to 8D, FIG. 9A, FIGS. 26B and 26C, and FIGS. 41A and 41B.

As illustrated in FIG. 8A, the separation layer 203 was formed over the formation substrate 201, and the insulating layer 205 was formed over the separation layer 203. A 0.7-mm-thick glass substrate was used as the formation substrate 201. A stacked-layer structure including a tungsten film and a tungsten oxide film was used as the separation layer 203. A stacked-layer structure including a silicon oxynitride film and a silicon nitride film was used as the insulating layer 205. The functional layer 206 included a transistor using an oxide semiconductor.

With reference to FIGS. 26B and 26C, a specific structure of a layer to be separated (the insulating layer 205 and the functional layer 206 in FIG. 8A) that was fabricated over the separation layer 203 in this example is described. As the layer to be separated, the insulating layer 705, the transistor 820, the insulating layer 815, the insulating layer 817a, the conductive layer 856, the insulating layer 817b, the lower electrode 831, the optical adjustment layer 832, the insulating layer 821, and the spacer 823 were formed.

In addition, as illustrated in FIG. 8B, the separation layer 223 was formed over the formation substrate 221, and the insulating layer 225 was formed over the separation layer 223. A glass substrate was used as the formation substrate 221. A stacked-layer structure including a tungsten film and a tungsten oxide film was used as the separation layer 223. A stacked-layer structure including a silicon oxynitride film and a silicon nitride film was used as the insulating layer 225.

With reference to FIG. 26B, a specific structure of the layer to be separated (the insulating layer 225 and the functional layer 226 in FIG. 8B) that was fabricated over the separation layer 223 in this example is described. As the layer to be separated, the insulating layer 715, the light-blocking layer 847, and the coloring layer 845 were formed.

Furthermore, under a reduced-pressure atmosphere, as illustrated in FIG. 8C, the formation substrate 201 and the formation substrate 221 overlapped with each other with the bonding layer 207 and the frame-like partition 209 provided therebetween. A thermosetting resin was used for the bonding layer 207, and an ultraviolet curable resin was used for the partition 209. The bonding layer 207 was formed by a printing method, and the partition 209 was formed by a dispensing method. Note that the bonding layer 207 was formed to a thickness of greater than or equal to approximately 5 μm and less than or equal to approximately 8 μm.

Figure 41A:
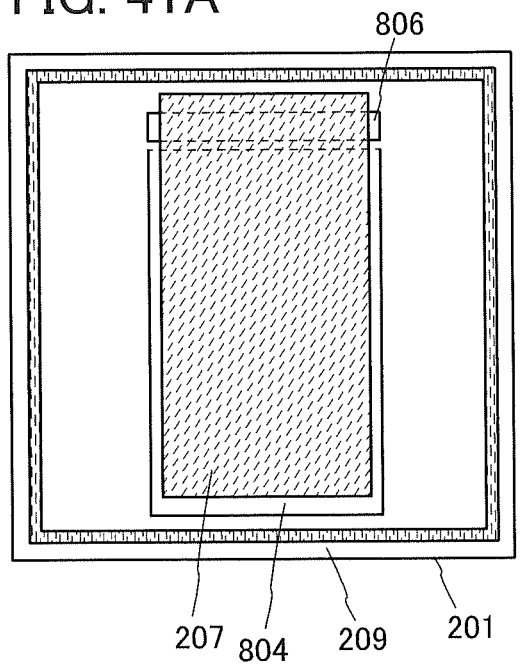
FIGS. 41A to 41C illustrate methods for manufacturing a sample of Example 1.

The bonding layer 207 and the partition 209 were positioned as illustrated in FIG. 41A. The bonding layer 207 was formed to overlap with the light-emitting portion 804 and the driver circuit portion 806.

In this example, the bonding layer 207 was provided such that an end portion thereof was on an inner side of end portions of the driver circuit portion 806 and the light-emitting portion 804.

In this example, the bonding layer 207 was formed such that the non-light-emitting portion had, on three sides of the sample, a portion with a thickness smaller than that of the light-emitting portion. As illustrated in FIG. 41A, the bonding layer 207 was provided such that an end portion of the bonding layer 207 was on an inner side of three sides of the light-emitting portion 804 other than the side thereof adjacent to the driver circuit portion 806.

Figure 41B:
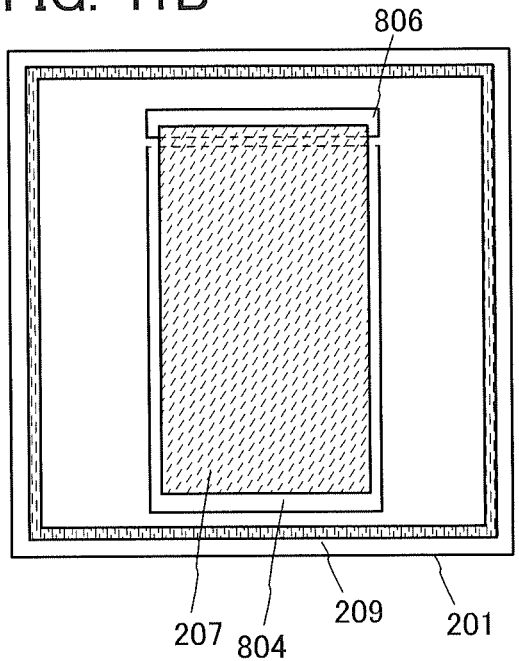

The bonding layer 207 overlapped with two sides of the driver circuit portion 806 in this example; however, in the case where the non-light-emitting portion has a portion with a thickness smaller than that of the light-emitting portion on all the four sides of the sample, for example, the bonding layer 207 may overlap with only one side of the driver circuit portion 806 (the side adjacent to the light-emitting portion 804) as illustrated in FIG. 41B.

Figure 41C:
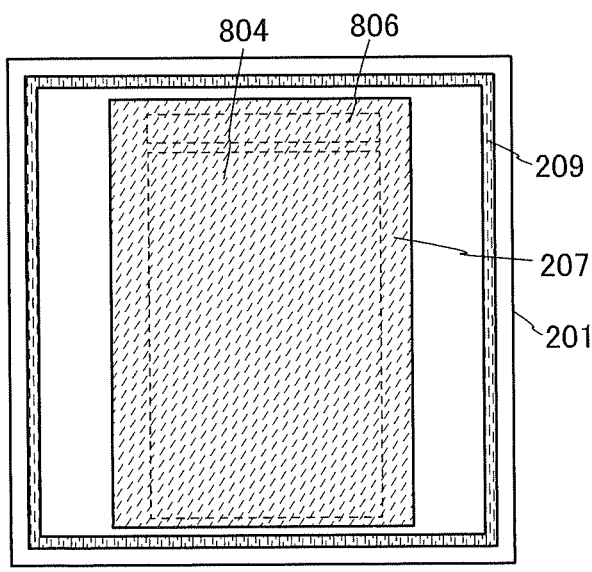

In the case where the bonding layer 207 is provided as illustrated in FIG. 41A or 41B, the difference between the thickness of the non-light-emitting portion and that of the light-emitting portion can be increased as compared to the case where end portions of the bonding layer 207 are provided on an outer side of end portions of the driver circuit portion 806 and the light-emitting portion 804 as illustrated in FIG. 41C. The plan layout or thickness of the bonding layer is appropriately adjusted in accordance with the size of the sample or the viscosity of an adhesive.

The partition 209 was formed on an outer side of the light-emitting portion 804 and the driver circuit portion 806. The partition 209 was formed along the periphery of the substrate to have a frame-like shape. The partition 209 was provided so as not to be in contact with the bonding layer 207, with a gap left therebetween.

Next, the formation substrate 201 and the formation substrate 221 were exposed to an air atmosphere and irradiated with ultraviolet light, so that the partition 209 was cured; then, the bonding layer 207 was cured by heating.

After that, a separation starting point was formed by laser light irradiation, and the insulating layer 205 and the formation substrate 201 were separated from each other (FIG. 9A).

Figure 42A:
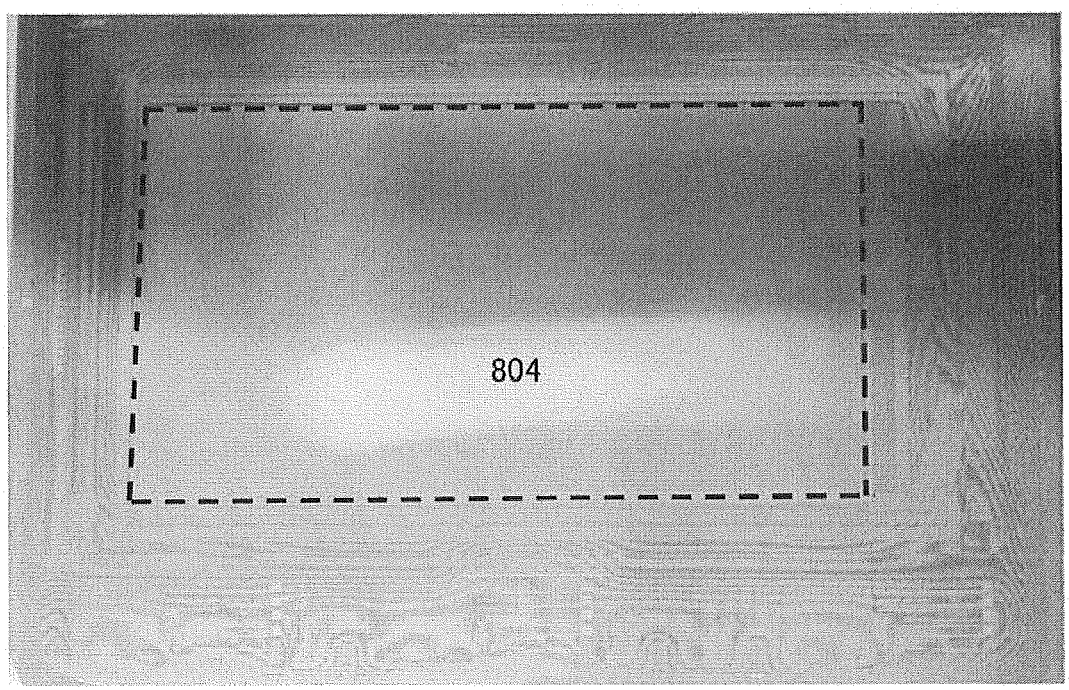
FIGS. 42A and 42B are photographs showing results of Example 1.
Figure 42B:
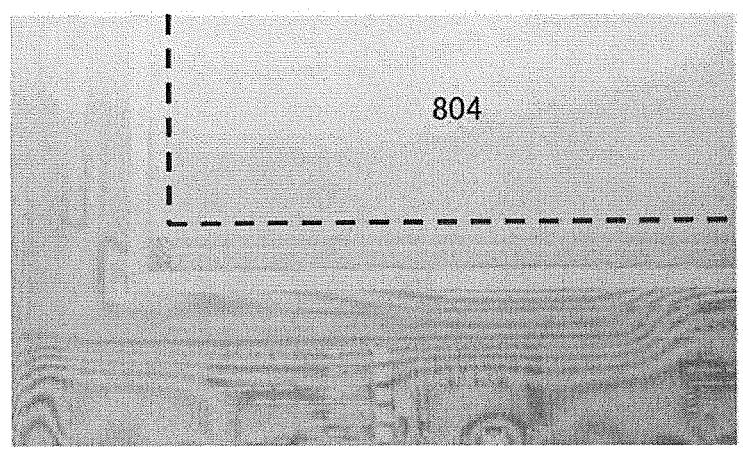

A photograph of the sample at this stage is shown in FIG. 42A. The photograph in FIG. 42A was taken from the insulating layer 205 side in FIG. 9A. FIG. 42B shows an enlarged view of a lower left portion of the light-emitting portion 804 in FIG. 42A.

As shown in FIGS. 42A and 42B, interference fringes were observed outside the light-emitting portion 804. It was thus found that outside the light-emitting portion 804, the thickness of the sample changed toward an end portion thereof. No interference fringe was observed in the light-emitting portion 804. Cross-sectional observation did not show a portion where the thickness of the sample is different considerably from that in other portions. Therefore, the non-light-emitting portion presumably had a portion where the thickness smoothly (continuously) changed.

The results of this example showed that one embodiment of the present invention enables the light-emitting portion of the light-emitting device to have a uniform thickness and to form a portion thinner than the light-emitting portion in the non-light-emitting portion. It was thus suggested that entry of moisture and the like through an end portion of the light-emitting device can be inhibited and high reliability can be achieved without impairing display quality of the light-emitting device.

Example 2

In this example, description will be made on a sample fabricated with the use of one embodiment of the present invention. The sample fabricated in this example corresponds to the structure example b-3 (FIGS. 16A and 16B).

First, a method for manufacturing the sample is described with reference to FIGS. 16A and 16B, FIGS. 19A and 19B, FIGS. 21A to 21D, and FIGS. 26B and 26C.

As illustrated in FIG. 21A, the separation layer 203 was formed over the formation substrate 201, and the insulating layer 205 was formed over the separation layer 203. A 0.7-mm-thick glass substrate was used as the formation substrate 201. A stacked-layer structure including a tungsten film and a tungsten oxide film was used as the separation layer 203. A stacked-layer structure including a silicon oxynitride film and a silicon nitride film was used as the insulating layer 205. The functional layer 206 included a transistor using an oxide semiconductor and an organic EL element. Although not illustrated in FIG. 21A, the functional layer 204 was also formed over the insulating layer 205 (see FIG. 16A). The functional layer 204 included a transistor using an oxide semiconductor.

With reference to FIGS. 26B and 26C, a specific structure of a layer to be separated (the insulating layer 205 and the functional layer 206 in FIG. 21A) that was fabricated over the separation layer 203 in this example is described. As the layer to be separated, the insulating layer 705, the transistor 820, the insulating layer 815, the insulating layer 817a, the conductive layer 856, the insulating layer 817b, the lower electrode 831, the optical adjustment layer 832, the insulating layer 821, the spacer 823, the EL layer 833, and the upper electrode 835 were formed.

In addition, as illustrated in FIG. 21B, the separation layer 223 was formed over the formation substrate 221, and the insulating layer 225 was formed over the separation layer 223.

A 0.7-mm-thick glass substrate was used as the formation substrate 221. A stacked-layer structure including a tungsten film and a tungsten oxide film was used as the separation layer 223. A stacked-layer structure including a silicon oxynitride film and a silicon nitride film was used as the insulating layer 225.

With reference to FIG. 26B, a specific structure of the layer to be separated (the insulating layer 225 and the functional layer 226 in FIG. 21B) that was fabricated over the separation layer 223 in this example is described. As the layer to be separated, the insulating layer 715, the light-blocking layer 847, and the coloring layer 845 were formed.

Furthermore, under a reduced-pressure atmosphere, as illustrated in FIG. 21C, the formation substrate 201 and the formation substrate 221 overlapped with each other with the bonding layer 207, the frame-like partition 242, and the frame-like temporary sealing layer 244 provided therebetween. A thermosetting resin was used for the bonding layer 207, and an ultraviolet curable resin was used for the frame-like partition 242 and the frame-like temporary sealing layer 244.

The frame-like temporary sealing layer 244 was cured by irradiation with ultraviolet light.

Next, the formation substrate 201 and the formation substrate 221 were exposed to an air atmosphere, and pressure application was performed using a hot press as illustrated in FIG. 19A.

Quartz substrates were used as the substrate 2100a and the substrate 2100b. A glass substrate was used as the substrate 2101. The projection 2102 was formed by curing of a resin. The projection 2102 was formed over the substrate 2101 to have a frame-like shape as illustrated in FIG. 19B. The projection 2102 had a width of approximately 1 mm and a height of approximately 0.1 mm.

With the hot press, a load of 1.0 t was applied to the light-emitting device 10 and the temperature was then raised to 100° C. using a heat source, so that pressure application and heating were performed for 1 hour.

Next, a separation starting point was formed by laser light irradiation, the insulating layer 205 and the formation substrate 201 were separated from each other, and the substrate 251 was attached to the exposed insulating layer 205 with the use of the bonding layer 253. A thermosetting resin was used for the bonding layer 253, which was cured by heating.

Next, a separation starting point was formed by cutting four sides of the substrate 251 with a cutter, the insulating layer 225 and the formation substrate 221 were separated from each other, and the substrate 259 was attached to the exposed insulating layer 225 with the use of the bonding layer 257. A thermosetting resin was used for the bonding layer 257, which was cured by heating.

In the above manner, the light-emitting device illustrated in FIGS. 16A and 16B was fabricated.

Interference fringes were observed in the portion to which pressure was applied and the vicinity thereof in the non-light-emitting portion of the light-emitting device fabricated in this example. It was thus found that in the non-light-emitting portion, the thickness changed. The portion where interference fringes were formed had a width of approximately 2 mm. No interference fringe was observed in the light-emitting portion.

Figure 43A:
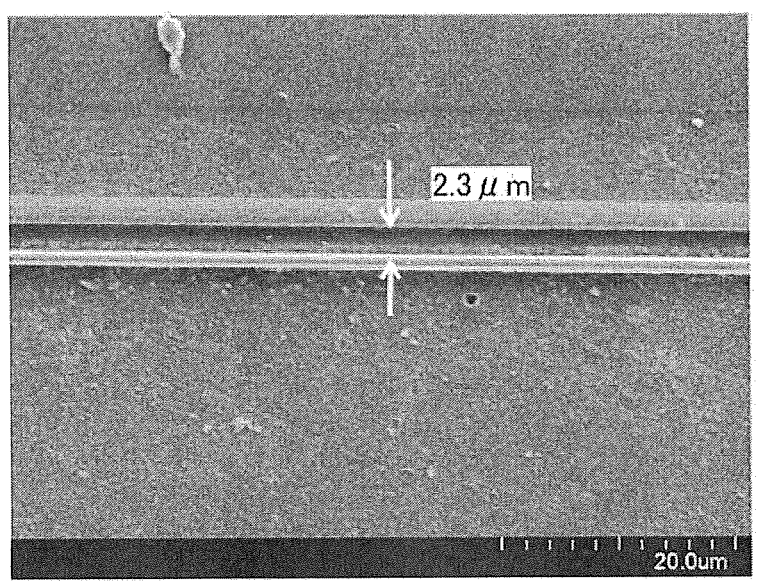
FIGS. 43A to 43C are photographs of observed cross sections of a light-emitting device of Example 2.
Figure 43B:
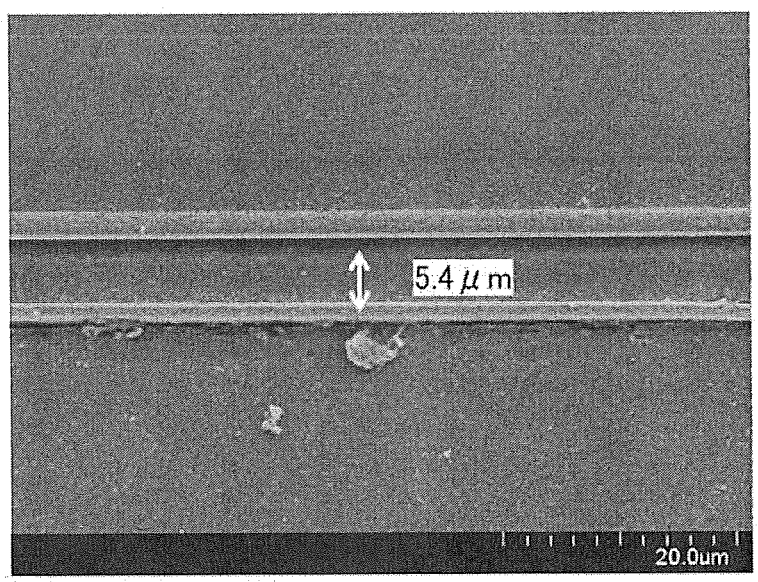
Figure 43C:
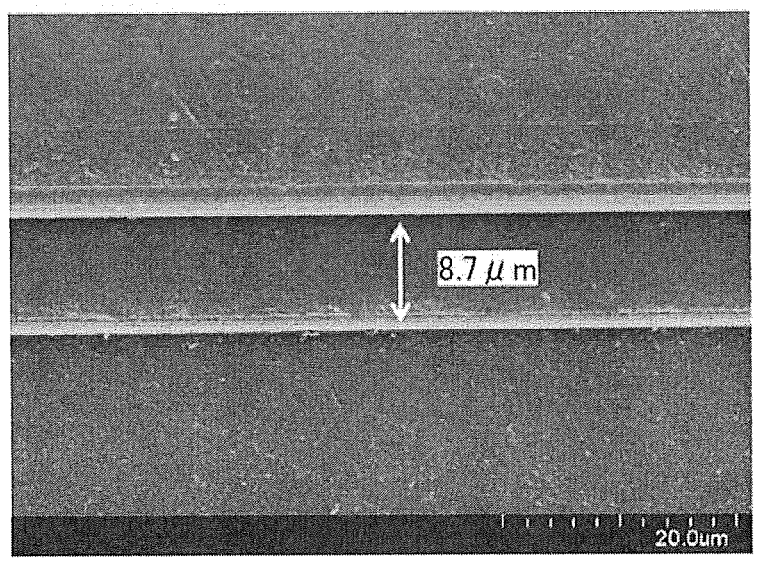
Figure 44A:
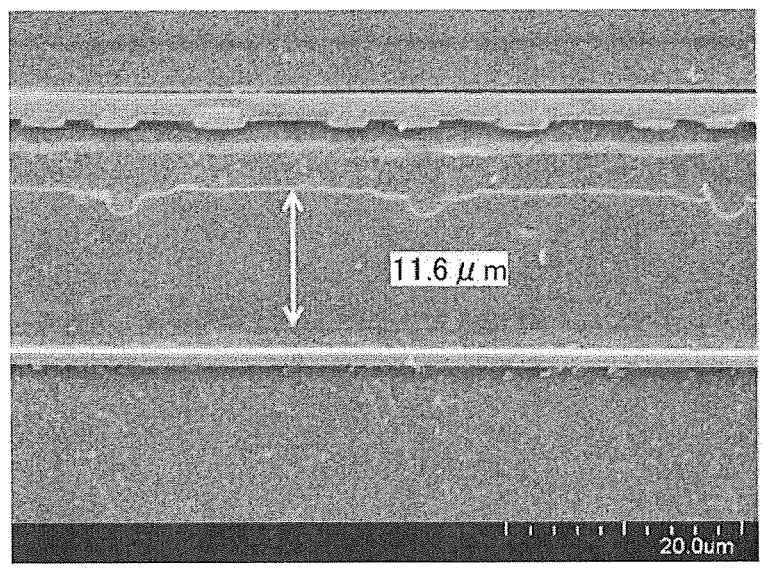
FIGS. 44A and 44B are photographs of observed cross sections of a light-emitting device of Example 2.
Figure 44B:
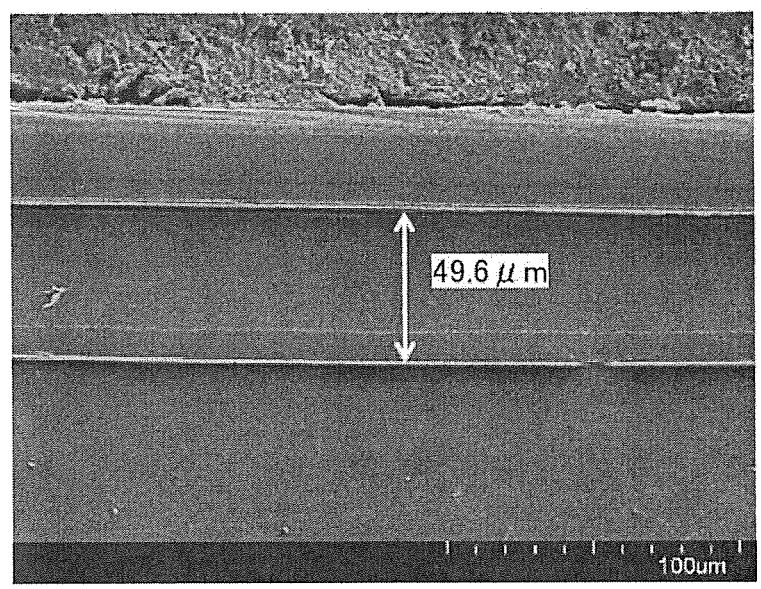

Cross-sectional observation of the light-emitting device fabricated in this example was performed. The cross-sectional observation was performed with the use of a scanning electron microscope (SEM). FIGS. 43A and 43B show cross-sectional observation images of the portion of the non-light-emitting portion to which pressure was applied and the vicinity thereof. FIG. 43C shows a cross-sectional observation image of the non-light-emitting portion in a portion closer to the light-emitting portion than the portion to which pressure was applied was. FIG. 44A shows a cross-sectional observation image of the light-emitting portion. FIG. 44B shows a cross-sectional observation image of the non-light-emitting portion in a portion closer to an end portion of the light-emitting portion than the portion to which pressure was applied was.

The thicknesses of the bonding layer 207 are also shown in FIGS. 43A to 43C and FIGS. 44A and 44B. As can be observed in FIGS. 43A to 43C, the thickness of the bonding layer 207 in the non-light-emitting portion was different by location. It was found that while having a thickness of approximately 8.7 µm away from the portion to which pressure was applied, the bonding layer 207 had a thickness as small as approximately 2.3 µm in the portion to which pressure was applied. As shown in FIG. 44A, the bonding layer 207 had a thickness of approximately 11.6 µm in the light-emitting portion. In addition, as shown in FIG. 44B, in the non-light-emitting portion in the portion closer to an end portion of the light-emitting device than the portion to which pressure was applied was, the bonding layer 207 had a thickness of 49.6 µm, which was much larger than the thicknesses of other portions. It was thus suggested that the light-emitting device had a larger thickness in an end portion than in the light-emitting portion (see FIG. 16C).

Note that in the light-emitting device fabricated in this example, light was emitted from the entire surface. Moreover, no shrinkage was observed and light was emitted from the entire surface even after a preservation test where the light-emitting device fabricated in this example was preserved at a temperature of 65° C. and a humidity of 95% for 250 hours.

The results of this example showed that one embodiment of the present invention enables the light-emitting portion of the light-emitting device to have a uniform thickness and to form a portion thinner than the light-emitting portion in the non-light-emitting portion. In addition, no shrinkage was observed even after the light-emitting device of one embodiment of the present invention was preserved at high temperature and high humidity for 250 hours. It can be presumed that entry of moisture and the like through an end portion of the light-emitting device can be inhibited and high reliability can be achieved without impairing display quality of the light-emitting device.

Example 3

In this example, description will be made on a sample fabricated with the use of one embodiment of the present invention.

The sample fabricated in this example had the structure illustrated in FIGS. 45B and 45C. FIG. 45B is a cross-sectional view taken along the dashed-dotted line A1-A2 in FIG. 11A. FIG. 45C is a cross-sectional view taken along the dashed-dotted line A3-A4 in FIG. 11A.

First, a method for manufacturing the sample is described with reference to FIGS. 21A to 21C, FIG. 45A, and FIGS. 46A and 46B.

As illustrated in FIG. 21A, the separation layer 203 was formed over the formation substrate 201, and the insulating layer 205 was formed over the separation layer 203. A 0.7-mm-thick glass substrate was used as the formation substrate 201. A stacked-layer structure including a tungsten film and a tungsten oxide film was used as the separation layer 203. A stacked-layer structure including a silicon oxynitride film and a silicon nitride film was used as the insulating layer 205. The functional layer 206 included a transistor using an oxide semiconductor and an organic EL element. Although not illustrated in FIG. 21A, the functional layer 204 was also formed over the insulating layer 205 (see FIG. 45B). The functional layer 204 included a transistor using an oxide semiconductor.

In addition, as illustrated in FIG. 21B, the separation layer 223 was formed over the formation substrate 221, and the insulating layer 225 was formed over the separation layer 223. A 0.7-mm-thick glass substrate was used as the formation substrate 221. A stacked-layer structure including a tungsten film and a tungsten oxide film was used as the separation layer 223. A stacked-layer structure including a silicon oxynitride film and a silicon nitride film was used as the insulating layer 225.

A layer to be separated formed in this example had a structure similar to that described in Example 2.

Furthermore, under a reduced-pressure atmosphere, as illustrated in FIG. 21C, the formation substrate 201 and the formation substrate 221 overlapped with each other with the bonding layer 207, the frame-like partition 242, and the frame-like temporary sealing layer 244 provided therebetween. A thermosetting resin was used for the bonding layer 207, and an ultraviolet curable resin was used for the frame-like partition 242 and the frame-like temporary sealing layer 244.

The frame-like temporary sealing layer 244 was cured by irradiation with ultraviolet light.

Figure 46A:
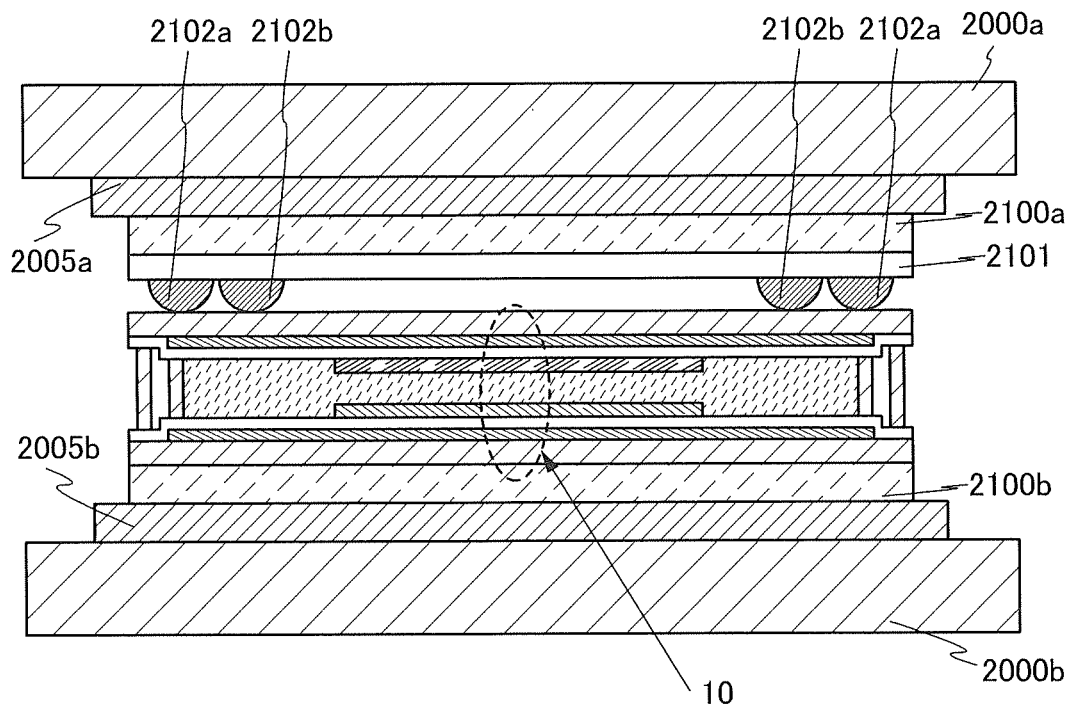
FIGS. 46A and 46B illustrate a method for manufacturing a light-emitting device of Example 3.

Next, the formation substrate 201 and the formation substrate 221 were exposed to an air atmosphere, and pressure application was performed using a hot press as illustrated in FIG. 46A. The structure of the hot press illustrated in FIG. 46A is the same as that in FIG. 19A except for the shape of a projection formed on the substrate 2101.

Quartz substrates were used as the substrate 2100a and the substrate 2100b. A glass substrate was used as the substrate 2101. A projection 2102a and a projection 2102b were formed by curing of a resin.

Figure 46B:
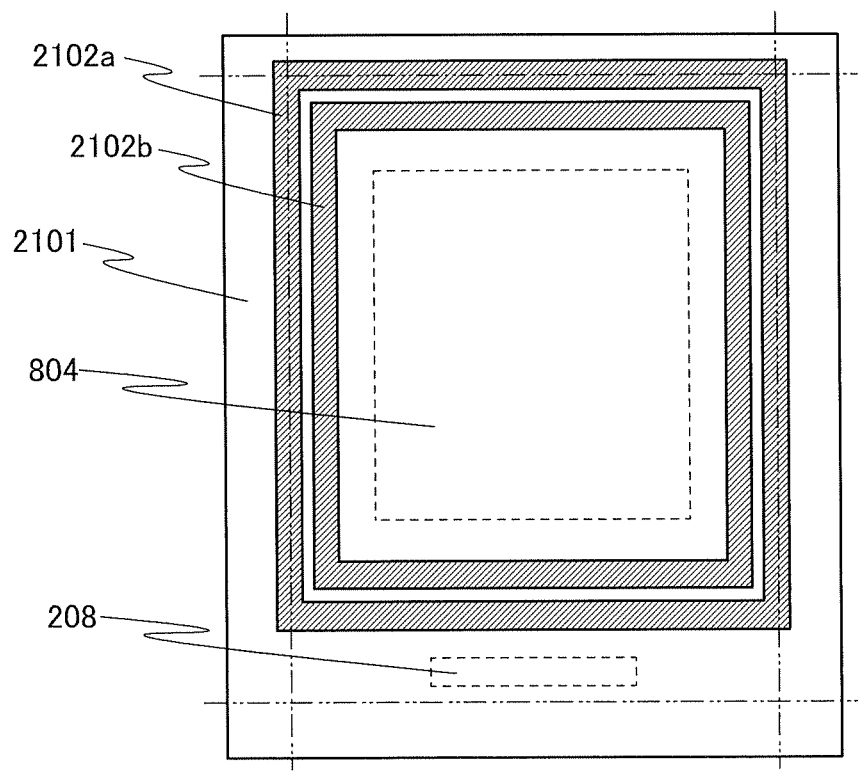

FIG. 46B is a top view of the substrate 2101. The projection 2102a and the projection 2102b were each formed over the substrate 2101 to have a frame-like shape. The projection 2102a and the projection 2102b each had a width of approximately 1 mm and a height of approximately 0.05 mm. The gap between the projection 2102a and the projection 2102b was approximately 1.5 mm. In FIG. 46B, the light-emitting portion 804 and the conductive layer 208 included in the light-emitting device 10 and overlapping with the substrate 2101 are indicated by dotted lines. The light-emitting device 10 was to be cut along dashed-two dotted lines shown in FIG. 46B.

With the hot press, a load of 1.0 t was applied to the light-emitting device 10 and the temperature was then raised to 100° C. using a heat source, so that pressure application and heating were performed for 1 hour. FIG. 45A shows a schematic cross-sectional view of the light-emitting device 10 that was changed in shape by the pressure application and heating. By the pressure application and heating, a thin portion was formed in the non-light-emitting portion of the light-emitting device 10. Since a thermosetting resin was used for forming the bonding layer 207, the bonding layer 207 was cured by the heating.

Next, a separation starting point was formed by laser light irradiation, the insulating layer 205 and the formation substrate 201 were separated from each other, and the substrate 251 was attached to the exposed insulating layer 205 with the use of the bonding layer 253. A thermosetting resin was used for the bonding layer 253, which was cured by heating.

Next, a separation starting point was formed by cutting four sides of the substrate 251 with a cutter, the insulating layer 225 and the formation substrate 221 were separated from each other, and the substrate 259 was attached to the exposed insulating layer 225 with the use of the bonding layer 257. A thermosetting resin was used for the bonding layer 257, which was cured by heating.

Then, the light-emitting device 10 was cut along the dashed-two dotted lines shown in FIG. 46B, whereby the light-emitting device illustrated in FIGS. 45B and 45C was fabricated. The completed light-emitting device 10 had a portion whose thickness was reduced with the projection 2102a. On three sides of the completed light-emitting device 10, a portion whose thickness was reduced with the projection 2102b was located at an end portion.

Figure 47A:
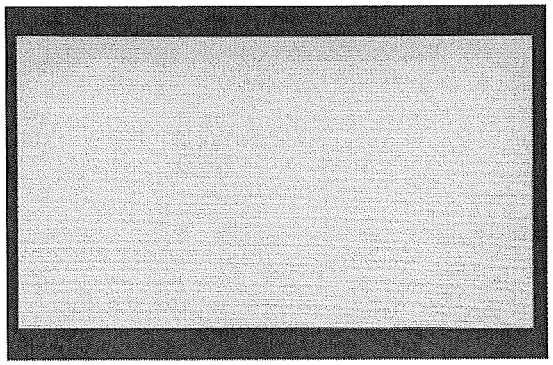
FIGS. 47A to 47E are photographs showing light emission by a light-emitting device of Example 3.

FIG. 47A is a photograph showing a light-emitting state of the light-emitting device fabricated in this example. With the use of one embodiment of the present invention, light was emitted from the entire surface of the light-emitting device as shown in FIG. 47A.

The light-emitting device fabricated in this example was preserved at a temperature of 65° C. and a humidity of 95%.

Note that it is difficult to observe shrinkage when a driver transistor operates in a saturation region because the threshold value of the driver transistor is shifted negatively as a light-emitting element degrades, leading to an increased luminance of the light-emitting element.

In view of the above, in a period from 750 hours to 1500 hours after the start of the preservation test, the driver transistor operated in a linear region for obtaining light emission by the light-emitting element so that shrinkage can be easily observed.

Figure 47B:
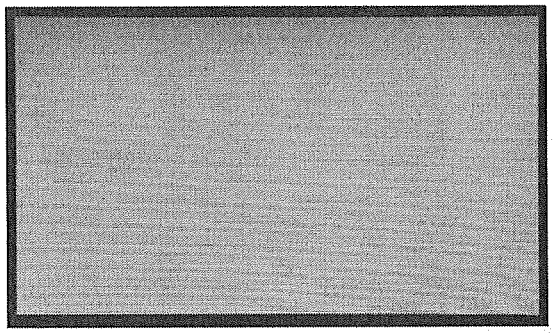
Figure 47C:
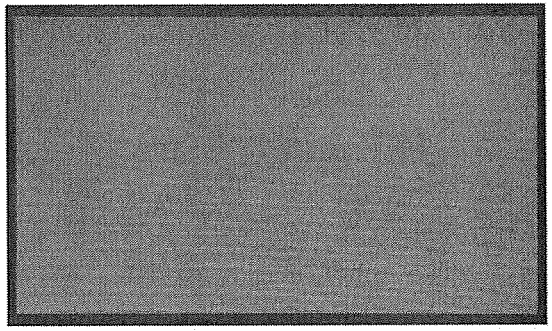
Figure 47D:
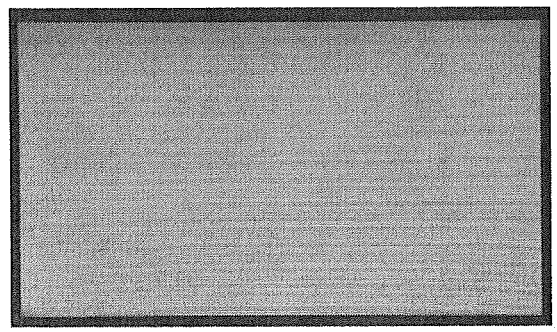
Figure 47E:
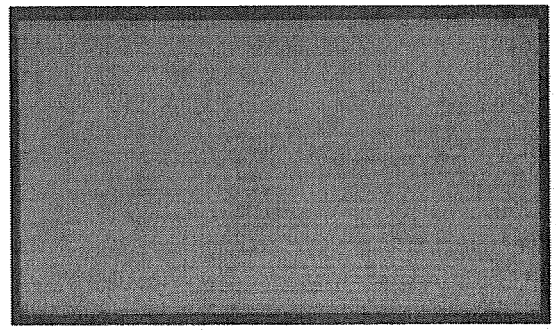

FIGS. 47B and 47C are photographs showing a light-emitting state after 1000 hours elapsed after the preservation test was started. FIG. 47B shows a light-emitting state when the driver transistor operated in the saturation region, and FIG. 47C shows a light-emitting state when the driver transistor operated in the linear region. FIGS. 47D and 47E are photographs showing a light-emitting state after 1500 hours elapsed after the preservation test was started. FIG. 47D shows a light-emitting state when the driver transistor operated in the saturation region, and FIG. 47E shows a light-emitting state when the driver transistor operated in the linear region.

Even after 1000 hours after the preservation test was started, shrinkage was not observed and light was emitted from the entire surface. After 1500 hours elapsed, slight shrinkage was observed (see the lower portion in FIG. 47E). Note that the display is dark in FIGS. 47B and 47D as compared to that in FIG. 47A. However, the preservation test hardly reduced the current efficiency of the light-emitting element, which suggested that the cause of the reduction in luminance is not degradation of the light-emitting element. A shift in the characteristics of the transistor, for example, probably reduced the luminance. It is unlikely that the reduction in luminance was caused by the hot press.

As shown by the results in this example, owing to one embodiment of the present invention, shrinkage was not observed even after 1000-hour preservation at high temperature and high humidity. It can be presumed that entry of moisture and the like through an end portion of the light-emitting device can be inhibited and high reliability can be achieved without impairing display quality of the light-emitting device.

REFERENCE NUMERALS

10: light-emitting device, 201: formation substrate, 203: separation layer, 204: functional layer, 205: insulating layer, 206: functional layer, 207: bonding layer, 208: conductive layer, 209: partition, 221: formation substrate, 223: separation layer, 225: insulating layer, 226: functional layer, 242: partition, 244: temporary sealing layer, 246: projection, 251: substrate, 253: bonding layer, 254: bonding layer, 256: functional layer, 257: bonding layer, 259: substrate, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: bonding layer, 367BM: light-blocking layer, 367p: anti-reflective layer, 367R: coloring layer, 390: input-output device, 501: display portion, 505: input-output device, 505B: input-output device, 509: FPC, 589: insulating layer, 590: flexible substrate, 591: electrode, 592: electrode, 593: insulating layer, 594: wiring, 595: touch sensor, 597: bonding layer, 598: wiring, 599: connection layer, 701: flexible substrate, 703: bonding layer, 705: insulating layer, 711: flexible substrate, 713: bonding layer, 715: insulating layer, 804: light-emitting portion, 806: driver circuit portion, 808: FPC, 814: conductive layer, 815: insulating layer, 817: insulating layer, 817a: insulating layer, 817b: insulating layer, 820: transistor, 821: insulating layer, 822: bonding layer, 823: spacer, 824: transistor, 825: connector, 830: light-emitting element, 831: lower electrode,

832: optical adjustment layer, 833: EL layer, 835: upper electrode, 845: coloring layer, 847: light-blocking layer, 849: overcoat, 856: conductive layer, 857: conductive layer, 857*a*: conductive layer, 857*b*: conductive layer, 2000*a*: upper plate, 2000*b*: lower plate, 2005*a*: cushioning material, 2005*b*: cushioning material, 2100*a*: substrate, 2100*b*: substrate, 2101: substrate, 2102: projection, 2102*a*: projection, 2102*b*: projection, 4001: first substrate, 4002: light-emitting portion, 4003: signal line driver circuit, 4004: scan line driver circuit, 4005: region, 4006: second substrate, 4018: FPC, 4018*a*: FPC, 4018*b*: FPC, 7000: display portion, 7001: display portion, 7100: mobile phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: data, 7304: data, 7305: data, 7306: data, 7310: portable information terminal, 7320: portable information terminal, 7400: lighting device, 7401: stage, 7402: light-emitting portion, 7403: operation switch, 7410: lighting device, 7412: light-emitting portion, 7420: lighting device, 7422: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703*a*: button, 7703*b*: button, 7704*a*: speaker, 7704*b*: speaker, 7705: external connection port, 7706: microphone, 7709: battery, 7800: portable information terminal, 7801: band, 7802: input-output terminal, 7803: operation button, 7804: icon, 7805: battery, 9700: automobile, 9701: car body, 9702: wheels, 9703: dashboard, 9704: light, 9710: display portion, 9711: display portion, 9712: display portion, 9713: display portion, 9714: display portion, 9715: display portion, 9721: display portion, 9722: display portion, 9723: display portion, 9801: housing, 9802: housing, 9803: display portion, 9804: display portion, 9805: microphone, 9806: speaker, 9807: operation key, 9808: stylus, 9821: housing, 9822: display portion, 9823: keyboard, and 9824: pointing device.

This application is based on Japanese Patent Application serial no. 2014-212438 filed with Japan Patent Office on Oct. 17, 2014 and Japanese Patent Application serial no. 2014-257197 filed with Japan Patent Office on Dec. 19, 2014, the entire contents of which are hereby incorporated by reference.

The invention claimed is:
1. A light emitting device comprising:
a light emitting portion comprising:
 a first flexible substrate;
 a second flexible substrate; and
 a first functional layer provided on the first flexible substrate;
a non-light emitting portion comprising:
 a region having a driving circuit portion; and
 a region having a conductive layer; and
the driving circuit portion comprising:
 the first flexible substrate;
 the second flexible substrate; and
 a second functional layer provided on the first flexible substrate,
wherein the conductive layer is provided on the first flexible substrate,
wherein the first functional layer comprises a light emitting element,
wherein the second functional layer comprises a transistor,
wherein the conductive layer is electrically connected to an FPC,
wherein the non-light emitting portion is provided outside the light emitting portion along four sides of the first flexible substrate,
wherein the conductive layer is provided on one of four sides of the first flexible substrate,
wherein the second functional layer is provided between the first functional layer and the conductive layer, and
wherein at one of four sides of the first flexible substrate the distance between the first flexible substrate and the second flexible substrate in the non-light emitting portion is smaller than the distance between the first flexible substrate and the second flexible substrate in the light emitting portion, and
wherein the distance between the first flexible substrate and the second flexible substrate in the driving circuit portion is smaller than the distance between the first flexible substrate and the second flexible substrate in the light emitting portion.

2. The light emitting device according to claim 1, wherein at two of four sides of the first flexible substrate the distance between the first flexible substrate and the second flexible substrate in the non-light emitting portion is smaller than the distance between the first flexible substrate and the second flexible substrate in the light emitting portion.

3. The light emitting device according to claim 1, wherein in a region where the distance between the first flexible substrate and the second flexible substrate in the non-light emitting portion is smaller than the distance between the first flexible substrate and the second flexible substrate in the light emitting portion, the first flexible substrate or the second flexible substrate comprises a concave portion.

4. The light emitting device according to claim 1, wherein in a region where the distance between the first flexible substrate and the second flexible substrate in the non-light emitting portion is smaller than the distance between the first flexible substrate and the second flexible substrate in the light emitting portion, each of the first flexible substrate and the second flexible substrate comprises a concave portion.

* * * * *